US011296232B2

(12) United States Patent
Jang et al.

(10) Patent No.: US 11,296,232 B2
(45) Date of Patent: Apr. 5, 2022

(54) OXIDE SEMICONDUCTOR THIN-FILM TRANSISTOR AND METHOD OF FABRICATING THE SAME

(71) Applicant: UNIVERSITY-INDUSTRY COOPERATION GROUP OF KYUNG HEE UNIVERSITY, Yongin-si (KR)

(72) Inventors: Jin Jang, Seoul (KR); Suhui Lee, Seoul (KR)

(73) Assignee: UNIVERSITY-INDUSTRY COOPERATION GROUP OF KYUNG HEE UNIVERSITY, Yongin-si (KR)

( * ) Notice: Subject to any disclaimer, the term of this patent is extended or adjusted under 35 U.S.C. 154(b) by 0 days.

(21) Appl. No.: 16/759,562

(22) PCT Filed: Oct. 29, 2018

(86) PCT No.: PCT/KR2018/012903
§ 371 (c)(1),
(2) Date: Apr. 27, 2020

(87) PCT Pub. No.: WO2019/083338
PCT Pub. Date: May 2, 2019

(65) Prior Publication Data
US 2020/0287049 A1 Sep. 10, 2020

(30) Foreign Application Priority Data
Oct. 27, 2017 (KR) ........................ 10-2017-0141182

(51) Int. Cl.
*H01L 27/00* (2006.01)
*H01L 29/00* (2006.01)
(Continued)

(52) U.S. Cl.
CPC ...... *H01L 29/7869* (2013.01); *H01L 27/3262* (2013.01); *H01L 29/66969* (2013.01); *H01L 29/78618* (2013.01); *H01L 2227/323* (2013.01)

(58) Field of Classification Search
CPC ............. H01L 27/3262; H01L 27/7869; H01L 27/124; H01L 27/1255; H01L 27/127;
(Continued)

(56) References Cited

U.S. PATENT DOCUMENTS 6,774,466 B1 * 8/2004 Kajiwara ................ H01L 24/40
257/673
9,112,188 B2 * 8/2015 Yang .................... H01L 27/1255
(Continued)

FOREIGN PATENT DOCUMENTS

KR         10-0876081 B1        12/2008
KR      10-2010-0091108 A        8/2010
(Continued)

OTHER PUBLICATIONS

Office Action of Korean Application No. 10-2017-0141182 dated Apr. 9, 2019.
(Continued)

*Primary Examiner* — Nikolay K Yushin
(74) *Attorney, Agent, or Firm* — Sughrue Mion, PLLC

(57) ABSTRACT

An oxide thin-film transistor includes a substrate; a first gate electrode formed on the substrate; a gate insulator formed on the first gate electrode; an oxide semiconductor layer formed on the gate insulator to correspond to the first gate electrode; source/drain electrodes formed to be spaced from each other on the oxide semiconductor layer and formed in a shape of a plurality of island patterns; a passivation layer formed on the source/drain electrodes, where the source/drain electrodes include a first area formed in a direction of the first gate electrode with respect to a horizontal plane of the
(Continued)

substrate; and a second area formed in an opposite direction to the first area, and the plurality of island patterns are formed such that the first areas are separated from each other and thus have resistance to external stress.

16 Claims, 136 Drawing Sheets

(51) Int. Cl.
  *H01L 29/786* (2006.01)
  *H01L 27/32* (2006.01)
  *H01L 29/66* (2006.01)
(58) Field of Classification Search
  CPC ........... H01L 27/1222; H01L 29/78618; H01L 29/66969; H01L 29/41733; H01L 29/7869; H01L 2227/323
  See application file for complete search history.

(56) References Cited

U.S. PATENT DOCUMENTS

| | | | |
|---|---|---|---|
| 10,424,672 B2* | 9/2019 | Lee | H01L 29/78696 |
| 10,896,977 B2* | 1/2021 | Yamazaki | H01L 29/78 |
| 10,957,268 B2* | 3/2021 | Kikuchi | G02F 1/13454 |
| 2014/0312315 A1* | 10/2014 | Kang | H01L 27/3244 257/40 |
| 2014/0326963 A1* | 11/2014 | Yang | H01L 29/7869 257/40 |
| 2017/0243978 A1* | 8/2017 | Lee | H01L 29/0649 |
| 2018/0114855 A1* | 4/2018 | Yamazaki | C01G 15/006 |
| 2019/0333461 A1* | 10/2019 | Kikuchi | G09F 9/30 |

FOREIGN PATENT DOCUMENTS

| | | | |
|---|---|---|---|
| KR | 10-2012-0140549 A | 12/2012 |
| KR | 10-1272433 B1 | 6/2013 |
| KR | 10-2014-0059576 A | 5/2014 |
| KR | 10-2017-0098671 A | 8/2017 |
| KR | 10-1808432 B1 | 1/2018 |

OTHER PUBLICATIONS

International Search Report of PCT/KR2018/012903 dated Mar. 5, 2019 [PCT/ISA/210].

* cited by examiner

OXIDE SEMICONDUCTOR THIN-FILM TRANSISTOR AND METHOD OF FABRICATING THE SAME

CROSS REFERENCE TO RELATED APPLICATIONS

This application is a National Stage Entry of PCT International Application No. PCT/KR2018/012903, which was filed on Oct. 29, 2018, and which claims priority to Korean Patent Application No. 10-2017-0141182, filed on Oct. 27, 2017 in the Korean Intellectual Property Office, the disclosure of which is incorporated herein by reference.

BACKGROUND OF THE DISCLOSURE

Field of the Disclosure

The present invention relates to an oxide semiconductor thin-film transistor and a method of fabricating the same, and more particularly to an oxide semiconductor thin-film transistor for a flexible display apparatus capable of improving the lifespan and reliability of the flexible display apparatus and a method of fabricating the oxide semiconductor thin-film transistor.

Description of the Related Art

In recent years, display apparatuses driven by a thin film transistor (TFT) fabricated using indium gallium zinc oxide (a-IGZO) as an oxide semiconductor have been rapidly developed. In addition, considerable research has been conducted on an inverter fundamentally necessary for driving of a display apparatus, and a ring oscillator and driving circuit using the inverter.

In the case of a thin-film transistor (TFT) which is fabricated using an oxide semiconductor and used in display apparatuses, parasitic capacitance is generated between a gate electrode and a source electrode or a drain electrode. Such parasitic capacitance disadvantageously causes degradation of the properties of an oxide semiconductor thin-film transistor with high-performance electrical characteristics.

In addition, research into a driving element used in flexible displays has been considerably conducted.

In general, a flexible display apparatus is manufactured by forming a display on a flexible substrate, thereby exhibiting flexibility. Such a flexible display apparatus is very advantageous in that the shape of thereof may be flexed or bent as needed. Such as a flexible display apparatus may be applied in various fields such as mobile communication devices, wearable smart devices, foldable devices, automobile displays, digital signage, electronic newspaper, electronic books, electronic boards, bulletin boards, and billboards, thereby being expected to achieve next generation display development.

Meanwhile, a flexible display apparatus is required to maintain the display performance thereof when bent, but the display performance is deteriorated when excessively bent.

In particular, in the case of a flexible display apparatus, a thin film transistor is formed on a flexible substrate. When such a flexible display apparatus is excessively bent, stress due to bending is transmitted to a thin film transistor, and thus, cracks are generated, whereby the properties of the thin film transistor are deteriorated.

Accordingly, when such a flexible display is repeatedly bent or flexed or is increased in size, generation of cracks may greatly increase, whereby the lifespan and reliability of the flexible display may be decreased.

SUMMARY OF THE DISCLOSURE

Therefore, the present invention has been made in view of the above problems, and it is one object of the present invention to provide an oxide semiconductor thin-film transistor capable of improving the lifespan and reliability of an apparatus and a method of fabricating the oxide semiconductor thin-film transistor.

It is another object of the present invention to provide an oxide semiconductor thin-film transistor capable of reducing parasitic capacitance generated between a gate electrode (first or second) and a source electrode or a drain electrode through reduction in the areas of source/drain electrodes thereof and, accordingly, capable of being used as a pixel element of a display apparatus with high-performance electrical characteristics; and a method of fabricating the oxide semiconductor thin-film transistor.

In accordance with an aspect of the present invention, the above and other objects can be accomplished by the provision of An oxide semiconductor thin-film transistor, including: a substrate; a first gate electrode formed on the substrate; a gate insulator formed on the first gate electrode; an oxide semiconductor layer formed on the gate insulator to correspond to the first gate electrode; source/drain electrodes formed to be spaced from each other on the oxide semiconductor layer and formed in a shape of a plurality of island patterns; a passivation layer formed on the source/drain electrodes, wherein the source/drain electrodes include a first area formed in a direction of the first gate electrode with respect to a horizontal plane of the substrate; and a second area formed in an opposite direction to the first area, and the plurality of island patterns are formed such that the first areas are separated from each other and thus have resistance to external stress.

The plurality of island patterns may have a shape wherein a plurality of line patterns are repeatedly formed.

A width of each of the plurality of line patterns may be 1 μm to 10 μm.

A spacing between the plurality of line patterns may be 1 μm to 16 μm.

The plurality of island patterns may have a lattice shape wherein a plurality of line patterns vertically intersect.

The first gate electrode may be formed to be horizontally spaced by −1 μm to 3 μm from the source/drain electrodes formed on the oxide semiconductor layer.

A second gate electrode may be further formed on the passivation layer formed on the source/drain electrodes of the oxide semiconductor thin-film transistor.

The second gate electrode may be formed to be spaced horizontally by −1 μm to 3 μm from the source/drain electrodes formed on the oxide semiconductor layer.

A connection electrode for electrically connecting the first gate electrode and the second gate electrode may be further included.

The first gate electrode and the second gate electrode may be electrically connected and thus the same voltage may be applied thereto.

In accordance with another aspect of the present invention, there is provided a coplanar oxide semiconductor thin-film transistor, including: an oxide semiconductor layer formed on a substrate; a first gate electrode formed on the oxide semiconductor layer; and source/drain electrodes respectively formed in a shape of a plurality of island patterns, wherein the source/drain electrodes include a first area formed in a direction of the first gate electrode with respect to a horizontal plane of the substrate; and a second area formed in an opposite direction to the first area, and the plurality of island patterns are formed such that the first areas are separated from each other and thus have resistance to external stress.

A second gate electrode may be further formed under the oxide semiconductor layer.

In accordance with another aspect of the present invention, there is provided a display apparatus, including: a substrate; the oxide semiconductor thin-film transistor formed on the substrate; and a display device electrically connected to the oxide semiconductor thin-film transistor.

In the display apparatus according to an embodiment of the present invention, the display device may be an organic light-emitting device.

In accordance with yet another aspect of the present invention, there is provided a method of fabricating an oxide semiconductor thin-film transistor, the method including: forming a first gate electrode on a substrate; forming a gate insulator on the first gate electrode; forming an oxide semiconductor layer on the gate insulator to correspond to the first gate electrode; forming source/drain electrodes to be spaced from each other on the oxide semiconductor layer and to have a plurality of island patterns; and forming a passivation layer on the source/drain electrodes.

The method may further include forming a second gate electrode on the passivation layer.

The first gate electrode or the second gate electrode may be formed to be horizontally spaced by −1 μm to 3 μm from the source/drain electrodes formed on the oxide semiconductor layer.

In the case of oxide semiconductor thin-film transistors according to embodiments of the present invention, source/drain electrodes are formed in the shape of a plurality of island patterns formed such that first areas are separated from each other, whereby a diffusion current is generated between the source electrode and the drain electrode. Accordingly, parasitic capacitance can be reduced.

In the case of the oxide semiconductor thin-film transistors according to embodiments of the present invention, source/drain electrodes are formed in the shape of a plurality of island patterns, whereby the cross-sectional area of the source/drain electrodes can be reduced and, accordingly, damage, particularly cracks, due to external stress such as bending or twist can be prevented. Accordingly, the electrical characteristics of a device and the lifespan and reliability of an apparatus can be improved.

In addition, the oxide semiconductor thin-film transistors having high-performance electrical characteristics according to embodiments of the present invention can be used as pixel elements of flexible display apparatuses such as a liquid crystal display (LCD) or an organic light emitting display (AMOLED).

DETAILED DESCRIPTION OF THE DISCLOSURE

Figure 1A:
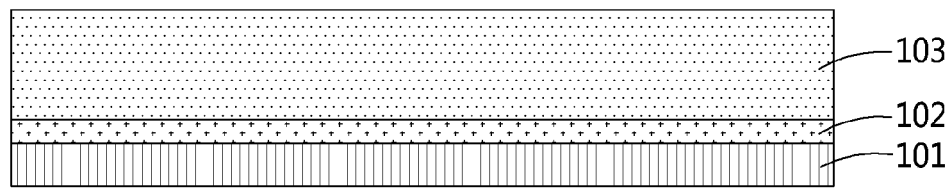
FIGS. 1A to 1H illustrate sectional views of an oxide semiconductor thin-film transistor exhibiting an overall flow of a method of fabricating an oxide semiconductor thin-film transistor according to an embodiment of the present invention.

The present invention will now be described more fully with reference to the accompanying drawings and contents disclosed in the drawings. However, the present invention should not be construed as limited to the exemplary embodiments described herein.

The terms used in the present specification are used to explain a specific exemplary embodiment and not to limit the present inventive concept. Thus, the expression of singularity in the present specification includes the expression of plurality unless clearly specified otherwise in context. It will be further understood that the terms "comprise" and/or "comprising", when used in this specification, specify the presence of stated components, steps, operations, and/or elements, but do not preclude the presence or addition of one or more other components, steps, operations, and/or elements thereof.

It should not be understood that arbitrary aspects or designs disclosed in "embodiments", "examples", "aspects", etc. used in the specification are more satisfactory or advantageous than other aspects or designs.

In addition, the expression "or" means "inclusive or" rather than "exclusive or". That is, unless otherwise mentioned or clearly inferred from context, the expression "x uses a or b" means any one of natural inclusive permutations.

In addition, as used in the description of the disclosure and the appended claims, the singular form "a" or "an" is intended to include the plural forms as well, unless context clearly indicates otherwise.

In addition, when an element such as a layer, a film, a region, and a constituent is referred to as being "on" another element, the element can be directly on another element or an intervening element can be present.

Since the present invention may be applied with various modifications and may have various embodiments, exemplary embodiments and drawings of the present invention are intended to be explained and exemplified. However, these exemplary embodiments and drawings are not intended to limit the embodiments of the present invention to particular modes of practice, and all changes, equivalents, and substitutes that do not depart from the spirit and technical scope of the present invention should be understood as being encompassed in the present invention. Like reference numerals refer to like elements in describing each drawing.

Hereinafter, an oxide semiconductor thin-film transistor according to an embodiment of the present invention and a method of fabricating the same are described in detail with reference to FIGS. 1A to 1H.

An oxide semiconductor thin-film transistor 100 according to an embodiment of the present invention includes a substrate 103, a first gate electrode 105, a gate insulator 106, an oxide semiconductor layer 107, source/drain electrodes 108 and 109 and a passivation layer 110. According to the embodiment, the oxide semiconductor thin-film transistor 100 may further include a supporting layer 102, a buffer layer 104 and a pixel electrode 111.

In addition, each of the source/drain electrodes 108 and 109 of the oxide semiconductor thin-film transistor 100 according to an embodiment of the present invention includes a first area P1 formed in the direction of the first gate electrode 105 with respect to a horizontal plane of the substrate 103; and a second area P2 formed in the opposite direction to the first area P1. A plurality of island patterns are formed such that first areas P1 are separated from each other, thereby exhibiting resistance to external stress.

Accordingly, in the case of the oxide semiconductor thin-film transistor 100 according to an embodiment of the present invention, the areas of the source/drain electrodes 108 and 109 are reduced, thereby being capable of reducing parasitic capacitance generated between the first gate electrode 105 and the source/drain electrodes 108 and 109.

Hereinafter, respective components of an oxide semiconductor thin-film transistor according to an embodiment of the present invention are described in more detail with reference to FIGS. 1A to 1H.

FIGS. 1A to 1H illustrate sectional views of an oxide semiconductor thin-film transistor exhibiting an overall flow of a method of fabricating an oxide semiconductor thin-film transistor according to an embodiment of the present invention.

Referring to FIG. 1A, the method of fabricating the oxide semiconductor thin-film transistor 100 according to an embodiment of the present invention includes forming a supporting layer 102 and a substrate 103 on a carrier substrate 101.

As shown in FIG. 1A, the supporting layer 102 is formed on the carrier substrate 101. However, the supporting layer 102 is not an essential component.

According to one embodiment, the supporting layer 102 may be formed to have transparency using carbon nanotube-graphene oxide (CNT-GO). The supporting layer 102 made of carbon nanotube-graphene oxide is bendable, thus being suitable for application to a flexible display apparatus.

The substrate 103 is formed on the supporting layer 102. The substrate 103, which is a substrate for supporting various components of an oxide semiconductor thin-film transistor, may be a flexible substrate having flexibility.

A flexible substrate may be bent or folded in a specific direction. For example, the flexible substrate may be folded in a transverse direction, a longitudinal direction, or a diagonal direction.

A flexible substrate may be formed by coating, for example, a polyimide-based solution, on the carrier substrate 101 on which the supporting layer 102 is formed, and may have a film shape.

The substrate 103 may be formed of at least one material selected from the group consisting of glass, a polyimide-based polymer, a polyester-based polymer, a silicon-based polymer, an acrylic polymer, a polyolefin-based polymer, or a copolymer thereof.

When a flexible substrate is used as the substrate 103, the flexible substrate may be formed of at least one material selected from the group consisting of, for example, polyester, polyvinyl, polycarbonate, polyethylene, polyacetate, polyimide, polyethersulfone (PES), polyacrylate (PAR), polyethylene naphthalate (PEN), and polyethylene terephthalate (PET).

According to one embodiment, when a display apparatus provided with the oxide semiconductor thin film transistor 100 is a transparent flexible display apparatus, the substrate 103 may be formed of a transparent and flexible material.

The substrate 103 may include at least one thin film transistor region. A thin film transistor (TFT) may be disposed in a thin film transistor region, and the thin film transistor region may be arranged in a matrix form in the substrate 103.

The thickness of the substrate 103 may be determined in a range of 1 μm to 30 μm, preferably in a range of 1 μm to 10 μm.

Figure 1B:
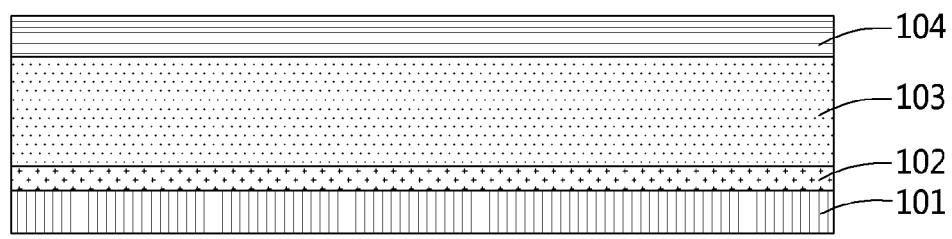

Referring to FIG. 1B, the method of fabricating the oxide semiconductor thin-film transistor 100 according to an embodiment of the present invention includes forming the buffer layer 104 on the substrate 103.

As shown in FIG. 1B, the buffer layer 104 may be formed on the substrate 103.

The buffer layer 104 serves to prevent penetration of external impurities such as moisture or oxygen through the substrate 103 and may planarize a surface of the substrate 103. However, the buffer layer 104 is not an essential component and may be adopted or omitted depending upon the type of the substrate 103.

In addition, when the buffer layer 104 is used as shown in FIG. 1B, the buffer layer 104 may be formed of an inorganic material such as silicon oxide (SiOx), silicon nitride (SiNx) or aluminum oxide (AlOx), or an organic material such as acryl or polyimide.

Figure 1C:
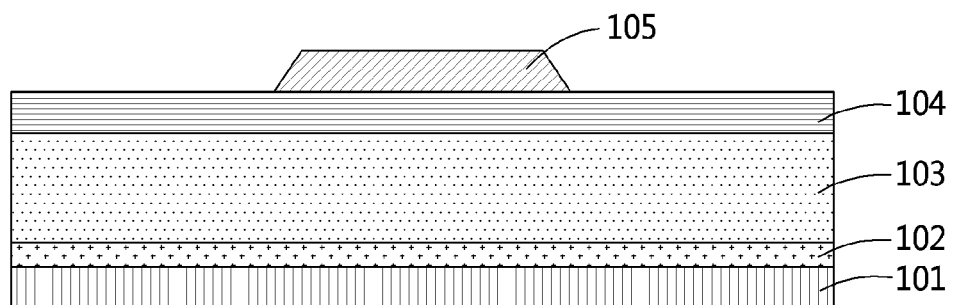

Referring to FIG. 1C, the method of fabricating the oxide semiconductor thin-film transistor 100 according to an embodiment of the present invention includes forming the first gate electrode 105 on the substrate 103 on which the buffer layer 104 is formed.

As shown in FIG. 1C, the first gate electrode 105 may be formed on the buffer layer 104, and the first gate electrode 105 may be a bottom gate electrode.

The first gate electrode 102 may be formed by depositing a gate conductive film (not shown) on the buffer layer 104 and forming a photoresist pattern on the gate conductive film, followed by selectively etching, i.e., patterning, the gate conductive film using the photoresist pattern as a mask.

According to an embodiment, the first gate electrode 105 may be formed to be spaced (offset and overlap) apart by −1 μm to 3 μm in a horizontal direction from the source/drain electrodes 108 and 109 formed on the oxide semiconductor layer 107.

A technique of disposing the first gate electrode 105 to be spaced apart from the source/drain electrodes 108 and 109 formed on the oxide semiconductor layer 107 will be described in more detail with reference to FIGS. 29A and 29B.

Figure 29A:
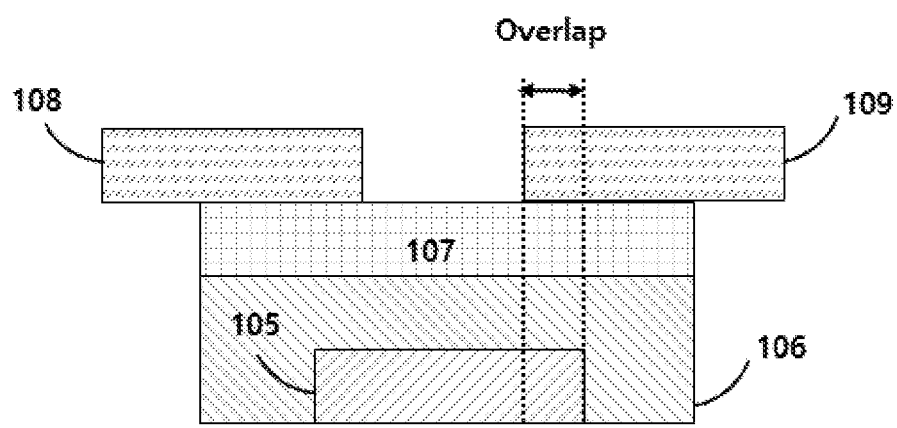
FIGS. 29A and 29B are sectional views illustrating overlap and offset of oxide semiconductor thin-film transistors according to embodiments of the present invention.
Figure 29B:
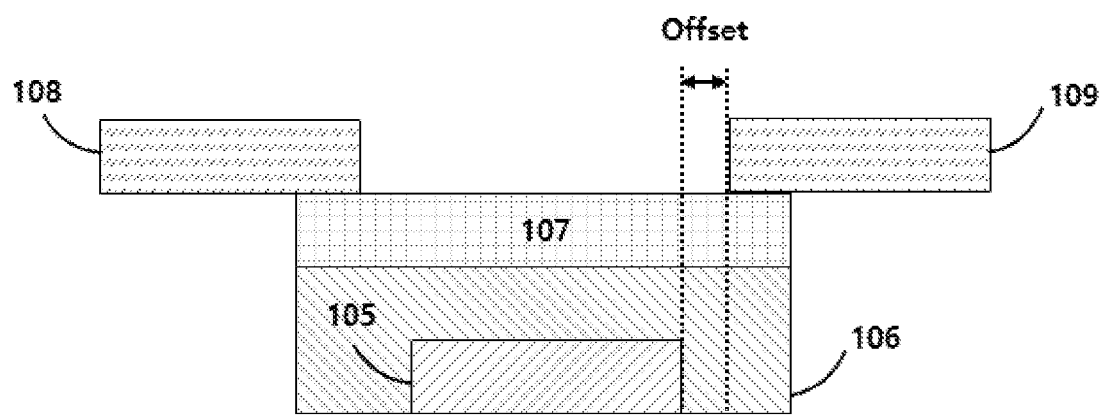

FIGS. 29A and 29B are sectional views illustrating overlap and offset of oxide semiconductor thin-film transistors according to embodiments of the present invention.

Offset and overlap refer to at least one of a width between an one end of the first gate electrode 105 and the source electrode 108 and a width between the other end of the first gate electrode 105 and the drain electrode 109.

For example, overlap refers to a portion where the first gate electrode 105 and the source electrode 108 overlap when looking at the first gate electrode 105 and the source electrode 108 in a vertical direction from a substrate. Accordingly, overlap refers to a width of 0 μm to 3 μm.

Offset refers to a distance between the first gate electrode 105 and the source electrode 108 spaced from each other in a horizontal direction when looking at the first gate electrode 105 and the source electrode 108 in a vertical direction from a substrate. Accordingly, offset refers to a width of −1 μm to 0 μm.

Accordingly, offset of the first gate electrode 105 of the oxide semiconductor thin-film transistor according to an embodiment of the present invention may reduce a defect area formed on a lower interface of the oxide semiconductor layer 107 and, accordingly, may reduce a threshold voltage change in positive bias stress (PBS), thereby being capable of improving electrical characteristics of the oxide semiconductor transistor.

Referring to FIG. 1C again, the first gate electrode 105 may be formed of a metal material, for example, any one of molybdenum (Mo), aluminum (Al), chromium (Cr), gold (Au), titanium (Ti), nickel (Ni), neodymium (Nd), and copper (Cu) or a combination thereof, but may be formed of various materials without being limited to the materials. In addition, the first gate electrode 105 may be formed in a single layer structure or multilayer structure including the material.

The first gate electrode 105 may be formed using at least one method of vacuum deposition, chemical vapor deposition, physical vapor deposition, atomic layer deposition, metal organic chemical vapor deposition, plasma-enhanced chemical vapor deposition, molecular beam epitaxy, hydride vapor phase epitaxy, sputtering, spin coating, dip coating, and zone casting.

Referring to 1D, the method of fabricating the oxide semiconductor thin-film transistor 100 according to an embodiment of the present invention includes forming the gate insulator 106 and an oxide semiconductor film 107a on the first gate electrode 105.

Figure 1D:
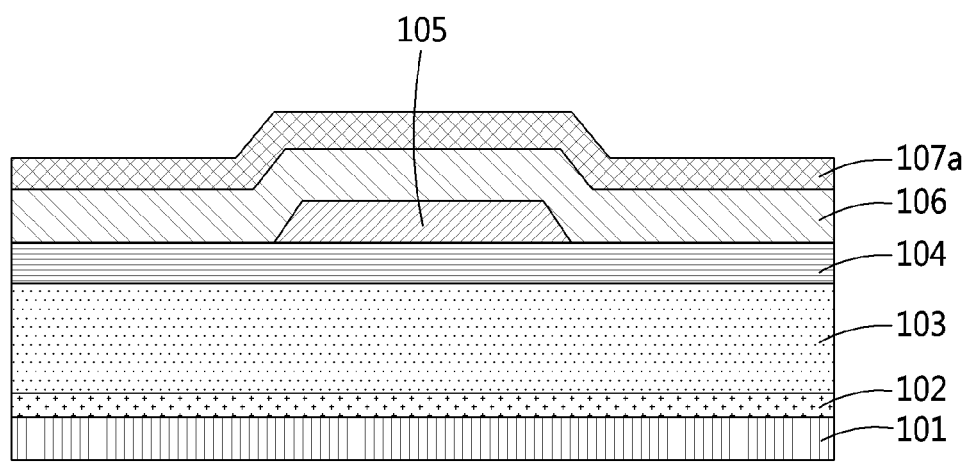

As shown in FIG. 1D, the gate insulator 106 is formed on the first gate electrode 105.

Figure 1E:
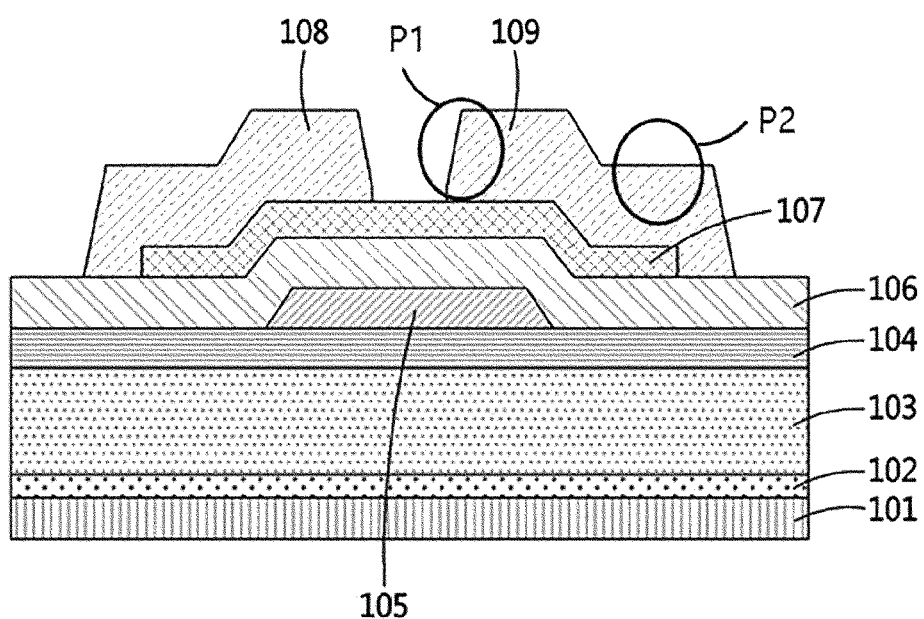

Specifically, the gate insulator 106 is formed on the buffer layer 104, on which the first gate electrode 105 has been formed, to insulate the first gate electrode 105 and the oxide semiconductor layer 107 from each other (see FIG. 1E). That is, the first gate electrode 105 and the oxide semiconductor layer 107 are insulated from each other by the gate insulator 106.

As shown in FIG. 1D, the gate insulator 106 may be formed to cover an entire surface of the buffer layer 104 including the first gate electrode 105.

The gate insulator 106 may be formed using at least one method of vacuum deposition, chemical vapor deposition, physical vapor deposition, atomic layer deposition, metal organic chemical vapor deposition, plasma-enhanced chemical vapor deposition, molecular beam epitaxy, hydride vapor phase epitaxy, sputtering, spin coating, dip coating, and zone casting.

Preferably, the gate insulator 106 may be formed by spin coating using a solution for forming a gate insulator. Spin coating is performed by adding a certain amount of solution for forming the gate insulator 106 to the substrate 103 dropwise and rotating the substrate 103 at a high speed to coat with the solution for forming the gate insulator 106 by centrifugal force applied thereto. When such spin coating is used, production costs may be reduced compared to a deposition process, and process costs and a process time may be reduced through simplification of a process.

The gate insulator 106 may be, for example, an inorganic material such as silicon oxide (SiOx), silicon nitride (SiNx), titanium oxide (TiOx), or hafnium oxide (HfOx), or an organic material such as polyvinyl alcohol (PVA), polyvinyl pyrrolidone (PVP), or polymethyl methacrylate (PMMA). In addition, the gate insulator 106 may be formed in a single layer structure or multilayer structure including the material, but may be formed of various materials, without being limited to the materials.

The oxide semiconductor film 107a is formed on the gate insulator 106.

Specifically, the oxide semiconductor film 107a is a film used to form the oxide semiconductor layer 107 and is formed on the gate insulator 106 to cover an entire surface of the gate insulator 106. Next, a photoresist pattern is formed on the oxide semiconductor film 107a and the oxide semiconductor film 107a in the thin-film transistor region is patterned to correspond to the first gate electrode 105 using the photoresist pattern as a mask, thereby forming the oxide semiconductor layer 107 (see FIG. 1E).

Referring to FIG. 1E, the method of fabricating the oxide semiconductor thin-film transistor 100 according to an embodiment of the present invention includes forming the oxide semiconductor layer 107 and the source/drain electrodes 108 and 109 on the first gate electrode 105.

As shown in FIG. 1E, the oxide semiconductor layer 107 is formed on the gate insulator 106 to correspond to the first gate electrode 105.

The oxide semiconductor layer 107 may be formed using at least one method of vacuum deposition, chemical vapor deposition, physical vapor deposition, atomic layer deposition, metal organic chemical vapor deposition, plasma-enhanced chemical vapor deposition, molecular beam epitaxy, hydride vapor phase epitaxy, sputtering, spin coating, dip coating and zone casting, and may be formed of various oxide semiconductor materials.

The oxide semiconductor layer 107 may include, for example, any one selected from the group consisting of indium gallium zinc oxide (IGZO), zinc oxide (ZnO), indium zinc oxide (IZO), indium tin oxide (ITO), zinc tin oxide (ZTO), gallium zinc oxide (GZO), hafnium indium zinc oxide (HIZO), zinc indium tin oxide (ZITO), and aluminum zinc oxide (AZTO), but may be formed of various materials without being limited to the materials.

The oxide semiconductor layer 107 may be formed of an amorphous or polycrystalline material including the above material.

The oxide semiconductor thin-film transistor 100 according to an embodiment of the present invention may further include an etch stopper layer (not shown) on the oxide semiconductor layer 107 thereof.

The etch stopper layer may be provided for protection from an etchant on an upper surface of the oxide semiconductor layer 107 so as to secure the stability of the oxide semiconductor layer 107. That is, the etch stopper layer may protect the oxide semiconductor layer 107 against an etchant introduced during an etching process of the source/drain electrodes 108 and 109. The etch stopper layer may be formed of, for example, silicon oxide (SiOx).

The oxide semiconductor layer 107 may include a channel region in which channels are formed; and a source/drain region which is respectively connected to the source/drain electrodes 108 and 109.

The source/drain electrodes 108 and 109 are formed on the oxide semiconductor layer 107 to be spaced from each other.

Specifically, the source/drain electrodes 108 and 109 refer to the source electrode 108 and the drain electrode 109. The source electrode 108 and the drain electrode 109 are spaced from each other on the gate insulator 106 on which the oxide semiconductor layer 107 has been formed, but are formed to be respectively, electrically connected to the oxide semiconductor layer 107.

The source/drain electrodes 108 and 109 may be formed by depositing source/drain conductive films (not shown) on the gate insulator 106 including the oxide semiconductor layer 107, and forming a photoresist pattern on the source/drain conductive films, followed by patterning the source and drain conductive films using the photoresist pattern as a mask. Here, the photoresist pattern may be implemented in various shape, whereby the source/drain electrodes 108 and 109 may be formed in various shapes having a plurality of island patterns.

More particularly, the source/drain electrodes 108 and 109 may be formed by depositing source/drain conductive films by a sputtering method, and then patterning using a photoresist pattern mask with a specific island pattern by photolithography.

The source/drain electrodes 108 and 109 of the oxide semiconductor thin-film transistor according to an embodiment of the present invention may include a plurality of island patterns.

In addition, the source/drain electrodes 108 and 109 of the oxide semiconductor thin-film transistor according to an embodiment of the present invention includes the first area P1 formed in the direction of the first gate electrode 105 with respect to a horizontal plane of the substrate 103 and the second area P2 formed in the opposite direction to the first area P1. A plurality of island patterns are formed such that the first areas P1 are separated from each other, thereby reducing the cross-sectional area of the source/drain electrodes 108 and 109. Accordingly, parasitic capacitance generated between the first gate electrode 105 and the source/drain electrodes 108 and 109 is reduced and resistance to external stress such as bending or twist is improved, thereby preventing damage due to external stress.

More specifically, in the case of conventional oxide semiconductor thin-film transistors including the source/drain electrodes 108 and 109 (e.g., ≡, ▦, ◩ or ◪ ) in which the first areas (P1) are not separated from each other, parasitic capacitance may occur and, at the same time, it is not suitable for application to a display apparatus due to irregular current values. In addition, when applied to flexible designs, cracks may easily occur due to the large area of the source/drain electrodes 108 and 109.

However, in the case of the source/drain electrodes 108 and 109, in which the first areas (P1) are separated from each other (e.g., ≡ or #), included in the oxide semiconductor thin-film transistor 100 according to an embodiment of the present invention, the first areas (P1) are formed to be separated from each other, thereby reducing parasitic capacitance, accomplishing element stabilization due to a constant current value, and preventing crack generation in a flexible design.

In particular, although parasitic capacitance occurs in a portion where the first gate electrode 105 and the source/drain electrodes 108 and 109 overlap, the oxide semiconductor thin-film transistor 100 according to an embodiment of the present invention includes the source/drain electrodes 108 and 109 wherein portions i.e., the first areas P1, where the first gate electrode 105 and the source/drain electrodes 108 and 109 overlap are separated from each other, whereby parasitic capacitance may be reduced and crack generation may be prevented due to reduction in the areas of the source/drain electrodes 108 and 109.

In addition, the oxide semiconductor thin-film transistor according to an embodiment of the present invention includes the source/drain electrodes 108 and 109 in which a plurality of island patterns are formed such that the first areas P1 are separated from each other, thereby causing diffusion current (spreading current) generation between the source electrode 108 and the drain electrode 109.

More specifically, the first gate electrode 105 is distributed over an entire surface of the oxide semiconductor layer 107, whereby channel regions of the entire oxide semiconductor layer 107 are accumulated with electrons by a field of the first gate electrode 105. Here, current flows through the field between the source/drain electrodes 108 and 109.

In the case of the oxide semiconductor thin-film transistor according to an embodiment of the present invention, the source/drain electrodes 108 and 109 are separated by the first area P1 and formed in the shape of a plurality of island patterns, whereby diffusion currents may be generated due to diffused fields.

Further, when the source/drain electrodes 108 and 109 are formed such that the first areas P1 are separated from each other and in the shape of a plurality of island patterns as in the oxide semiconductor thin-film transistor according to an embodiment of the present invention, more diffusion currents may be generated due to diffused fields.

In addition, in the case of the oxide semiconductor thin-film transistor according to one embodiment of the present invention, the upper interface of the oxide semiconductor layer 107 includes relatively many defects compared to the lower interface thereof because many processes are additionally performed on an upper interface of the oxide semiconductor layer 107 after forming the oxide semiconductor layer 107.

However, in the case of the oxide semiconductor thin-film transistor 100 according to an embodiment of the present invention, a plurality of island patterns are formed such that the first areas P1 are separated from each other, whereby a defect area formed on an upper interface of the oxide semiconductor layer 107 is reduced and thus a threshold voltage change in positive bias temperature stress (PBTS) or high current temperature stress (HCTS) is reduced. Accordingly, electrical characteristics of an oxide semiconductor transistor may be improved.

More specifically, positive bias temperature stress (PBTS) is a stress that applies a bias to the first gate electrode 105. By forming the source/drain electrodes 108 and 109 in the shape of a plurality of island patterns wherein the first areas P1 are separated from each other, generated heat may be reduced and heat is easily dissipated, thereby reducing stress and, accordingly, exhibiting stabilization characteristics.

High current temperature stress (HCTS) is a current stress applied to a channel region that provides a bias between the first gate electrode 105 and the drain electrode 109. By forming the source/drain electrodes 108 and 109 in the shape of a plurality of island patterns wherein the first areas P1 are separated from each other, generated heat may be reduced and heat may be easily dissipated, thereby reducing stress and, accordingly, stabilizing a device.

Accordingly, the oxide semiconductor thin-film transistor 100 according to an embodiment of the present invention may increase the amount of current passing through the source electrode 108 and the drain electrode 109 and may exhibit stabilization characteristics in reliability tests for positive voltage, negative voltage and temperature.

The source/drain electrodes 108 and 109 may be formed of a metal material, for example, any one of molybdenum (Mo), aluminum (Al), chromium (Cr), gold (Au), titanium (Ti), nickel (Ni), neodymium (Nd), and copper (Cu) or a combination thereof, but may be formed of various materials without being limited to the materials. In addition, the source/drain electrodes 108 and 109 may be formed in a single layer structure or multilayer structure including the material.

The source/drain electrodes 108 and 109 may be formed using at least one method of vacuum deposition, chemical vapor deposition, physical vapor deposition, atomic layer deposition, metal organic chemical vapor deposition, plasma-enhanced chemical vapor deposition, molecular beam epitaxy, hydride vapor phase epitaxy, sputtering, spin coating, dip coating, and zone casting.

Figure 1F:
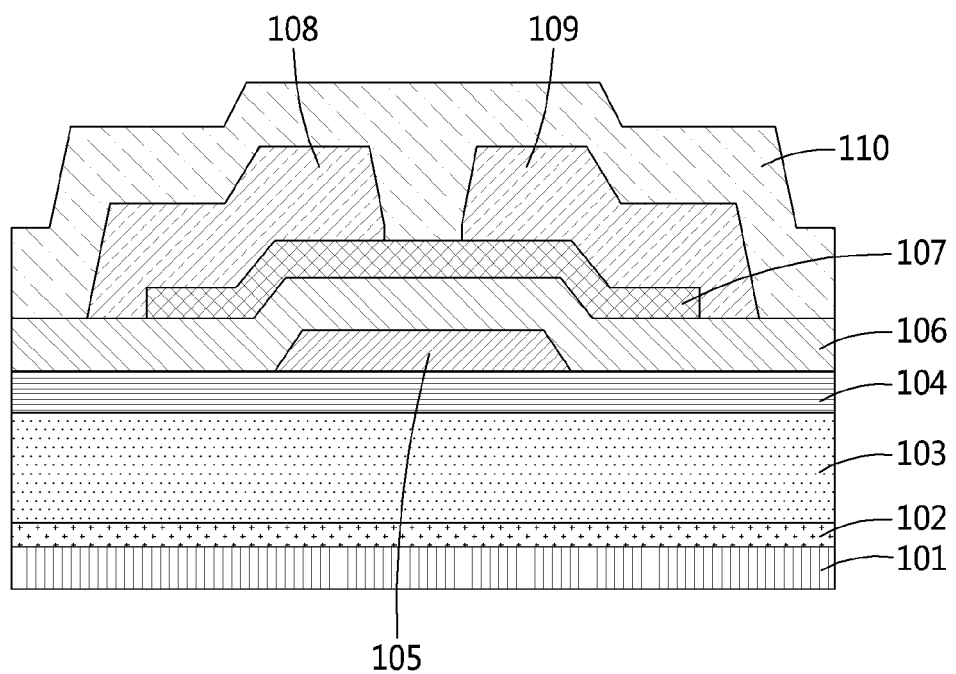

Referring to FIG. 1F, the method of fabricating the oxide semiconductor thin-film transistor 100 according to an embodiment of the present invention includes forming the passivation layer 110 on the source/drain electrodes 108 and 109.

As shown in FIG. 1F, the oxide semiconductor thin-film transistor 100 according to an embodiment of the present invention may include the passivation layer 110.

The passivation layer 110 is formed on the source/drain electrodes 108 and 109. Specifically, the passivation layer 110 is formed to cover all of the gate insulator 106, the oxide semiconductor layer 107 and the source/drain electrodes 108 and 109.

The passivation layer 110 is a protective layer and may be formed in the same material as in the gate insulator 106. The passivation layer 110 may be formed in a single layer structure or multilayer structure made of, for example, any one of silicon oxide, silicon nitride, and the like, but may be formed with various materials without being limited thereto.

The passivation layer 110 may be formed using at least one method of vacuum deposition, chemical vapor deposition, physical vapor deposition, atomic layer deposition, metal organic chemical vapor deposition, plasma-enhanced chemical vapor deposition, molecular beam epitaxy, hydride vapor phase epitaxy, sputtering, spin coating, dip coating, and zone casting.

The oxide semiconductor thin-film transistor 100 according to an embodiment of the present invention may further include a pixel electrode.

The pixel electrode is formed on the passivation layer 110. The pixel electrode is electrically connected to each of the source/drain electrodes 108 and 109, and serves to connect the source/drain electrodes 108 and 109 to other components outside the oxide semiconductor thin-film transistor 100. A pixel electrode 118 may also be formed of a metal material, e.g., molybdenum (Mo).

Figure 1G:
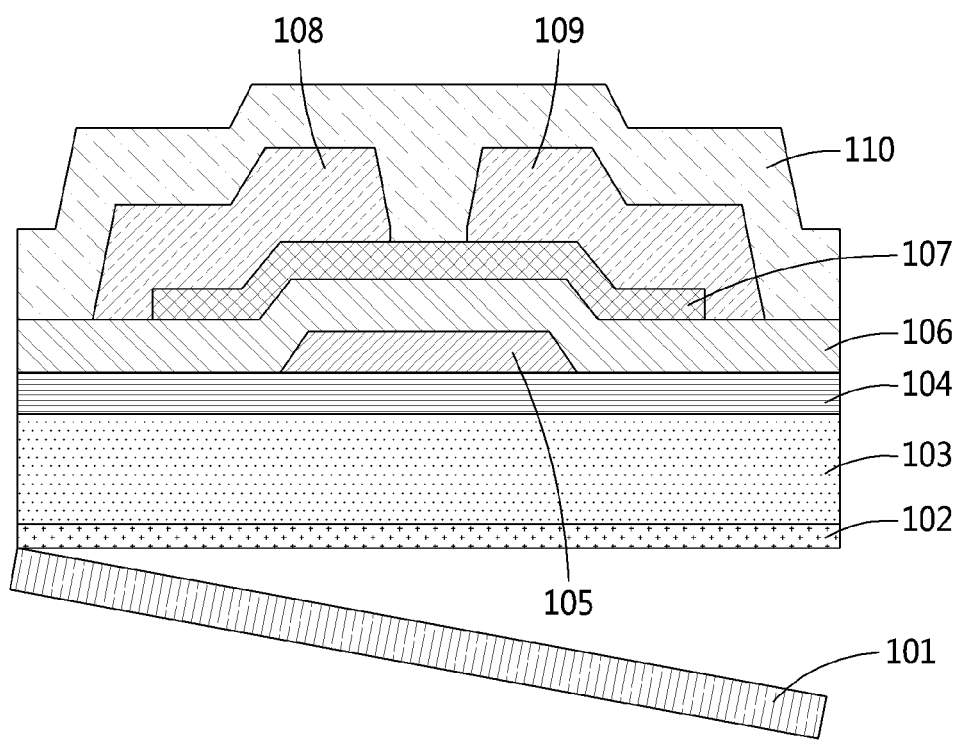

Referring to FIG. 1G, the method of fabricating an oxide semiconductor thin-film transistor according to an embodiment of the present invention includes removing the carrier substrate 101.

As shown in FIG. 1G, the carrier substrate 101 may be removed from the supporting layer 102.

Specifically, after completing fabrication of the oxide semiconductor thin-film transistor 100 or forming an element such as, for example, OLED on the oxide semiconductor thin-film transistor 100, the carrier substrate 101 may be physically removed from the supporting layer 102 using a separate device.

Figure 1H:
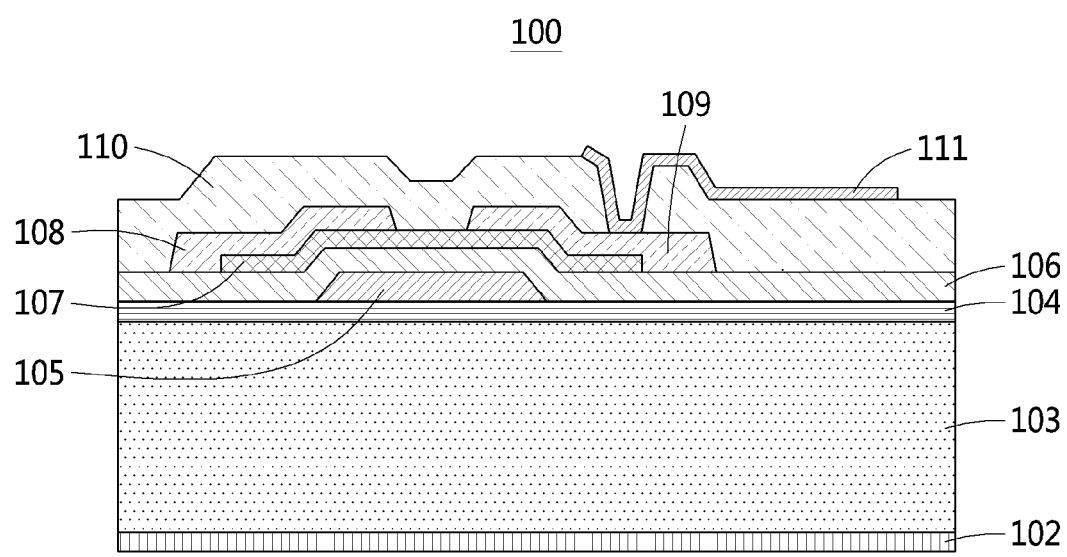

Accordingly, FIG. 1H illustrates the oxide semiconductor thin-film transistor according to an embodiment of the present invention fabricated by the method of fabricating an oxide semiconductor thin-film transistor according to an embodiment of the present invention.

The oxide semiconductor thin-film transistor 100 according to an embodiment of the present invention includes the substrate 103, the first gate electrode 105, the gate insulator 106, the oxide semiconductor layer 107, the source/drain electrodes 108 and 109 and the passivation layer 110. According to an embodiment, the oxide semiconductor thin-film transistor 100 may further include the supporting layer 102, the buffer layer 104 and the pixel electrode 111.

In addition, the source/drain electrodes 108 and 109 of the oxide semiconductor thin-film transistor 100 according to an embodiment of the present invention includes the first area P1 formed in the direction of the first gate electrode 105 with respect to a horizontal plane of the substrate 103; and the second area P2 formed in the opposite direction to the first area P1. Here, the plurality of island patterns are formed such that the first areas P1 are separated from each other, thereby exhibiting resistance to external stress.

Accordingly, the oxide semiconductor thin-film transistor 100 according to an embodiment of the present invention may reduce the areas of the source/drain electrodes 108 and 109, thereby reducing parasitic capacitance generated between the first gate electrode 105 and the source/drain electrodes 108 and 109.

An oxide semiconductor thin film transistor having high electrical characteristics according to an embodiment of the present disclosure may be used as a pixel element of a flexible display such as a liquid crystal display (LCD) or an organic light emitting display (AMOLED).

The oxide semiconductor thin film transistor according to an embodiment of the present disclosure may be used as a pixel element of a flexible display such as a liquid crystal display (LCD) or an organic light emitting display (AMOLED). More specifically, a display apparatus may be manufactured through a step of forming the pixel electrode 111 electrically connected to any one of the source/drain electrodes 108 and 109, after fabricating the oxide semiconductor thin-film transistor using the aforementioned method.

For example, as shown in FIGS. 1a 1h, the passivation layer 110 configured to cover the source/drain electrodes 108 and 109 is formed, a pixel electrode 111 configured to contact with the drain electrode 109 through a through hole of the passivation layer 110 is formed, an intermediate layer (not shown) including a light emitting layer (not shown) is formed on the pixel electrode 111, and a counter electrode (not shown) is formed on the intermediate layer, thereby manufacturing an organic light emitting display apparatus.

Hereinafter, the plurality of island patterns of the oxide semiconductor thin-film transistor according to an embodiment of the present invention are described in more detail with reference to FIGS. 2A to 2C.

Figure 2A:
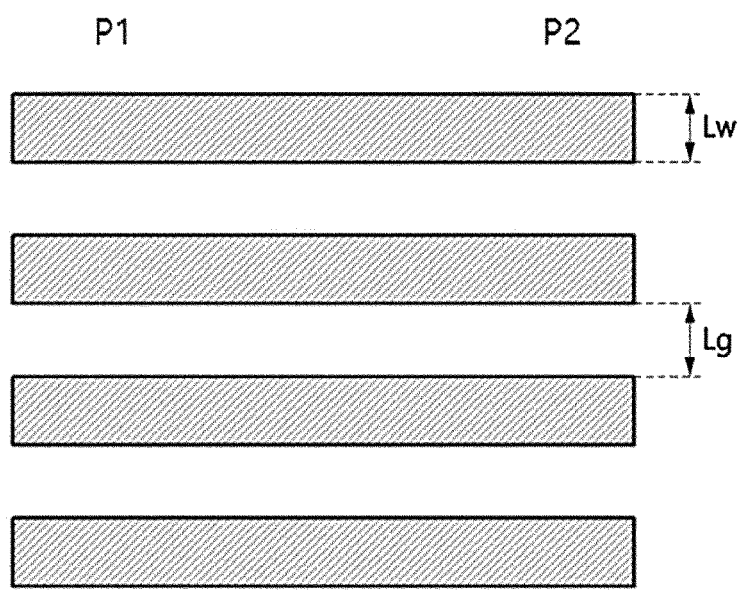
FIGS. 2A to 2C illustrate top views of a plurality of island patterns, formed in various shapes, of an oxide semiconductor thin-film transistor according to an embodiment of the present invention.
Figure 2B:
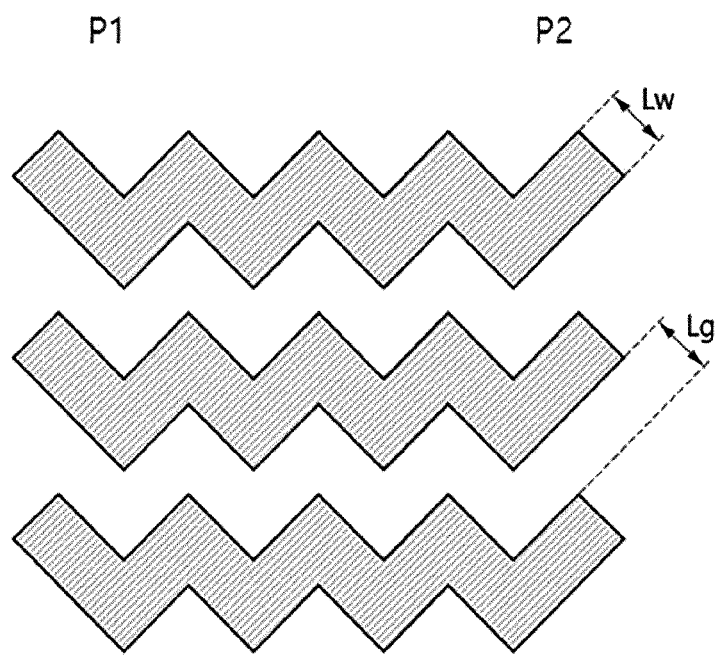
Figure 2C:
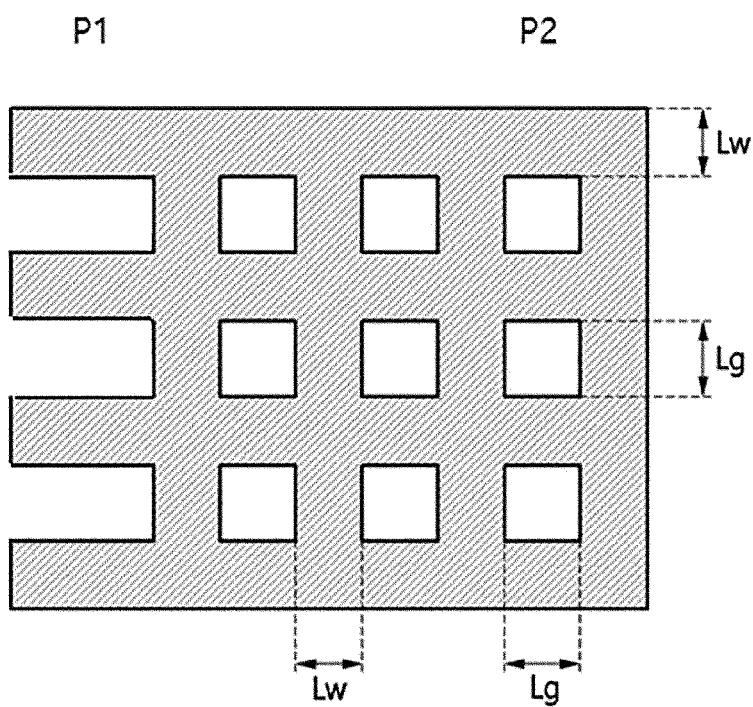

FIGS. 2A to 2C illustrate top views of a plurality of island patterns, formed in various shapes, of an oxide semiconductor thin-film transistor according to an embodiment of the present invention.

In the oxide semiconductor thin-film transistor according to an embodiment of the present invention, the source/drain electrodes 108 and 109 may be formed in the shape of a plurality of island patterns.

The plurality of island patterns may be formed in various shapes such as a line shape, a zigzag line shape, a lattice shape, and the like.

Referring to FIGS. 2A to 2C, a plurality of island patterns may be formed in the shape of a plurality of lines, wherein a plurality of line patterns are repeatedly formed, as shown in FIG. 2A, in the shape of a plurality of zigzag lines, wherein a plurality of line patterns extend in zigzag directions, as shown in FIG. 2B, or in a lattice shape, wherein a plurality of line patterns vertically intersect, as shown in FIG. 2C.

The widths of a plurality of line patterns (Lw) constituting a plurality of island patterns may be respectively 1 µm to 10 µm, preferably 1 µm to 5 µm, more preferably 4 µm to 5 µm.

When the widths of a plurality of line patterns (Lw) are less than 4 µm, a current value may be reduced. When the widths of a plurality of line patterns (Lw) are greater than 5 µm, parasitic capacitance may not be effectively reduced due to too wide width.

In addition, a spacing between a plurality of line patterns (Lg), i.e., a spacing (Lg) between one line pattern and adjacent line patterns, may be 1 µm to 16 µm, preferably 1 µm to 5 µm. Here, spacings between a plurality of line patterns (Lg) may be the same or different.

When the spacing between a plurality of line patterns (Lg) is less than 1 µm, parasitic capacitance may not be effectively reduced due to too narrow spacing. When the spacing between a plurality of line patterns (Lg) is greater than 5 µm, a current value may be reduced.

Figure 3A:
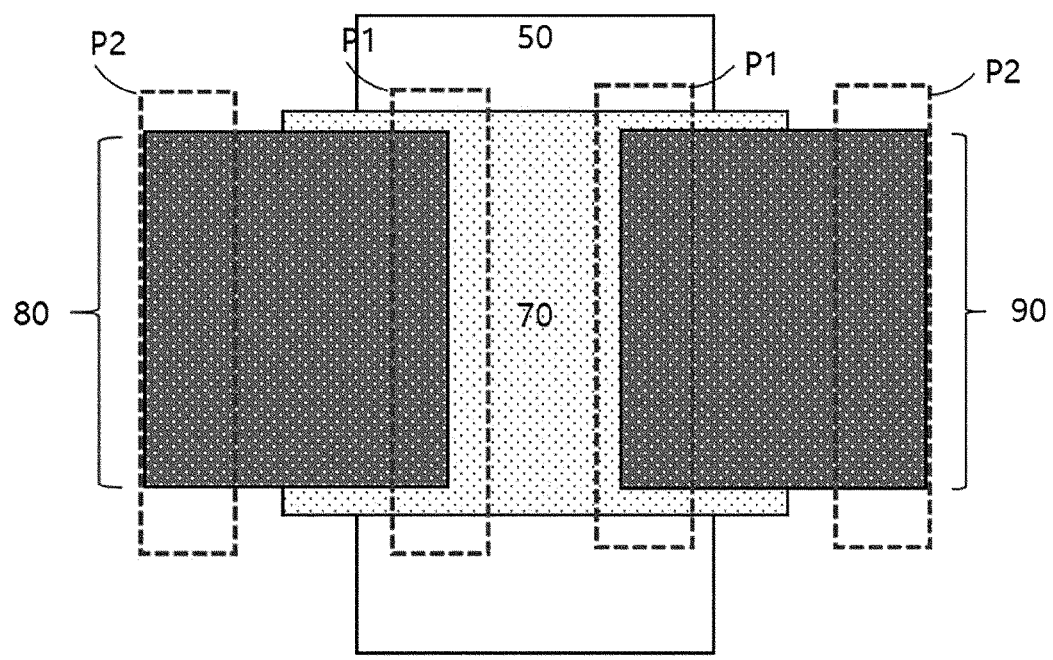
FIG. 3A illustrates a top view of a conventional oxide semiconductor thin-film transistor.
Figure 3B:
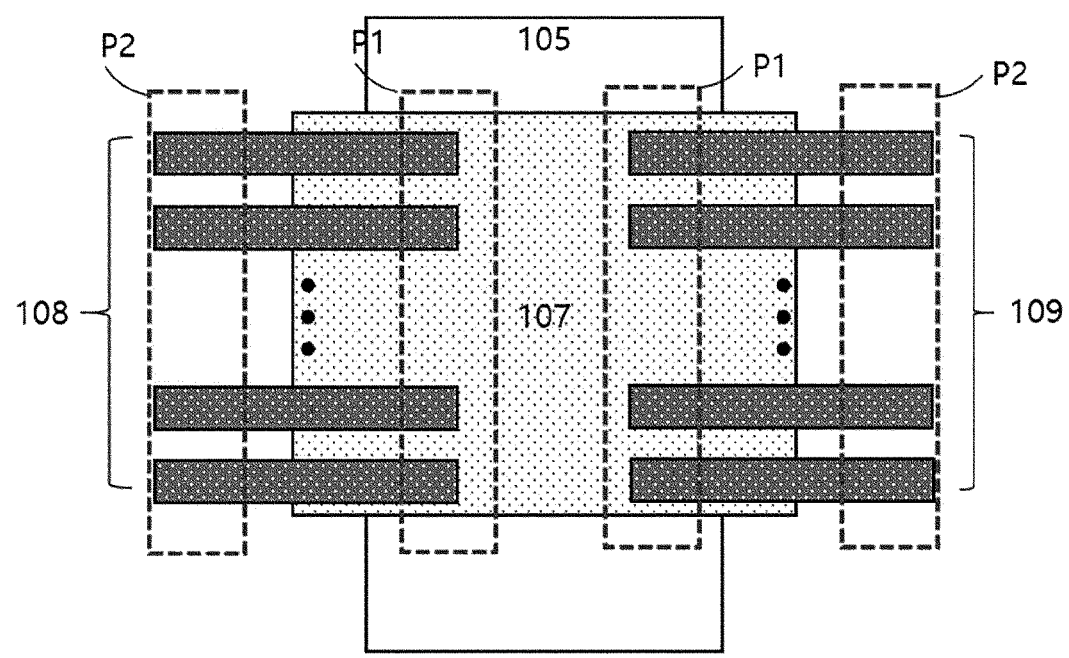
FIG. 3B illustrates a top view of an oxide semiconductor thin-film transistor according to an embodiment of the present invention.

FIG. 3A illustrates a top view of a conventional oxide semiconductor thin-film transistor, and FIG. 3B illustrates a top view of an oxide semiconductor thin-film transistor according to an embodiment of the present invention.

Referring to FIG. 3A, in the case of the conventional oxide semiconductor thin-film transistor, source/drain electrodes 80 and 90 are formed to be spaced from each other on a gate electrode 50 and an oxide semiconductor layer 70. However, the source/drain electrodes 80 and 90 of the conventional oxide semiconductor thin-film transistor are not formed in the shape of a plurality of island patterns.

However, referring to FIG. 3B, the source/drain electrodes 108 and 109, which are spaced from each other, and the second gate electrode 112 are formed on the first gate electrode 105 and the oxide semiconductor layer 107 of the oxide semiconductor thin-film transistor according to an embodiment of the present invention. The source/drain electrodes 108 and 109 are formed in the shape of a plurality of island patterns. Further, the plurality of island patterns of the source/drain electrodes 108 and 109 are formed such that the first areas P1 are separated from each other.

Accordingly, when compared to the conventional oxide semiconductor thin-film transistor, the oxide semiconductor thin-film transistor according to an embodiment of the present invention may reduce the areas of the source/drain electrodes 108 and 109 and thus may reduce parasitic capacitance generated between the first gate electrode 105 and the source/drain electrodes 108 and 109, thereby being capable of improving resistance to external stress.

Hereinafter, the electrical and optical characteristics of the oxide semiconductor thin-film transistor according to an embodiment of the present invention are described with reference to FIGS. 4A to 16F.

FIGS. 4A to 4F illustrate the characteristics of oxide semiconductor thin-film transistors according to an embodiment of the present invention, dependent upon the widths of a plurality of line patterns.

FIGS. 4A to 4F illustrate optical microscope images of source/drain electrodes, which are formed in the shape of a plurality of island patterns having different widths and formed such that first areas are separated from each other, of an oxide semiconductor thin-film transistor according to an embodiment of the present invention wherein.

Figure 4A:
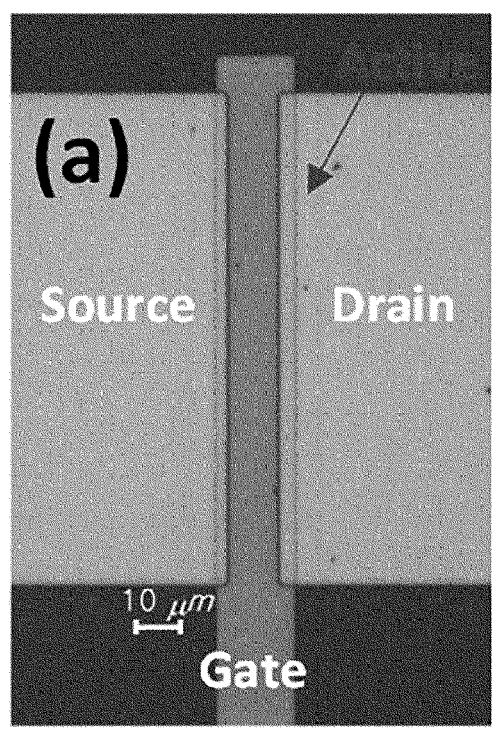
FIGS. 4A to 4H illustrate the characteristics of oxide semiconductor thin-film transistors according to an embodiment of the present invention, dependent upon the widths of a plurality of line patterns.
Figure 4B:
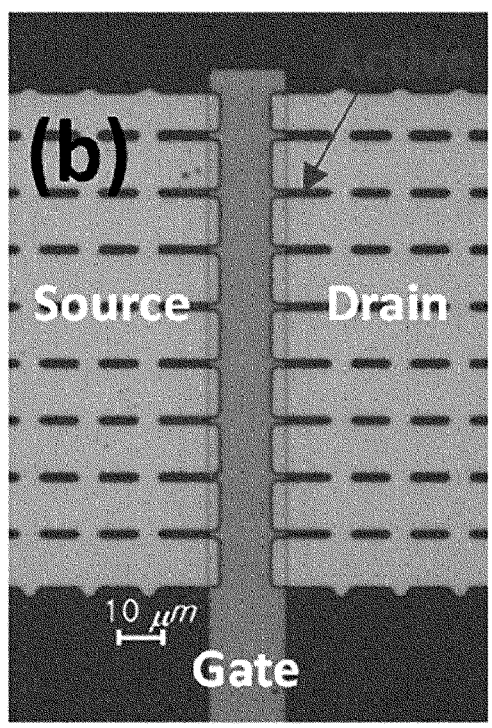
Figure 4C:
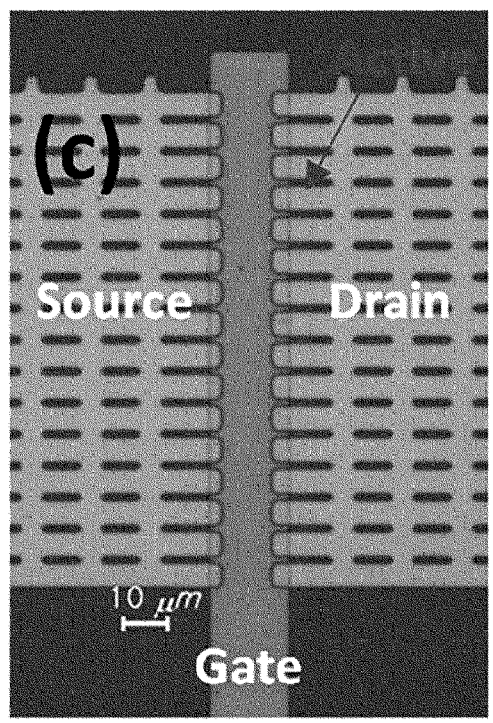
Figure 4D:
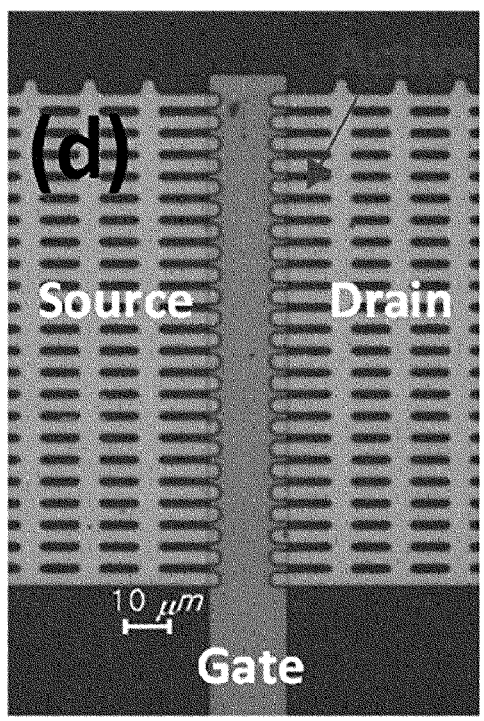
Figure 4E:
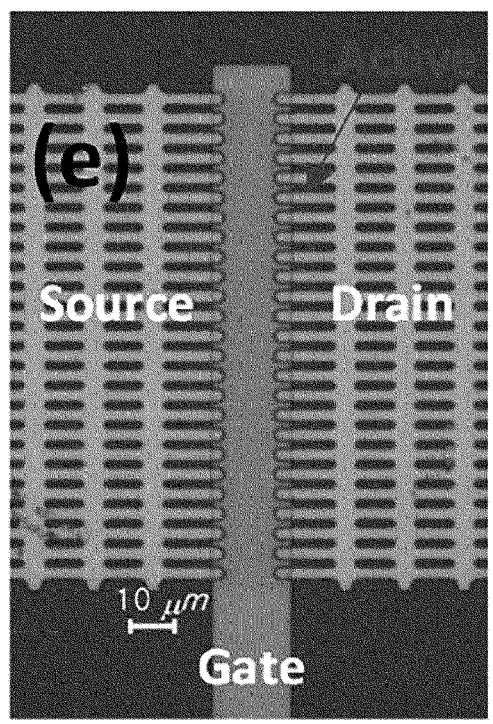
Figure 4F:
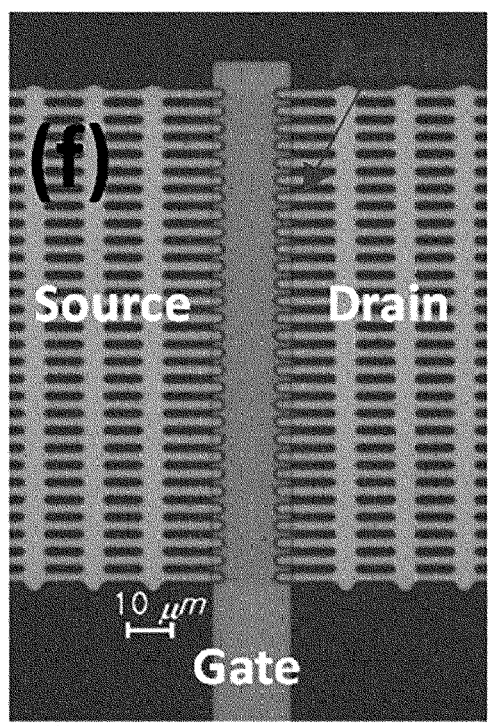
Figure 4G:
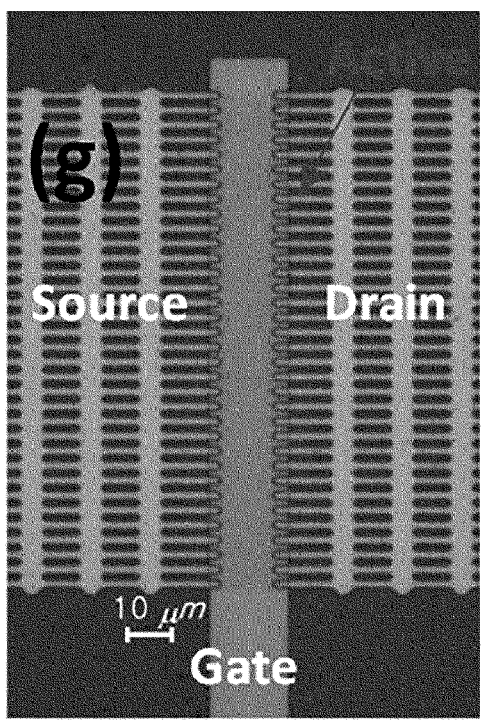
Figure 4H:
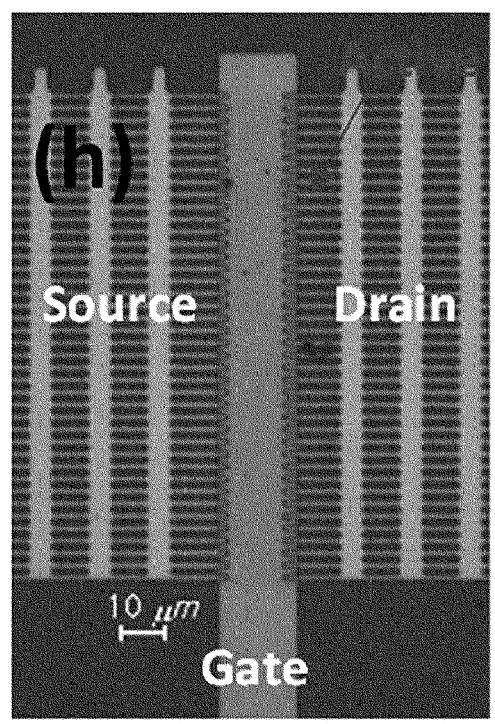

FIG. 4A illustrates an optical microscope image of an general oxide semiconductor thin-film transistor wherein a source electrode S and a drain electrode D are formed such that first areas are not separated from each other.

Referring to FIG. 4A, in the source electrode S and the drain electrode D of the general oxide semiconductor thin-film transistor, first areas are not separated from each other.

FIGS. 4B to 4F illustrate optical microscope images of oxide semiconductor thin-film transistors according to an embodiment of the present invention wherein the source electrode S and the drain electrode D are formed in the shape of a plurality of island patterns having a lattice shape and are formed such that first areas are separated from each other.

Referring to FIGS. 4B to 4F, the source electrodes S and the drain electrodes D of the oxide semiconductor thin-film transistors according to an embodiment of the present invention are formed in the shape of a plurality of island patterns having a lattice shape wherein first areas are separated from each other.

In addition, referring to FIGS. 4B to 4F, it can be confirmed that the widths of the lattice-shaped line patterns of the source electrodes S and the drain electrodes D of the oxide semiconductor thin-film transistors according to an embodiment of the present invention are satisfactorily diversified.

Figure 5A:
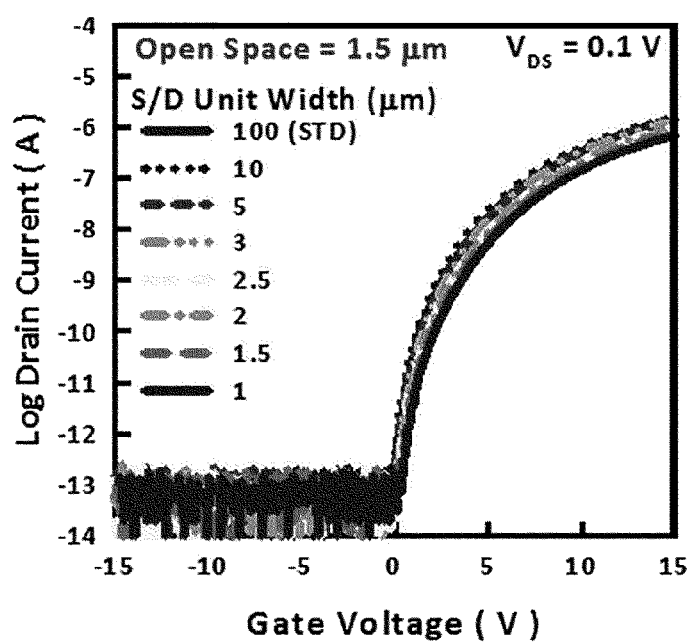
FIG. 5A illustrates drain current-gate voltage characteristics dependent upon a change in the widths of a plurality of line patterns of an oxide semiconductor thin-film transistor according to an embodiment of the present invention when a spacing between the plurality of line patterns is 1.5 μm.
Figure 5B:
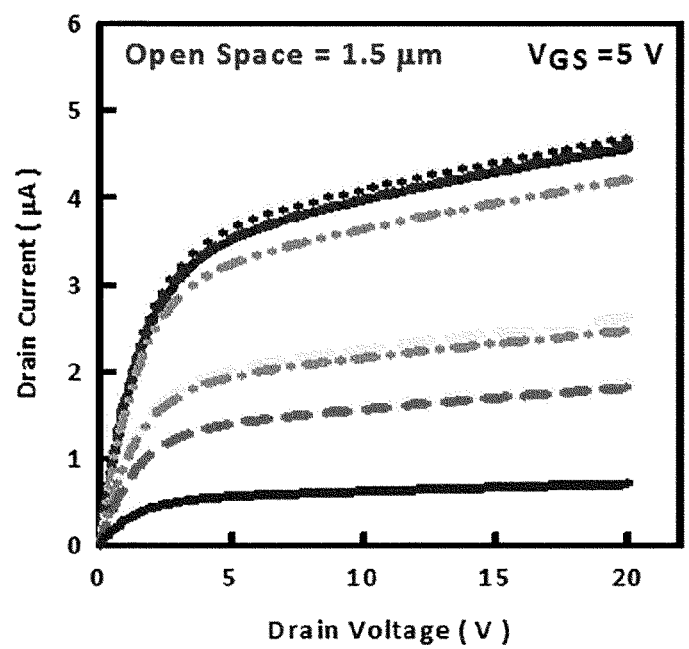
FIG. 5B illustrates drain current-gate voltage characteristics dependent upon a change in the widths of the plurality of line patterns when a spacing between the plurality of line patterns is 1.5 μm.

FIG. 5A illustrates drain current-gate voltage characteristics dependent upon a change in the widths of a plurality of line patterns of an oxide semiconductor thin-film transistor according to an embodiment of the present invention when a spacing between the plurality of line patterns is 1.5 μm, and FIG. 5B illustrates drain current-gate voltage characteristics dependent upon a change in the widths of the plurality of line patterns when a spacing between the plurality of line patterns is 1.5 μm.

Figure 5C:
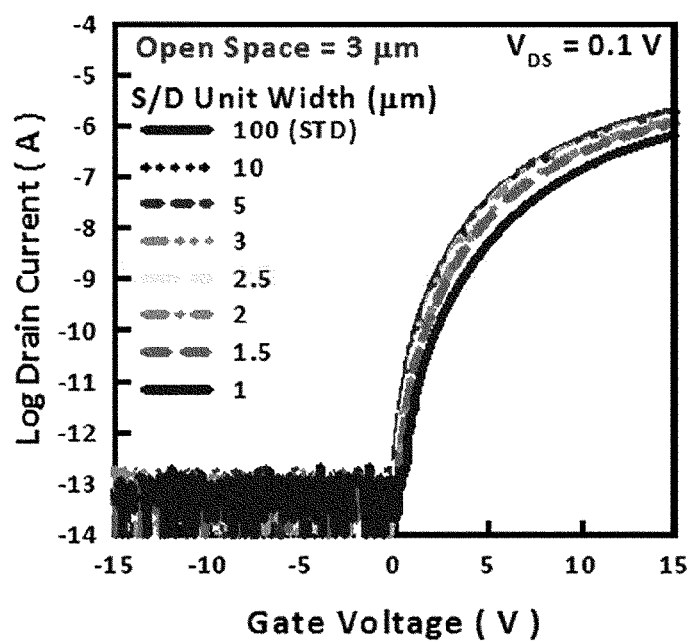
FIG. 5C illustrates drain current-gate voltage characteristics dependent upon a change in the widths of a plurality of line patterns of an oxide semiconductor thin-film transistor according to an embodiment of the present invention when a spacing between the plurality of line patterns is 3 μm.
Figure 5D:
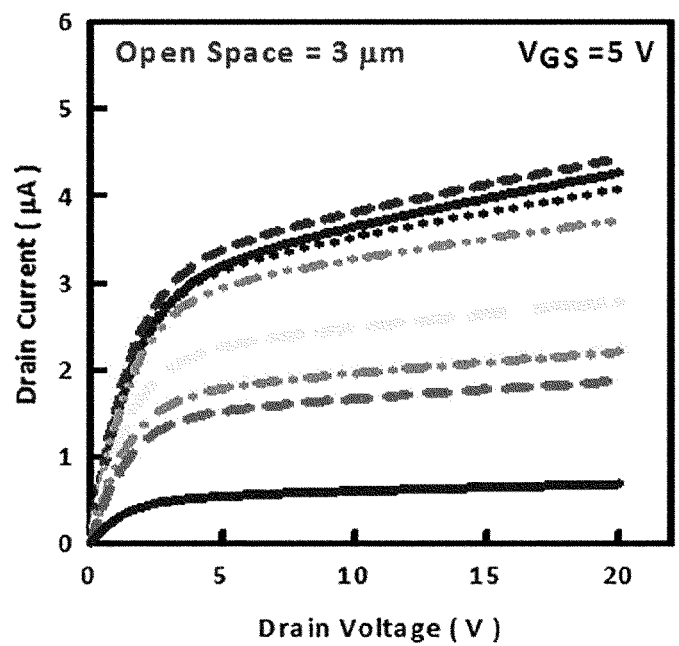
FIG. 5D illustrates drain current-gate voltage characteristics dependent upon a change in the widths of the plurality of line patterns when a spacing between the plurality of line patterns is 3 μm.

FIG. 5C illustrates drain current-gate voltage characteristics dependent upon a change in the widths of a plurality of line patterns of an oxide semiconductor thin-film transistor according to an embodiment of the present invention when a spacing between the plurality of line patterns is 3 μm, and FIG. 5D illustrates drain current-gate voltage characteristics dependent upon a change in the widths of the plurality of line patterns when a spacing between the plurality of line patterns is 3 μm.

Figure 5E:
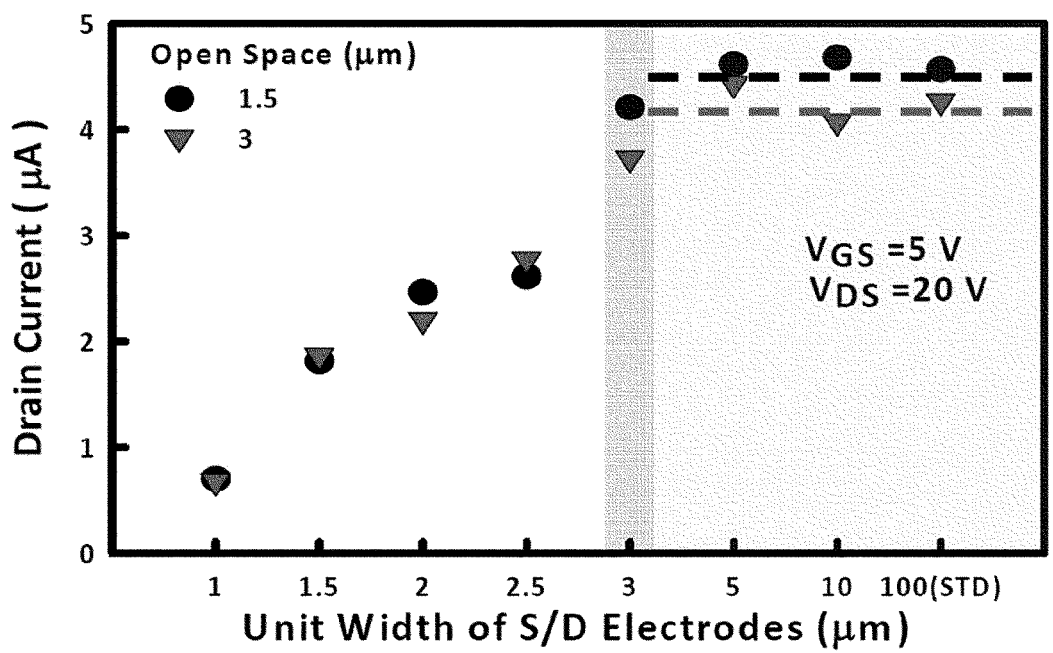
FIG. 5E illustrates drain current characteristics dependent upon a change in the widths of a plurality of line patterns of an oxide semiconductor thin-film transistor according to an embodiment of the present invention when a spacing between the plurality of line patterns is 1.5 μm or 3 μm.

FIG. 5E illustrates drain current characteristics dependent upon a change in the widths of a plurality of line patterns of an oxide semiconductor thin-film transistor according to an embodiment of the present invention when a spacing between the plurality of line patterns is 1.5 μm or 3 μm.

Referring to FIGS. 5A to 5E, it can be confirmed that drain currents increase with increasing widths of a plurality of line patterns when the spacings between a plurality of line patterns are 1.5 μm or 3 μm. Accordingly, it can be confirmed that a diffusion current (spreading currents) is present in the oxide semiconductor thin-film transistor according to an embodiment of the present invention and, when the widths of a plurality of line patterns are 5 μm, the oxide semiconductor thin-film transistor according to an embodiment of the present invention is similar to a standard oxide semiconductor thin-film transistor (STD).

FIGS. 6A to 6F illustrate the characteristics of oxide semiconductor thin-film transistors according to an embodiment of the present invention dependent upon a spacing between a plurality of line patterns.

FIGS. 6A to 6F illustrate optical microscope images of oxide semiconductor thin-film transistors according to an embodiment of the present invention wherein source/drain electrodes are formed in the shape of a plurality of island patterns, spacings between line patterns of which are different, and are formed such that first areas are separated from each other.

Figure 6A:
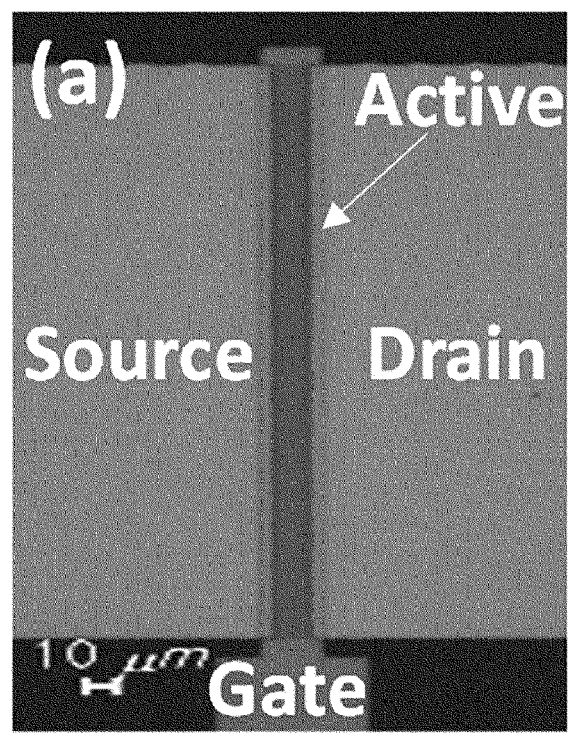
FIGS. 6A to 6H illustrate the characteristics of oxide semiconductor thin-film transistors according to an embodiment of the present invention dependent upon a spacing between a plurality of line patterns.
Figure 6B:
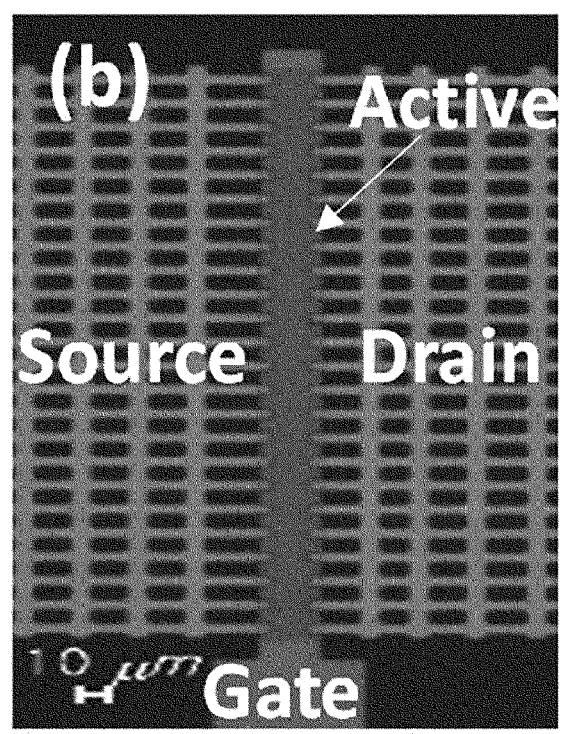
Figure 6C:
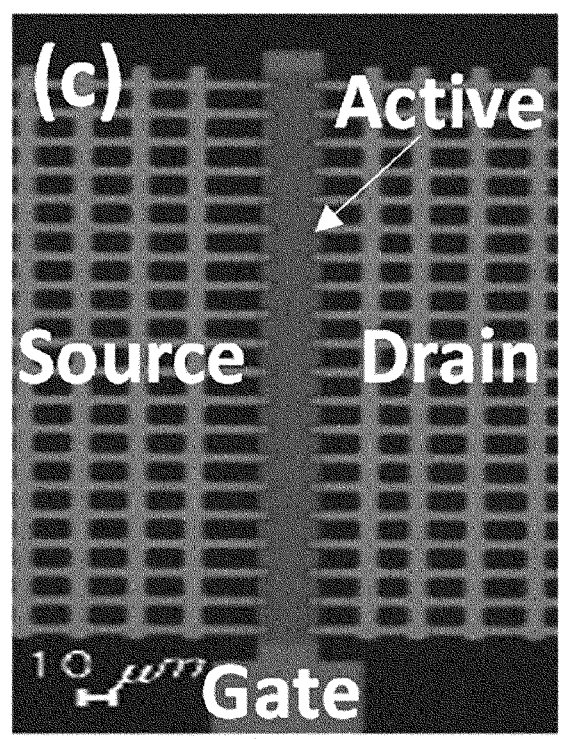
Figure 6D:
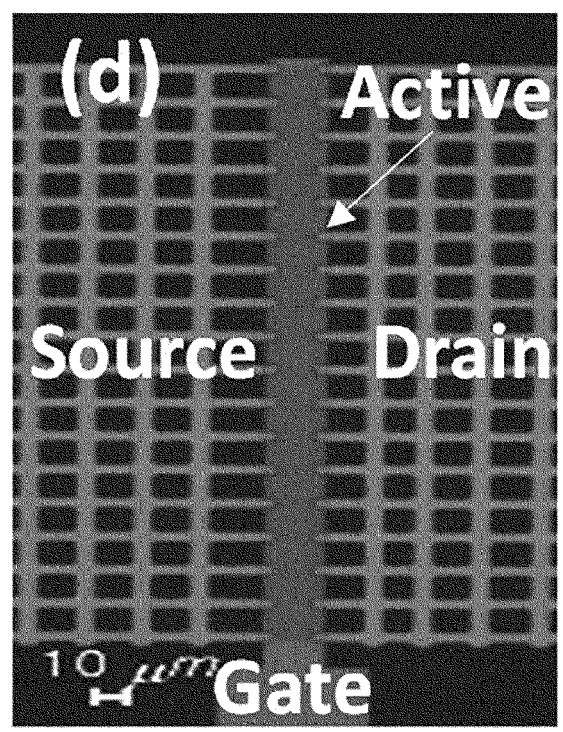
Figure 6E:
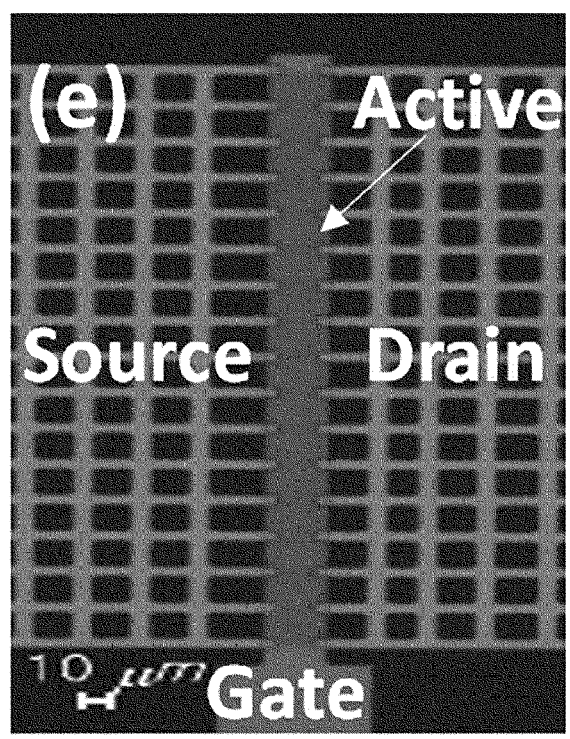
Figure 6F:
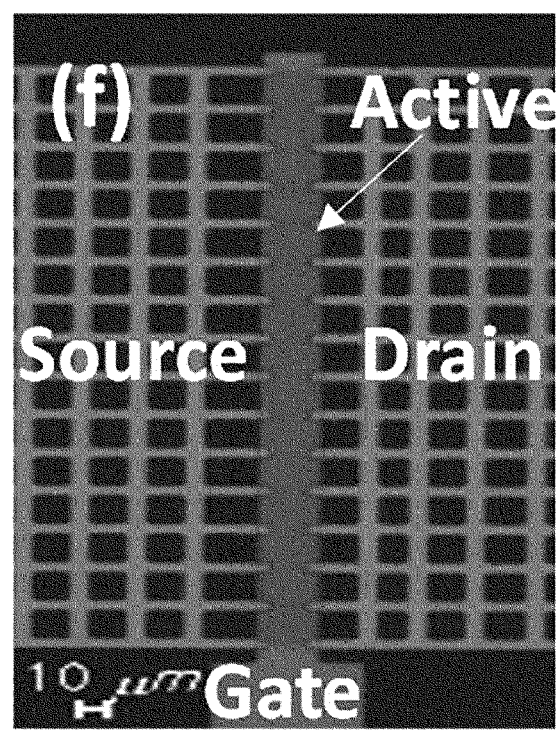
Figure 6G:
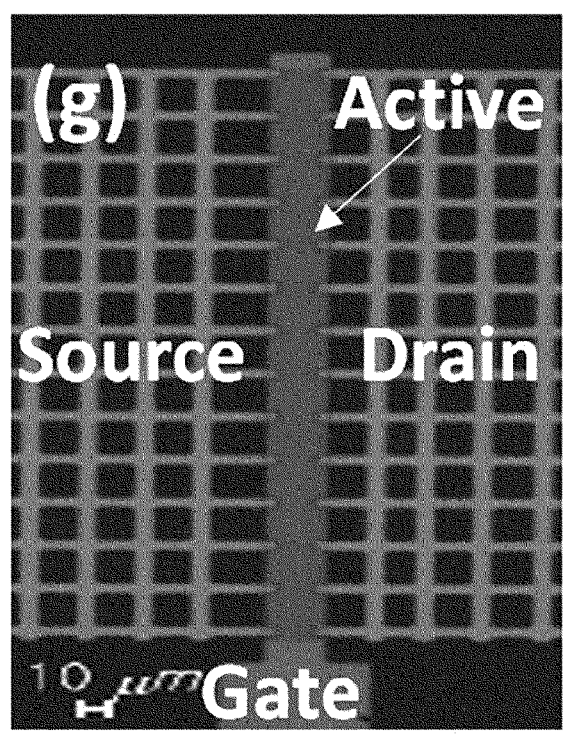
Figure 6H:
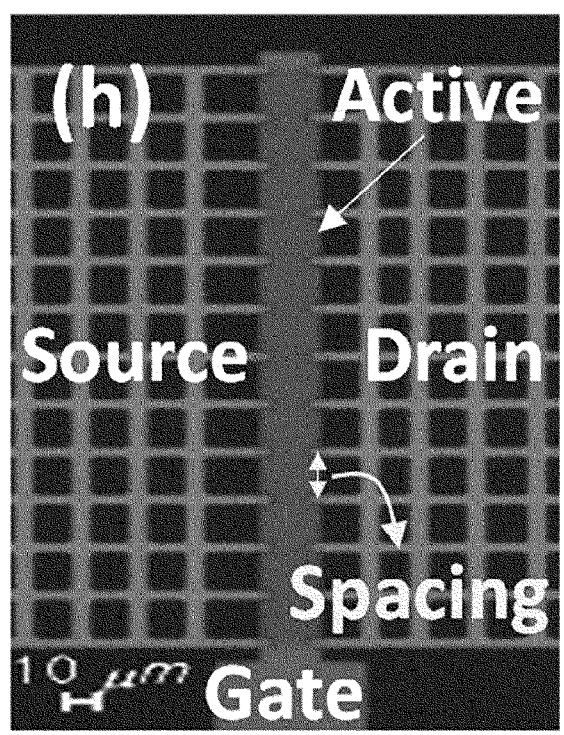

FIG. 6A illustrates an optical microscope image of an oxide semiconductor thin-film transistor wherein first areas of the source electrode S and the drain electrode D are not separated.

Referring to FIG. 6A, it can be confirmed that first areas of the source electrode S and the drain electrode D of the general oxide semiconductor thin-film transistor are not separated.

FIGS. 6A to 6F illustrate optical microscope images of oxide semiconductor thin-film transistors according to an embodiment of the present invention wherein the source electrode S and the drain electrode D are formed in the shape of a plurality of island patterns having a lattice shape and are formed such that the first areas are separated from each other.

Referring to FIGS. 6A to 6F, it can be confirmed that the source electrodes S and the drain electrodes D of the oxide semiconductor thin-film transistors according to an embodiment of the present invention are formed in the shape of a plurality of island patterns having a lattice shape wherein the first areas are separated from each other.

In addition, referring to FIGS. 6A to 6F, it can be confirmed that spacings between the lattice-shaped line patterns of the source electrodes S and the drain electrodes D of the oxide semiconductor thin-film transistors according to an embodiment of the present invention are satisfactorily diversified.

Figure 7A:
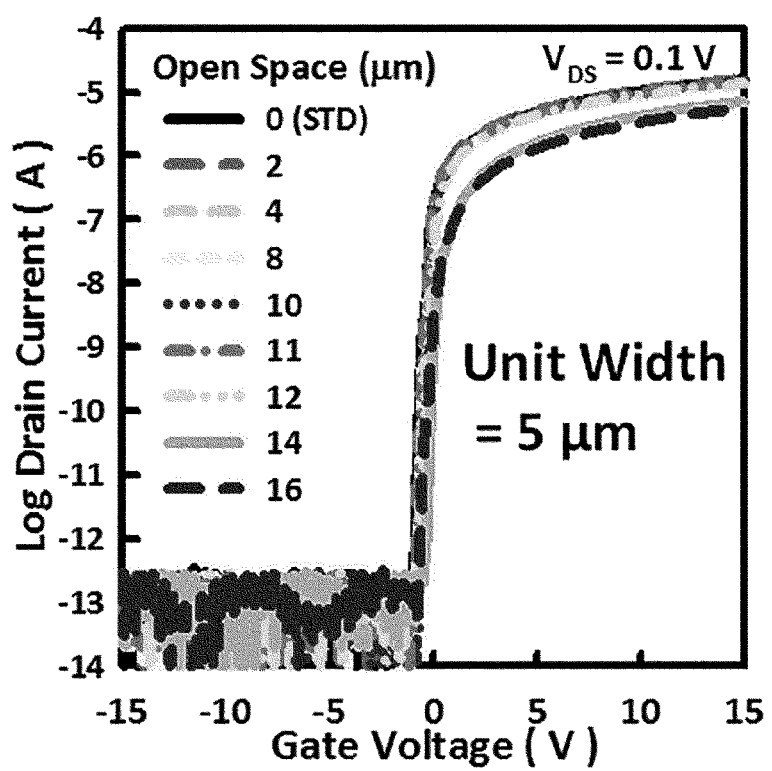
FIG. 7A illustrates drain current-gate voltage characteristics dependent upon a change in a spacing between a plurality of line patterns of an oxide semiconductor thin-film transistor according to an embodiment of the present invention when the widths of the plurality of line patterns are 5 μm.
Figure 7B:
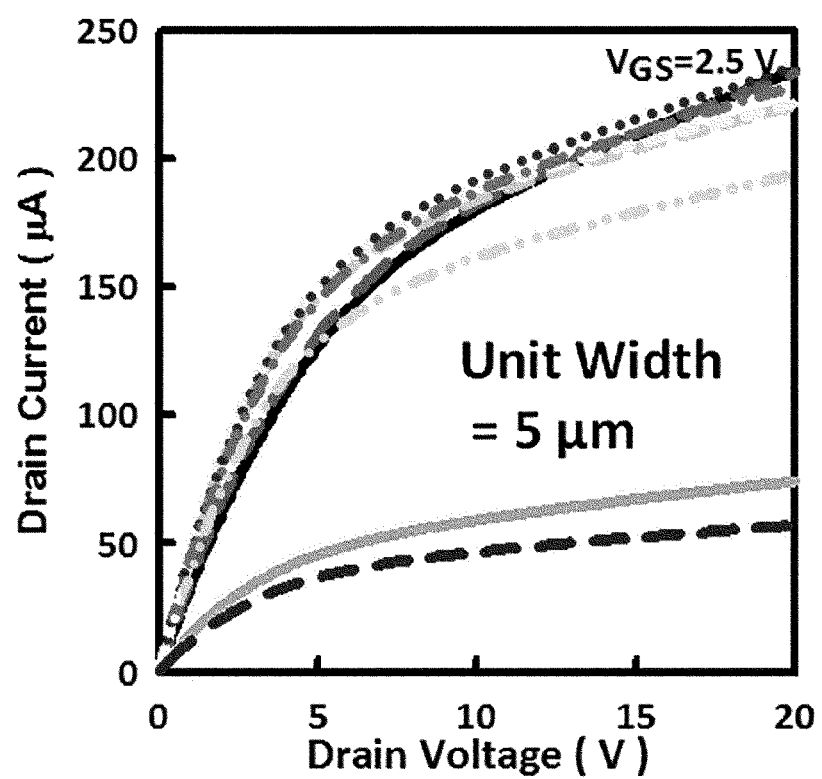
FIG. 7B illustrates drain current-drain voltage characteristics dependent upon a change in a spacing between a plurality of line patterns of an oxide semiconductor thin-film transistor according to an embodiment of the present invention when the widths of the plurality of line patterns are 5 μm.

FIG. 7A illustrates drain current-gate voltage characteristics dependent upon a change in a spacing between a plurality of line patterns of an oxide semiconductor thin-film transistor according to an embodiment of the present invention when the widths of the plurality of line patterns are 5 μm, and FIG. 7B illustrates drain current-drain voltage characteristics dependent upon a change in a spacing between a plurality of line patterns of an oxide semiconductor thin-film transistor according to an embodiment of the present invention when the widths of the plurality of line patterns are 5 μm.

In [Table 1], the characteristics of FIGS. 7A and 7B are summarized.

TABLE 1

| Open space (μm) | Active width (μm) | S/D unit width (μm) | Number of units (S/D) (μm) | S/D total width (μm) | $I_{DS}$ (μA) | $C_{min}$ (pF) (Calculation) | $C_{min}$ (pF) (Measurement) |
|---|---|---|---|---|---|---|---|
| 0(STD) | 240 | 5 | 1 | 240 | 234 | 0.42 | 0.45 |
| 6 | 240 | 5 | 22 | 110 | 220 | 0.19 | 0.23 |
| 8 | 240 | 5 | 19 | 95 | 221 | 0.16 | 0.19 |
| 10 | 240 | 5 | 16 | 80 | 236 | 0.13 | 0.18 |
| 12 | 240 | 5 | 14 | 70 | 193 | 0.12 | 0.16 |
| 16 | 240 | 5 | 12 | 60 | 57 | 0.10 | 0.13 |

Referring to FIGS. 7A and 7B and Table 1, it can be confirmed that characteristics similar to the characteristics of a standard oxide semiconductor thin-film transistor (STD) are observed when a diffusion current is present between the source electrode and the drain electrode and a spacing between a plurality of line patterns is 10 μm or less, and drain current characteristics are relatively decreased, compared to a standard oxide semiconductor thin-film transistor, when a spacing between a plurality of line patterns is 12 μm.

Figure 8:
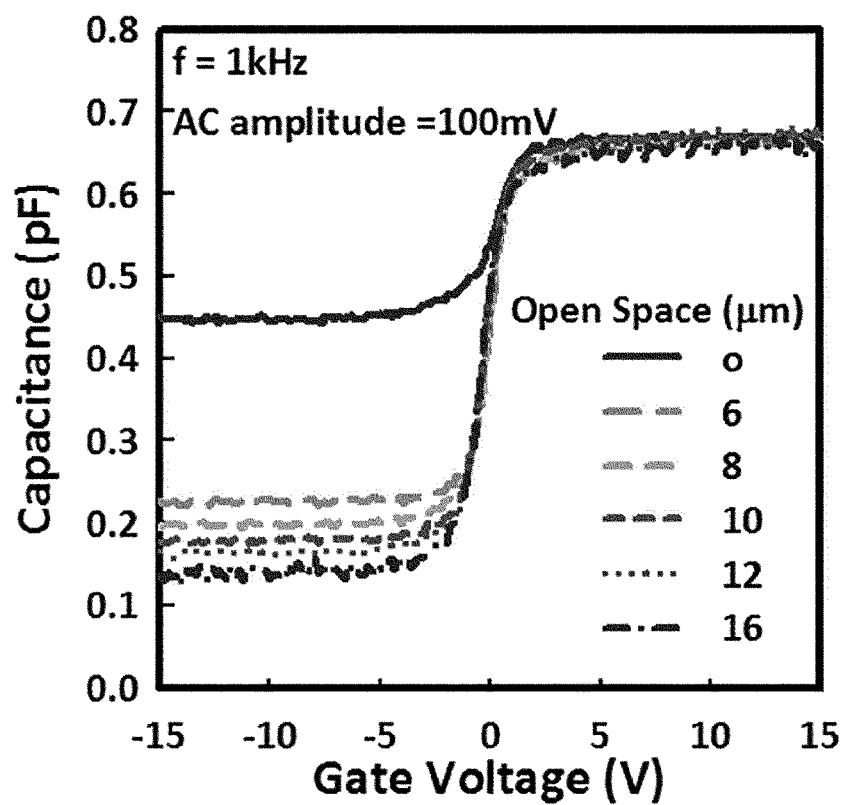
FIG. 8 illustrates capacitance-gate voltage characteristics dependent upon a change in a spacing between a plurality of line patterns of an oxide semiconductor thin-film transistor according to an embodiment of the present invention.

FIG. 8 illustrates capacitance-gate voltage characteristics dependent upon a change in a spacing between a plurality of line patterns of an oxide semiconductor thin-film transistor according to an embodiment of the present invention.

Referring to FIG. 8, a capacitance measured in a negative gate voltage (VGS) is the sum of depletion and overlap capacitances between a gate electrode and source/drain electrodes. It can be confirmed that parasitic capacitance is decreased with increasing spacing between a plurality of line patterns so that capacitance is decreased.

Such a characteristic was similarly observed in a positive gate voltage (VGS).

Accordingly, the oxide semiconductor thin-film transistor according to an embodiment of the present invention includes a plurality of island patterns formed such that the first areas are separated from each other, so that parasitic capacitance may be significantly reduced.

Figure 9A:
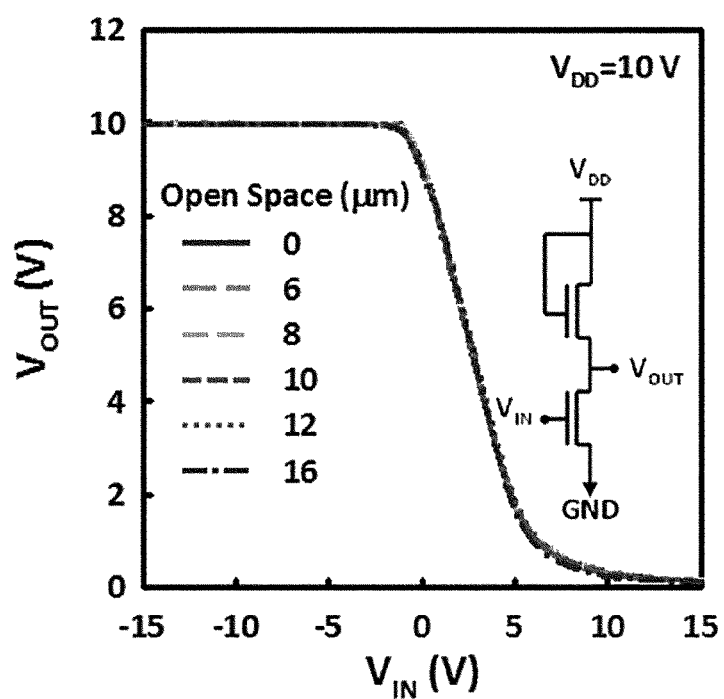
FIG. 9A illustrates inverter characteristics of an oxide semiconductor thin-film transistor according to an embodiment of the present invention dependent upon a change in a spacing between a plurality of line patterns.
Figure 9B:
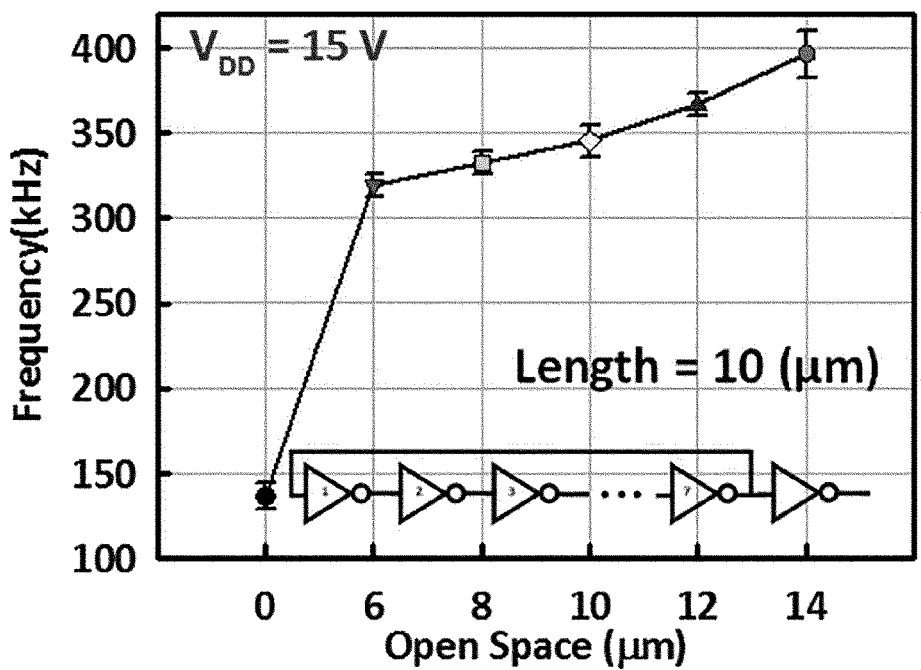
FIG. 9B illustrates a frequency dependent upon a change in a spacing between a plurality of line patterns.
Figure 9C:
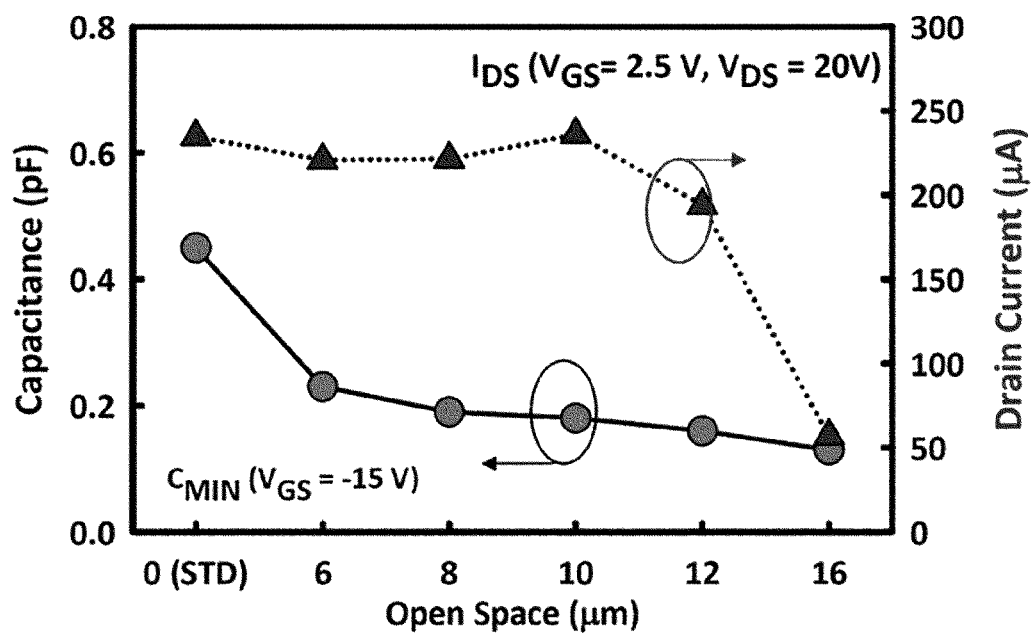
FIG. 9C illustrates a drain current and capacitance of an oxide semiconductor thin-film transistor according to an embodiment of the present invention dependent upon a change in a spacing between a plurality of line patterns, and FIGS. 9D and 9E schematically illustrate a diffusion current of an oxide semiconductor thin-film transistor according to an embodiment of the present invention.
Figure 9D:
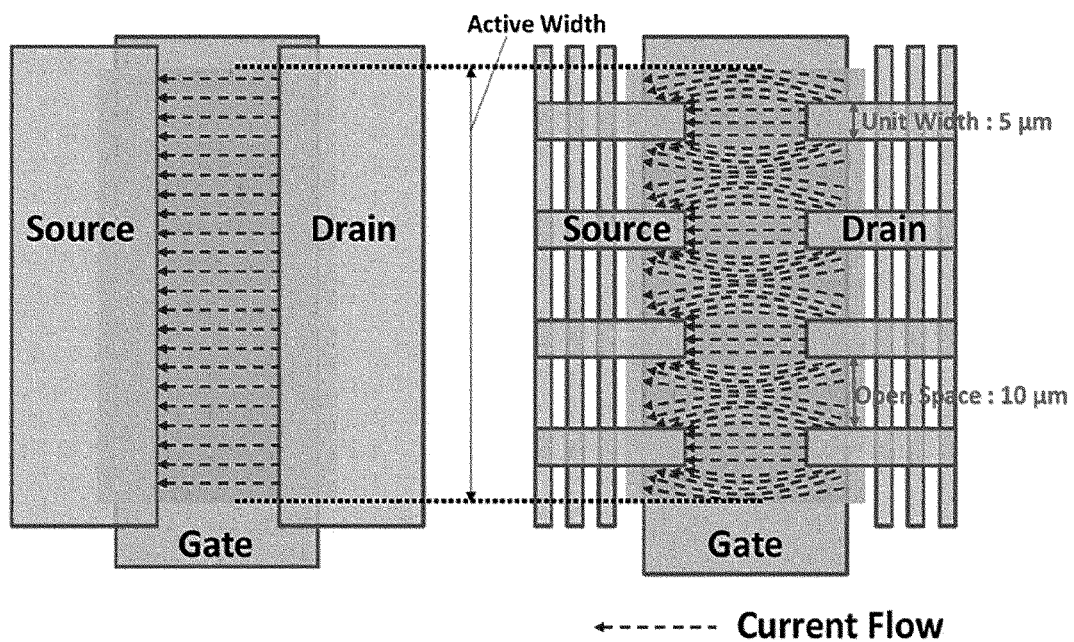
Figure 9E:
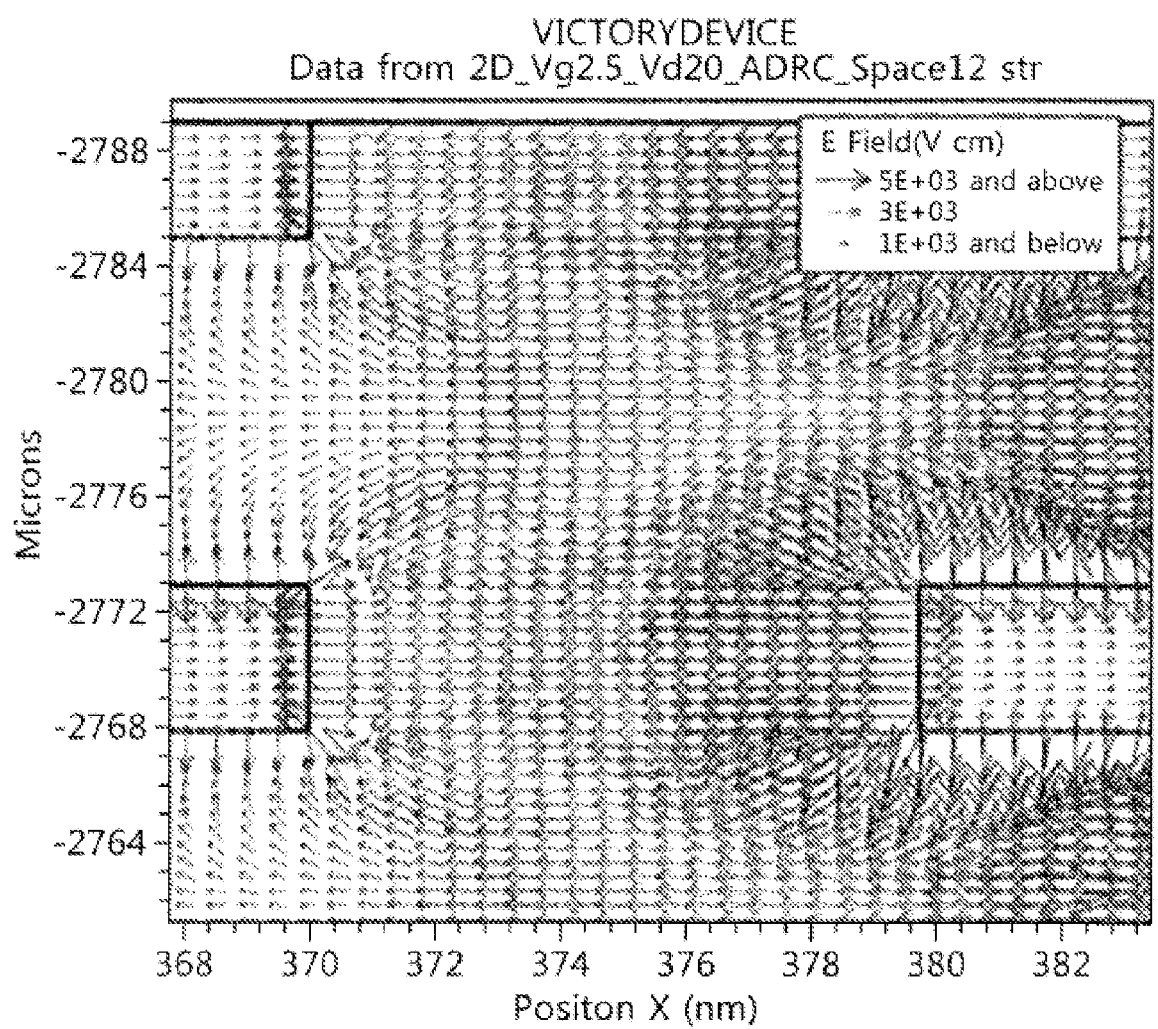

FIG. 9A illustrates inverter characteristics of an oxide semiconductor thin-film transistor according to an embodiment of the present invention dependent upon a change in a spacing between a plurality of line patterns, FIG. 9B illustrates a frequency dependent upon a change in a spacing between a plurality of line patterns, FIG. 9C illustrates a drain current and capacitance of an oxide semiconductor thin-film transistor according to an embodiment of the present invention dependent upon a change in a spacing between a plurality of line patterns, and FIGS. 9D and 9E schematically illustrate a diffusion current of an oxide semiconductor thin-film transistor according to an embodiment of the present invention.

In FIGS. 9D and 9E, a spacing between a plurality of line patterns is 5 μm, and the widths of a plurality of line patterns are 5 μm.

FIG. 9A illustrates inverter driving characteristics. In all of the widths between a plurality of line patterns ranging from 0 μm to 10 μm, stable driving characteristics are observed, which indicates that the oxide semiconductor thin-film transistor according to an embodiment of the present invention is suitable for application to a circuit.

FIG. 9B illustrates a characteristic of a ring oscillator (circuit) fabricated by weaving several inverters. It can be confirmed that the ring oscillator has a characteristic of being greatly influenced by frequency due to influence of parasitic capacitance, and all of the plurality of line patterns ranging from 0 μm to 10 μm have the same current value and high frequency values due to reduced parasitic capacitance.

Referring to FIGS. 9A to 9C and Table 1, it can be confirmed that drain current characteristics of the oxide thin-film transistors, when the spacings between the plurality of line patterns thereof are 10 μm or less, are similar to that of a standard oxide semiconductor thin-film transistor (STD), but a drain current characteristic is relatively decreased, compared to a standard oxide semiconductor thin-film transistor, when the spacing between the plurality of line patterns is 12 μm.

In addition, it can be confirmed that a capacitance of the oxide semiconductor thin-film transistor according to an embodiment of the present invention, when the spacing between the plurality of line patterns thereof is 10 μm, is 0.18 pF, which is about 60% lower, compared to 0.45 pF of a standard oxide semiconductor thin-film transistor (STD).

Referring to FIGS. 9D and 9E, actual current flow is indicated with arrows. It can be confirmed that the width of a source/drain electrode pattern of a standard oxide semiconductor thin-film transistor (STD) is much wider than the width of the plurality of line patterns of the oxide semiconductor thin-film transistor according to an embodiment of the present invention.

Accordingly, referring to FIGS. 9A to 9D, it can be confirmed that, even though the width of the source/drain electrode pattern of the standard oxide semiconductor thin-film transistor (STD) is more than 3 times the width of the source/drain electrode pattern of the oxide semiconductor thin-film transistor according to an embodiment of the present invention, the standard oxide semiconductor thin-film transistor (STD) and the oxide semiconductor thin-film transistor according to an embodiment of the present invention exhibit almost similar drain current characteristics (drain current is not decreased), and the oxide semiconductor thin-film transistor according to an embodiment of the present invention exhibits reduced parasitic capacitance compared to the standard oxide semiconductor thin-film transistor (STD).

Figure 10A:
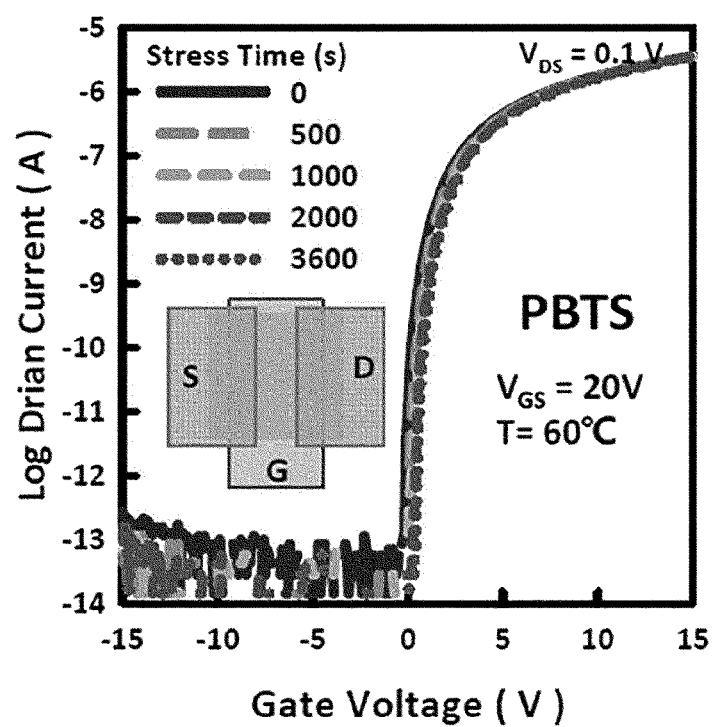
FIG. 10A illustrates positive bias temperature stress (PBTS) of an oxide semiconductor thin-film transistor with a general structure other than a plurality of island patterns.
Figure 10B:
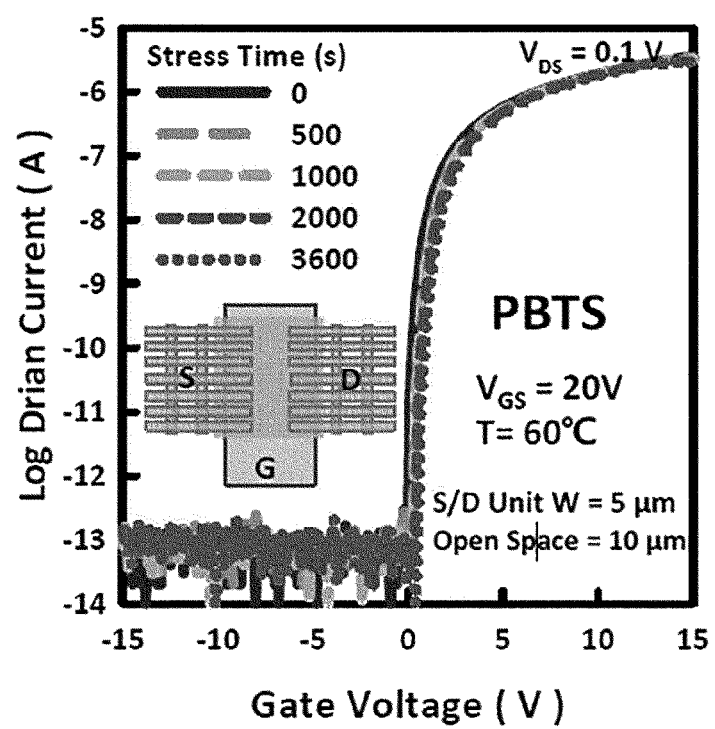
FIG. 10B illustrates positive bias temperature stress (PBTS) of an oxide semiconductor thin-film transistor according to an embodiment of the present invention.

FIG. 10A illustrates positive bias temperature stress (PBTS) of an oxide semiconductor thin-film transistor with a general structure other than a plurality of island patterns, and FIG. 10B illustrates positive bias temperature stress (PBTS) of an oxide semiconductor thin-film transistor according to an embodiment of the present invention.

Figure 10C:
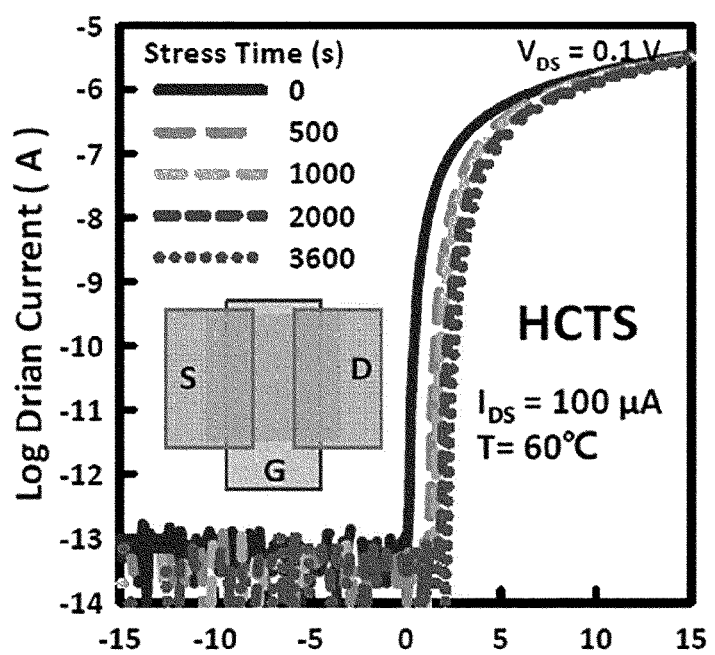
FIG. 10C illustrates high current temperature stress (HCTS) of an oxide semiconductor thin-film transistor with a general structure other than a plurality of island patterns.
Figure 10D:
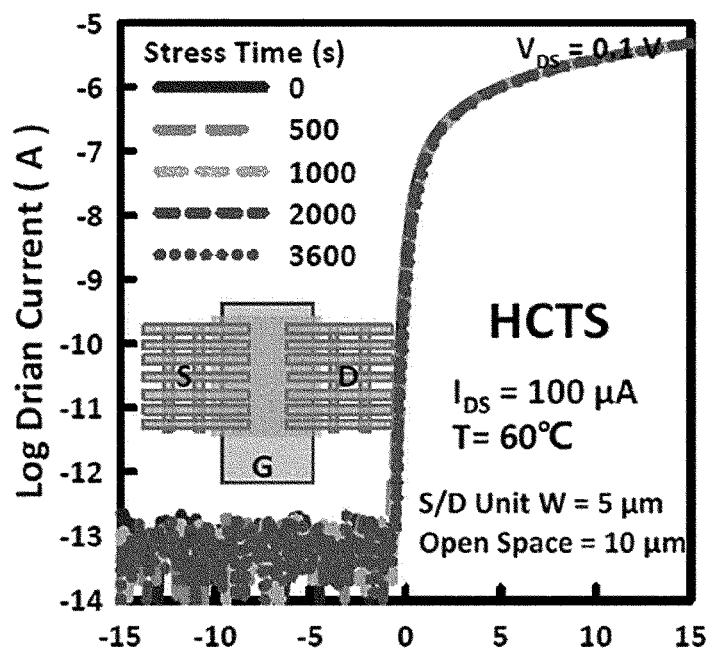
FIG. 10D illustrates high current temperature stress (HCTS) of an oxide semiconductor thin-film transistor according to an embodiment of the present invention.

FIG. 10C illustrates high current temperature stress (HCTS) of an oxide semiconductor thin-film transistor with a general structure other than a plurality of island patterns, and FIG. 10D illustrates high current temperature stress (HCTS) of an oxide semiconductor thin-film transistor according to an embodiment of the present invention.

FIGS. 10B and 10D illustrate oxide semiconductor thin-film transistors according to an embodiment of the present invention wherein a spacing between a plurality of line patterns is 10 µm and the widths of a plurality of line patterns are 5 µm.

Referring to FIGS. 10A to 10D, all of an oxide semiconductor thin-film transistor with a general structure, other than a plurality of island patterns, and the oxide semiconductor thin-film transistors according to an embodiment of the present invention exhibit increased threshold voltage whenever a PBTS stress time increases. PBTS is caused by electron trapping at an interface between an oxide semiconductor layer and a gate insulating film.

It can be confirmed that the oxide semiconductor thin-film transistors according to an embodiment of the present invention exhibit no change in a transfer curve due to much smaller areas of source/drain electrodes, compared to the oxide semiconductor thin-film transistor with a general structure, other than a plurality of island patterns, and more heat is left in the oxide semiconductor thin-film transistor with a general structure, other than a plurality of island patterns, compared to the oxide semiconductor thin-film transistors according to an embodiment of the present invention.

Accordingly, it can be confirmed that reduction in the area of source/drain electrodes causes exhibition of excellent heat dissipation performance.

Figure 11A:
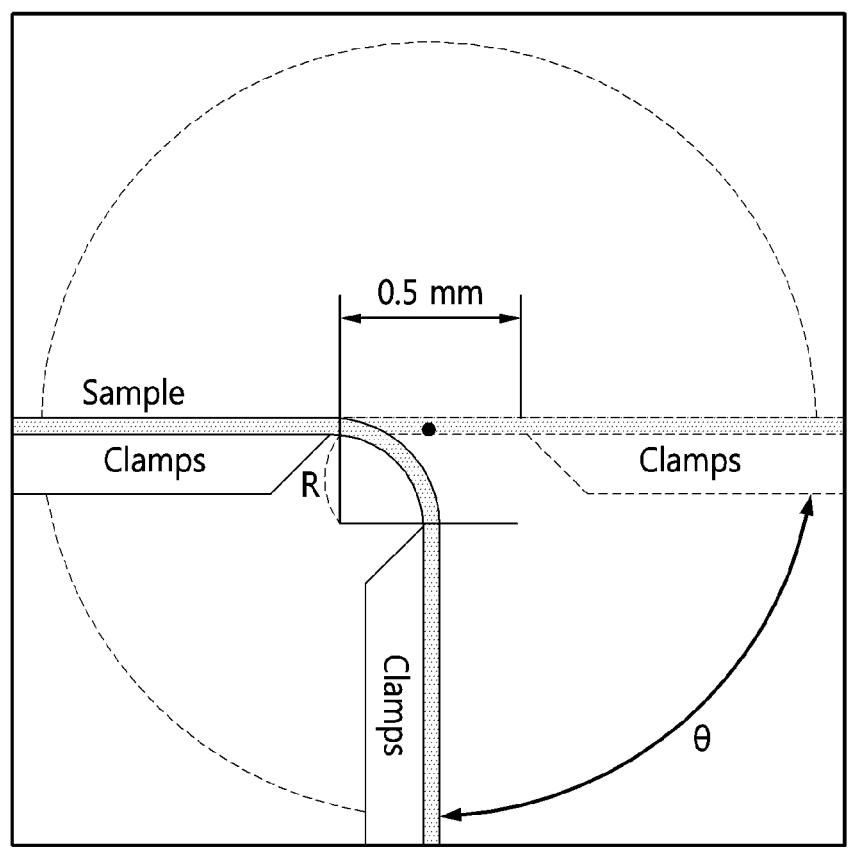
FIGS. 11A to 11C illustrate a tester for testing bending and reliability of a flexible display apparatus to which an oxide semiconductor thin-film transistor according to an embodiment of the present invention is applied.
Figure 11B:
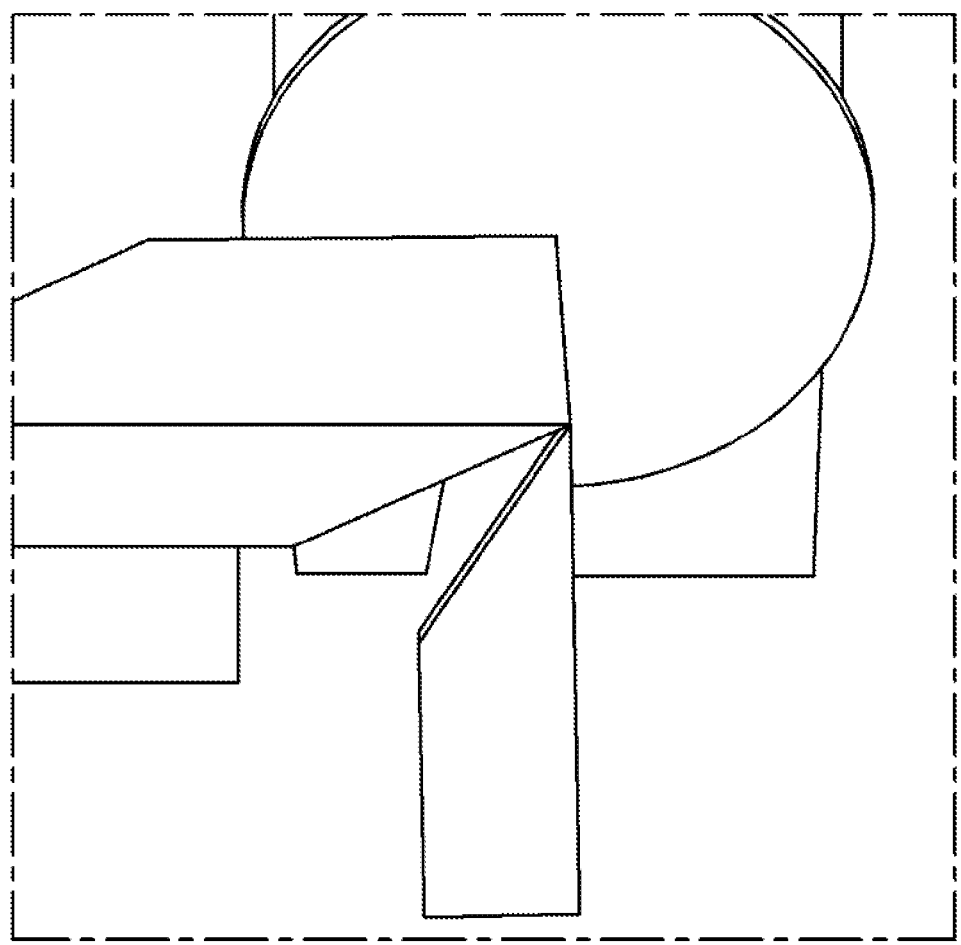
Figure 11C:
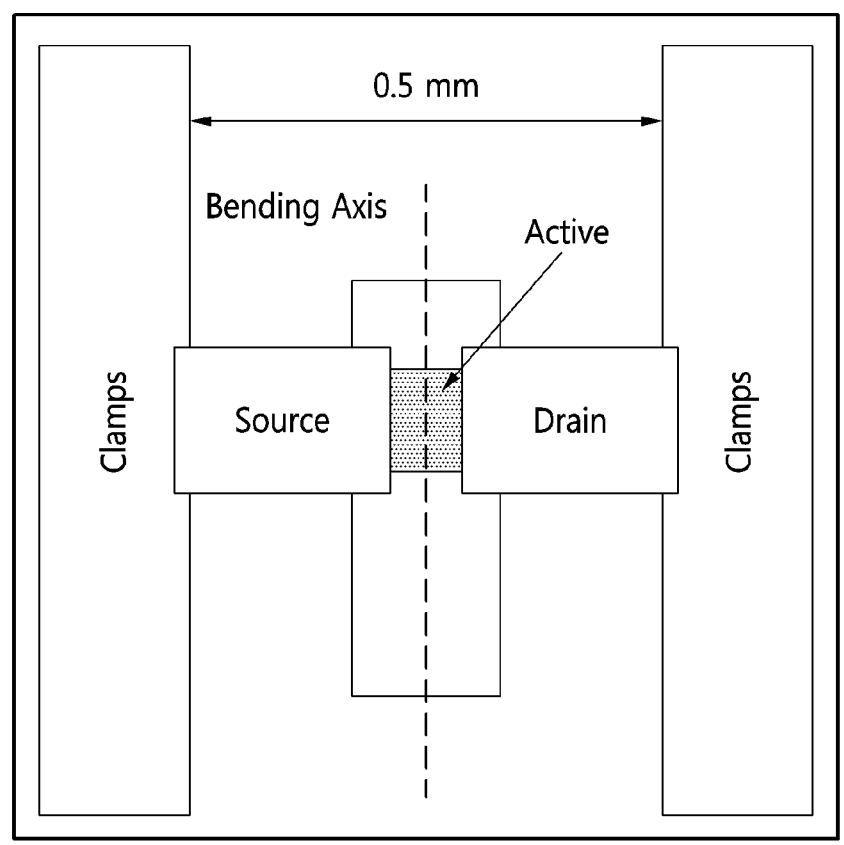

FIGS. 11A to 11C illustrate a tester for testing bending and reliability of a flexible display apparatus to which an oxide semiconductor thin-film transistor according to an embodiment of the present invention is applied.

Specifically, FIG. 11A illustrates a sectional view of a bending tester (reliability tester), FIG. 11b illustrates a photograph of the bending tester, and FIG. 11C illustrates a top view of the bending tester (reliability tester).

A bending angle (θ) of a bending tester used according to an embodiment of the present invention may be varied from 0° to ±90°, and a flexible display apparatus including an oxide semiconductor thin-film transistor is disposed between two clamps, followed by performing a reliability test against bending stress.

Figure 11D:
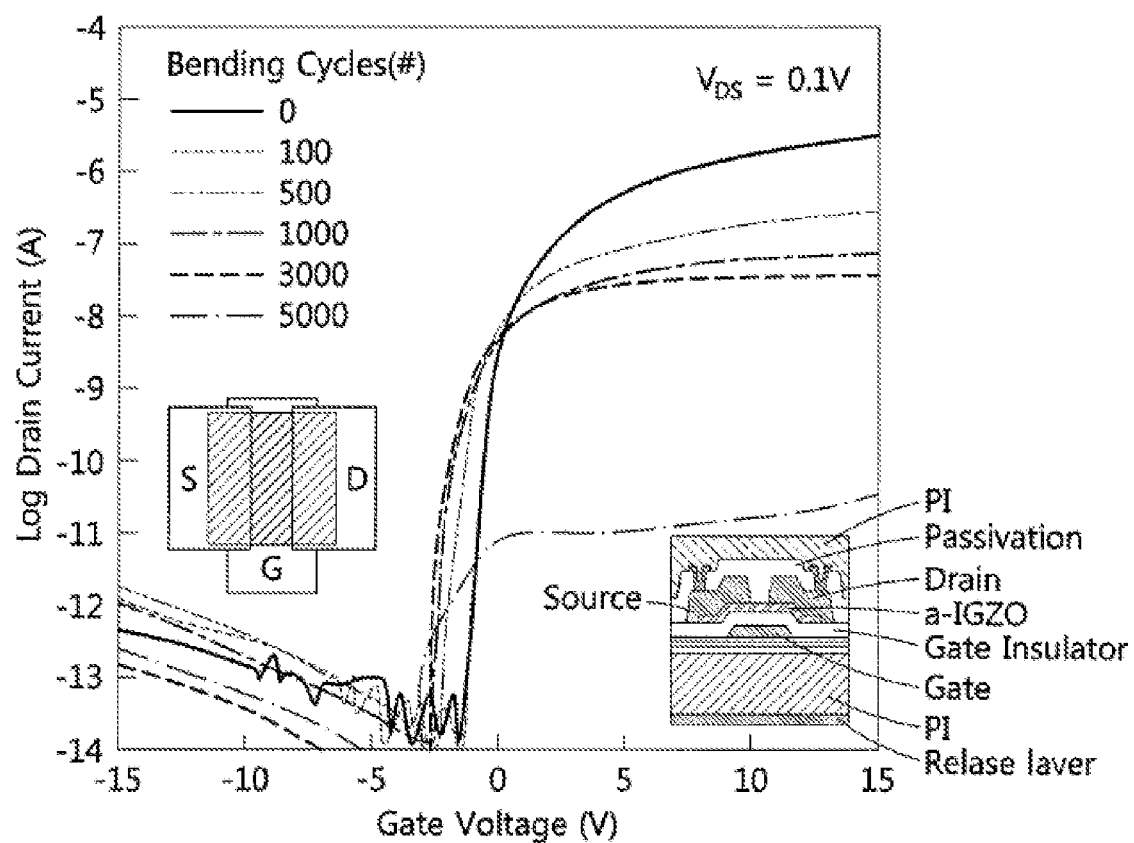
FIG. 11D illustrates drain current-gate voltage characteristics measured after testing the bending of a flexible display apparatus including an oxide semiconductor thin-film transistor with a general structure other than a plurality of island patterns.
Figure 11E:
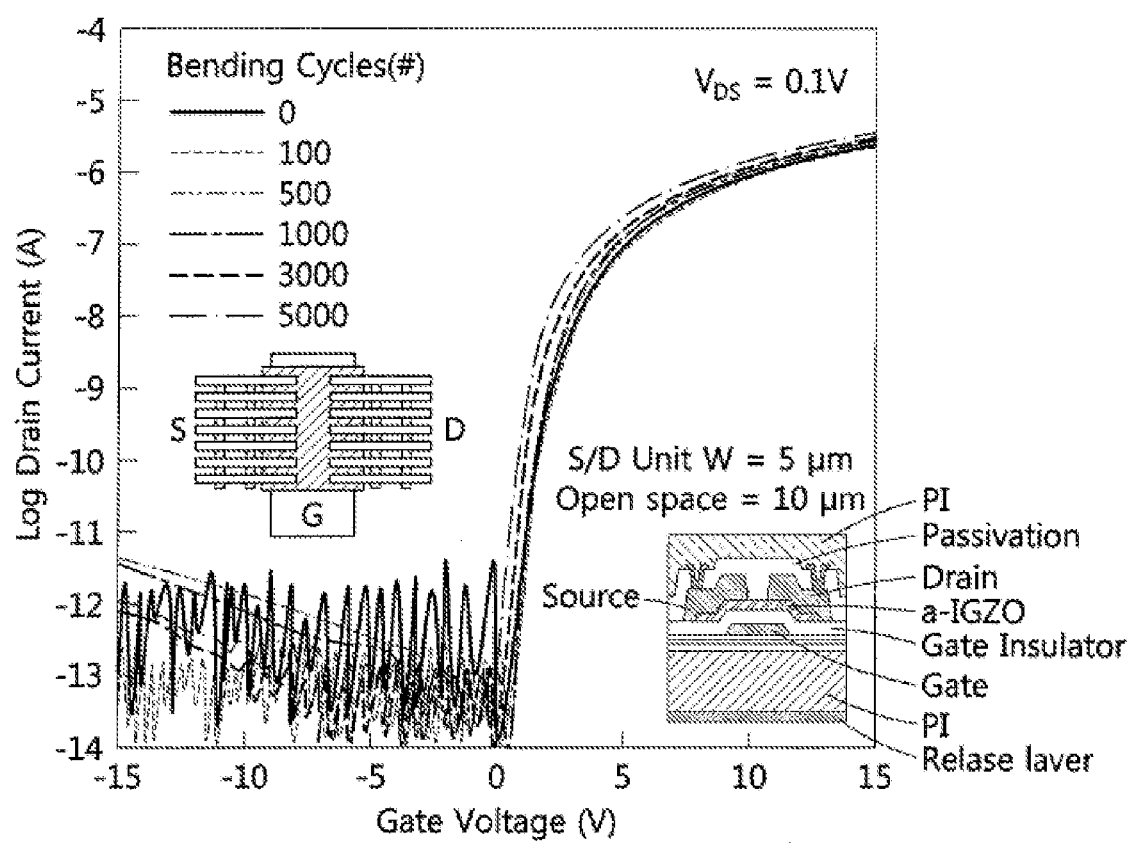
FIG. 11E illustrates drain current-gate voltage characteristics measured after testing the bending of a flexible display apparatus including an oxide semiconductor thin-film transistor according to an embodiment of the present invention.

FIG. 11D illustrates drain current-gate voltage characteristics measured after testing the bending of a flexible display apparatus including an oxide semiconductor thin-film transistor with a general structure other than a plurality of island patterns, and FIG. 11E illustrates drain current-gate voltage characteristics measured after testing the bending of a flexible display apparatus including an oxide semiconductor thin-film transistor according to an embodiment of the present invention.

Here, during the bending test, a bending time (s) (the number of bending) was varied to 0, 100, 500, 1,000, 2000, 3000 and 5,000, and a bending radius was fixed to 0.32 mm such that a bending angle was 90°.

Referring to FIG. 11D, it was confirmed that, in the case of an oxide semiconductor thin-film transistor with a general structure, other than a plurality of island patterns, current-voltage characteristics were changed according to the number of bending (bending time) at a bending angle of 90°, and a contact resistance increased due to crack generation in the metal electrode so that the characteristics of the oxide semiconductor thin-film transistor are decreased.

Referring to FIG. 11E, it was confirmed that when the source/drain electrodes have a plurality of island patterns, crack generation was minimized even under stress due to strong strain, and thus excellent current-voltage characteristics were exhibited.

Figure 11F:
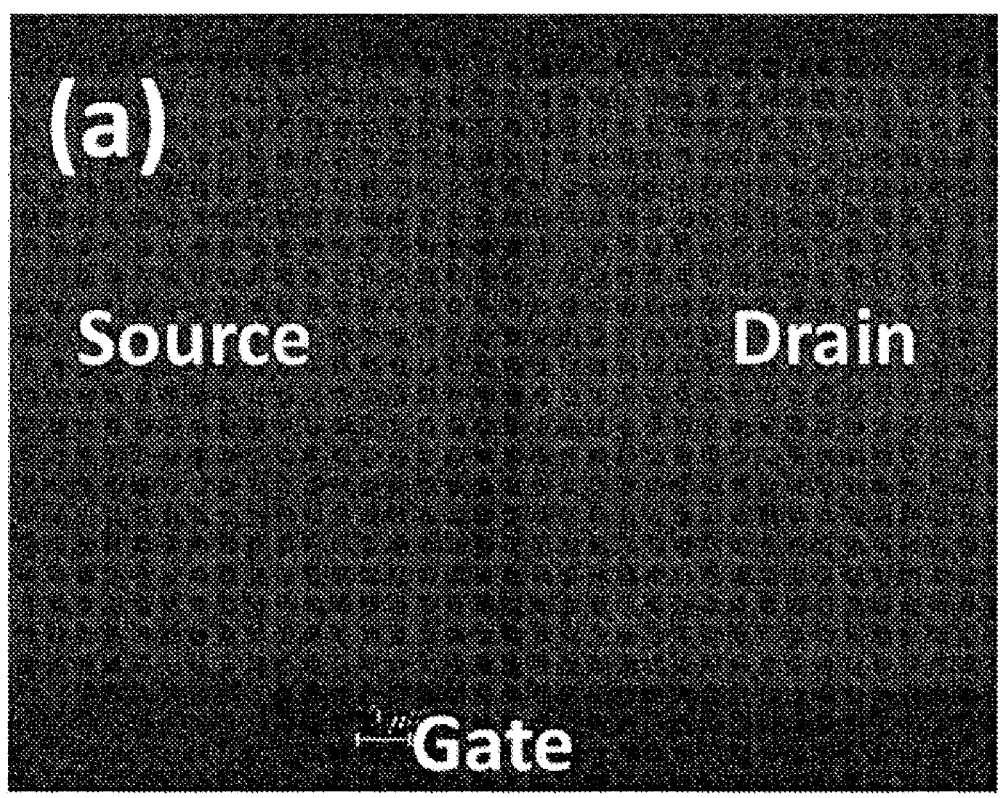
FIG. 11F illustrates an optical microscope image of an oxide semiconductor thin-film transistor with a general structure, other than a plurality of island patterns, which has been subjected to a bending test.
Figure 11G:
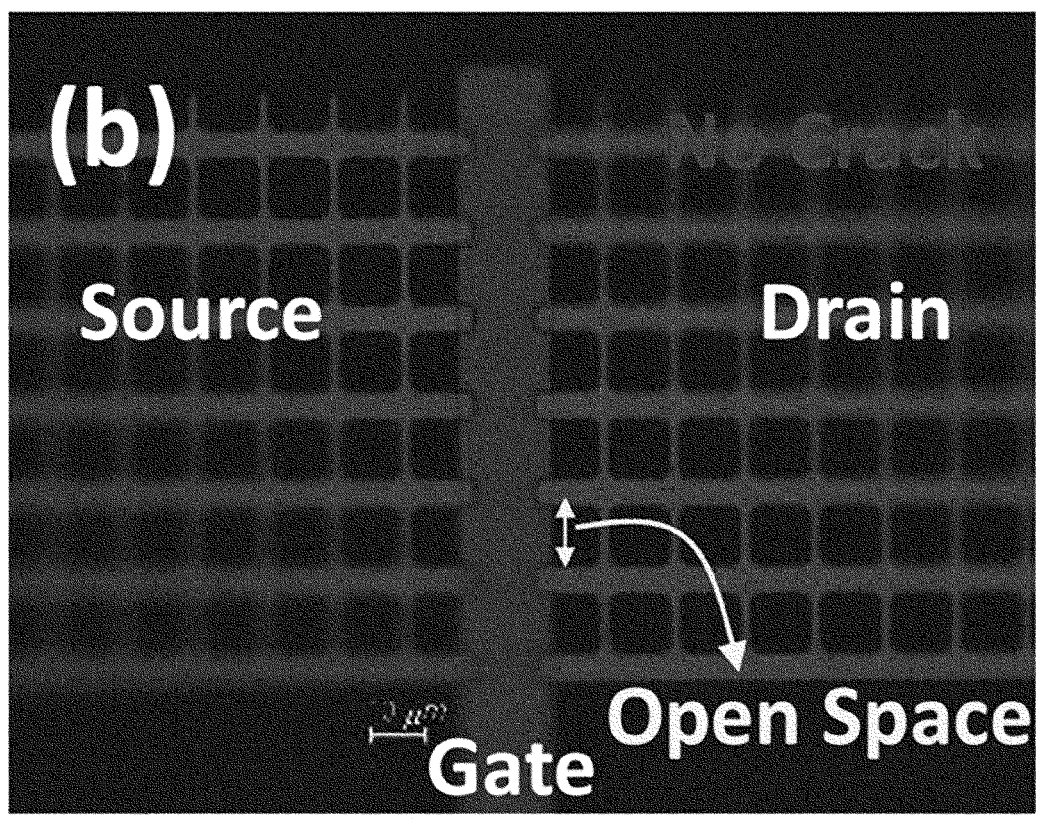
FIG. 11G illustrates an optical microscope image of an oxide semiconductor thin-film transistor according to an embodiment of the present invention which has been subjected to a bending test.
Figure 12A:
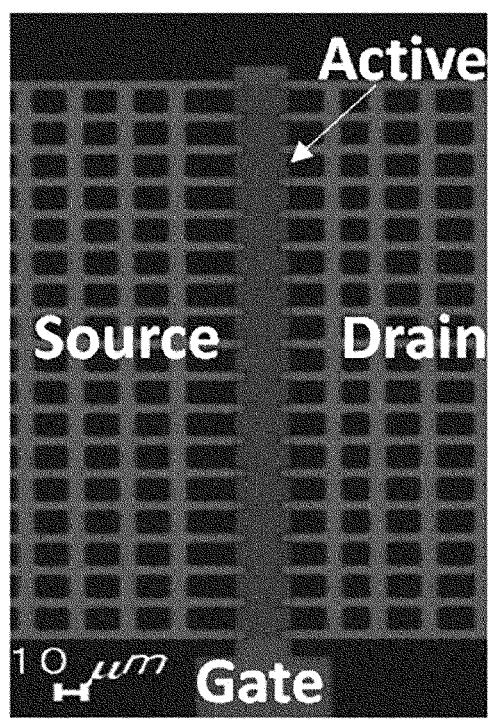
FIGS. 12A to 12D illustrate optical microscope images of source/drain electrodes, which are formed to have a plurality of island patterns and a separated first area, of an oxide semiconductor thin-film transistor according to an embodiment of the present invention and an oxide semiconductor layer thereof.
Figure 12B:
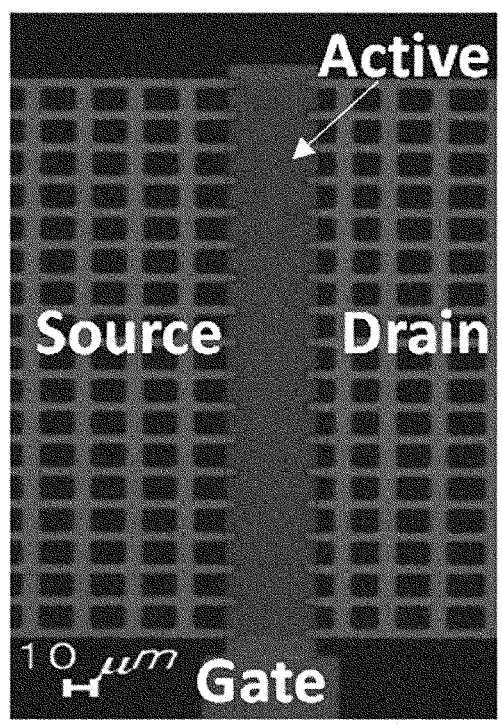
Figure 12C:
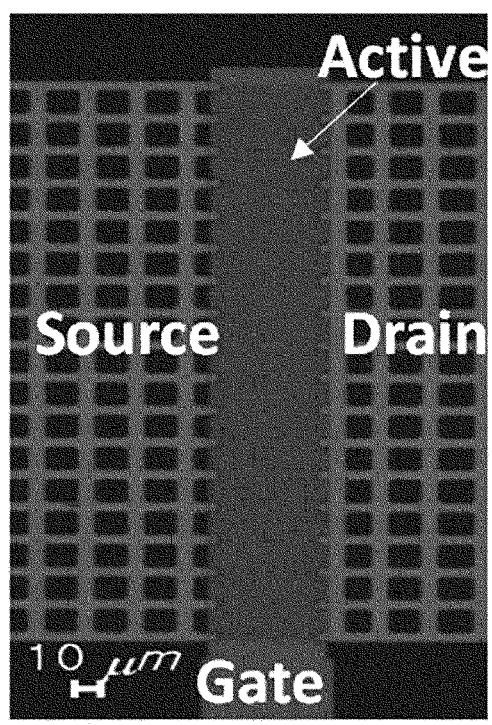
Figure 12D:
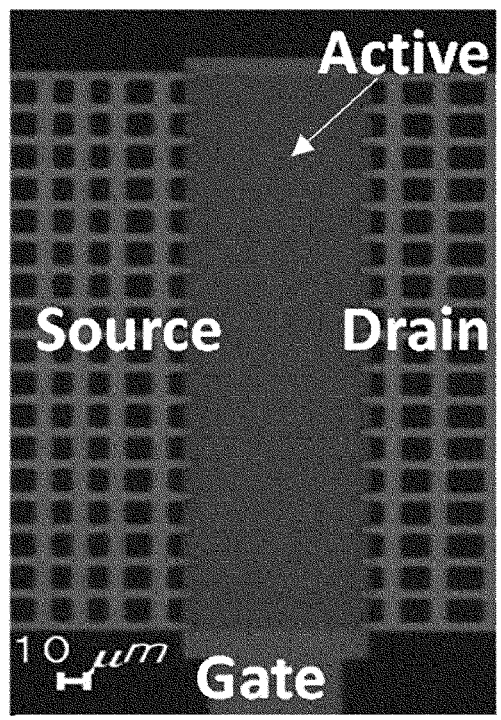

FIG. 11F illustrates an optical microscope image of an oxide semiconductor thin-film transistor with a general structure, other than a plurality of island patterns, which has been subjected to a bending test, and FIG. 11G illustrates an optical microscope image of an oxide semiconductor thin-film transistor according to an embodiment of the present invention which has been subjected to a bending test.

Referring to FIGS. 11F and 11G, it was confirmed that, in the case of the oxide semiconductor thin-film transistor with a general structure, other than a plurality of island patterns, cracks were generated in the source/drain electrodes after being subjected to a bending test, whereas, in the case of the oxide semiconductor thin-film transistor according to an embodiment of the present invention that included a plurality of island patterns formed such that first areas are separated from each other, cracks were not generated in the source/drain electrodes, even after being subjected to the bending test, due to the source/drain electrodes formed in the shape of the plurality of island patterns wherein the first areas were separated from each other.

FIGS. 12A to 12D illustrate optical microscope images of source/drain electrodes, which are formed to have a plurality of island patterns and a separated first area, of an oxide semiconductor thin-film transistor according to an embodiment of the present invention and an oxide semiconductor layer thereof.

Referring to FIGS. 12A to 12D, it can be confirmed that the source electrodes S and the drain electrodes D of the oxide semiconductor thin-film transistors according to an embodiment of the present invention are formed in the shape of a plurality of island patterns having a lattice shape wherein first areas are separated from each other.

In addition, referring to FIGS. 12A to 12D, it can be confirmed that, in the case of the oxide semiconductor thin-film transistors according to an embodiment of the present invention, oxide semiconductor layers having various widths (channel lengths) are satisfactorily formed.

FIGS. 13A to 13H illustrate transfer and output characteristics of an oxide semiconductor thin-film transistor according to an embodiment of the present invention dependent upon a channel length.

Figure 13A:
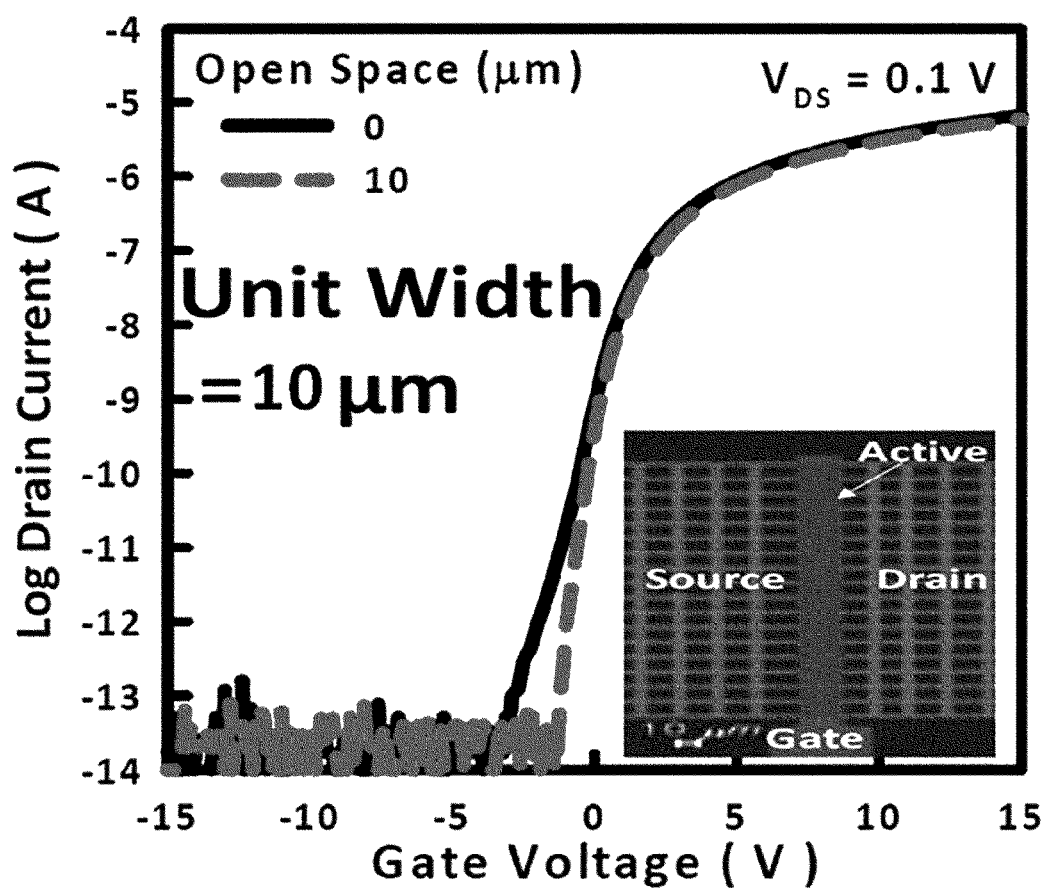
FIGS. 13A to 13H illustrate transfer and output characteristics of an oxide semiconductor thin-film transistor according to an embodiment of the present invention dependent upon a channel length.
Figure 13B:
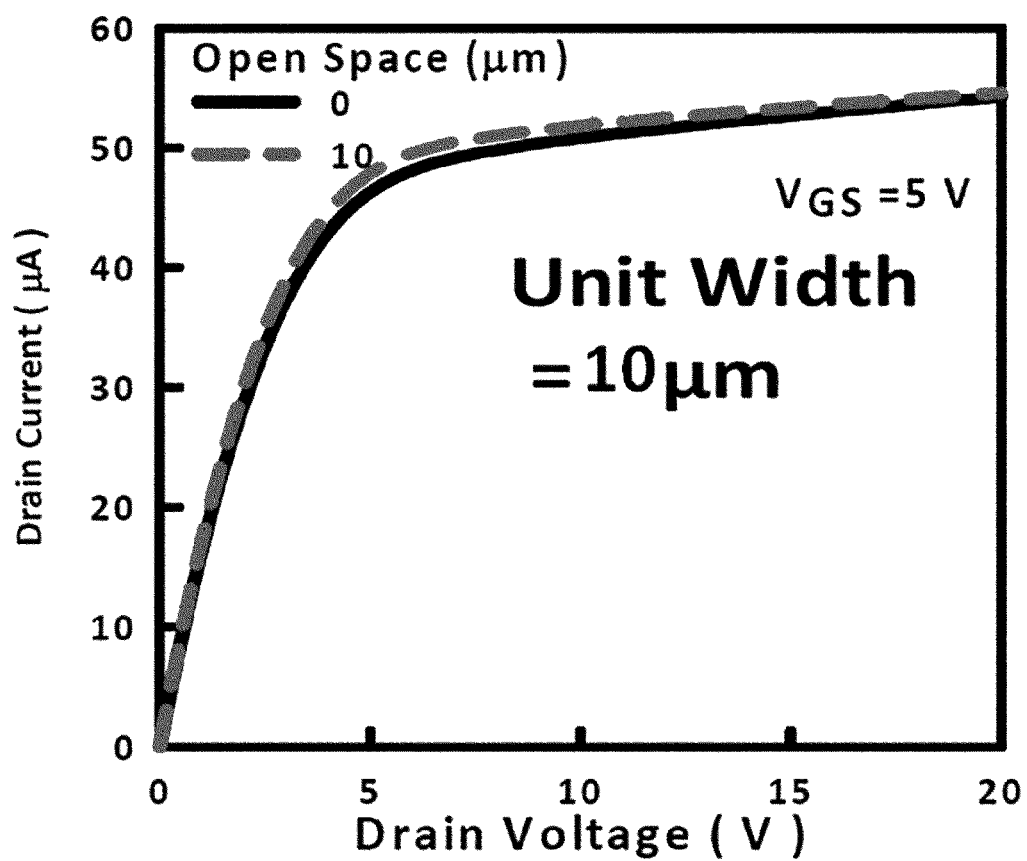
Figure 13C:
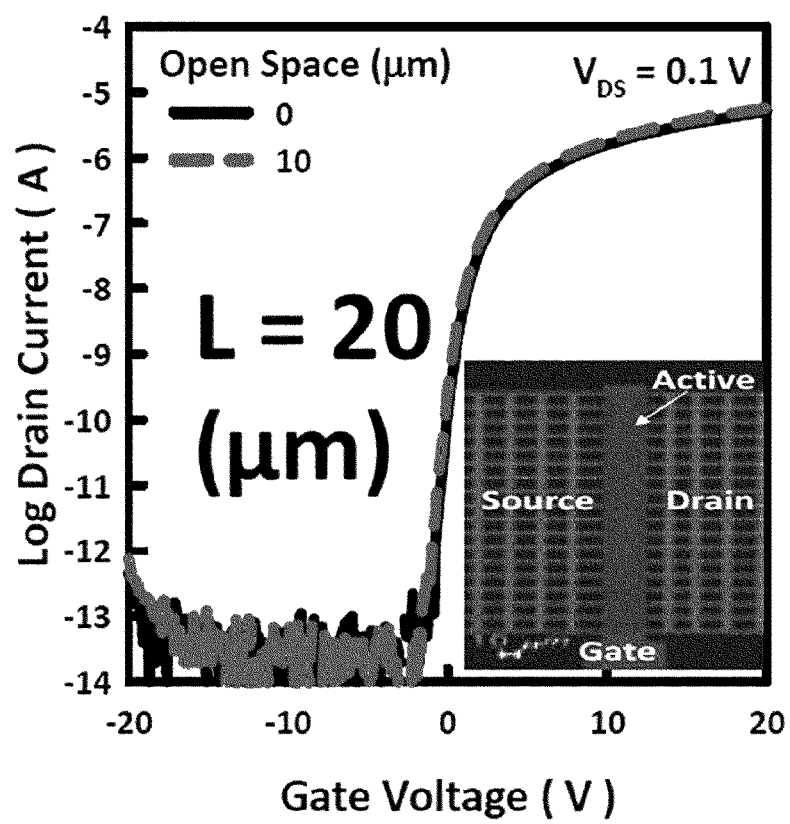
Figure 13D:
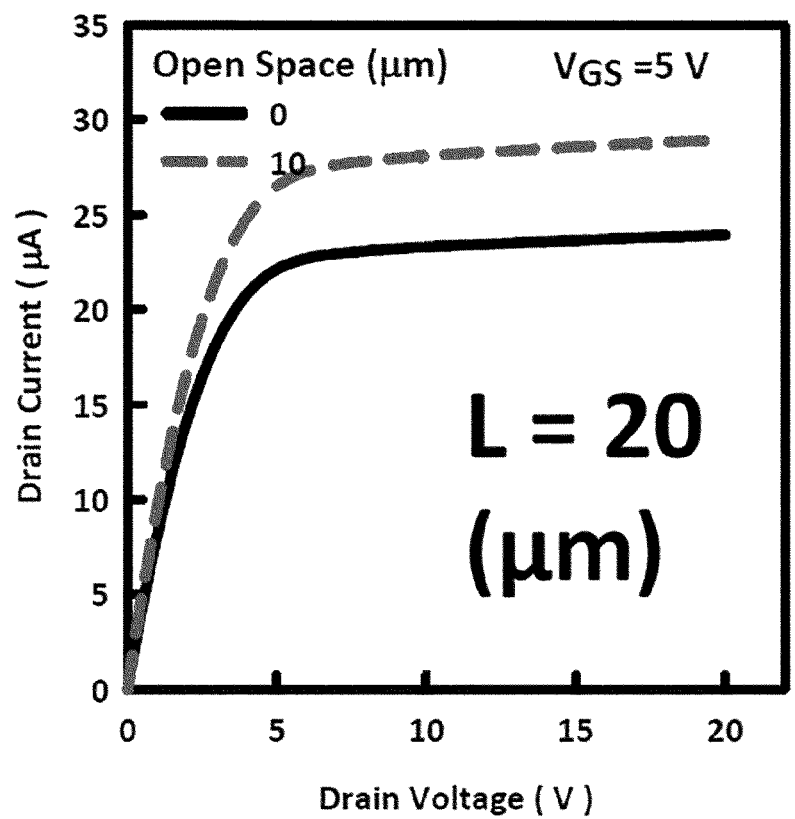

FIGS. 13A and 13B illustrate transfer and output characteristics of an oxide semiconductor thin-film transistor according to an embodiment of the present invention having a channel length of 10 µm, and FIGS. 13C and 13D illustrate transfer and output characteristics of an oxide semiconductor thin-film transistor according to an embodiment of the present invention having a channel length of 20 µm.

Figure 13E:
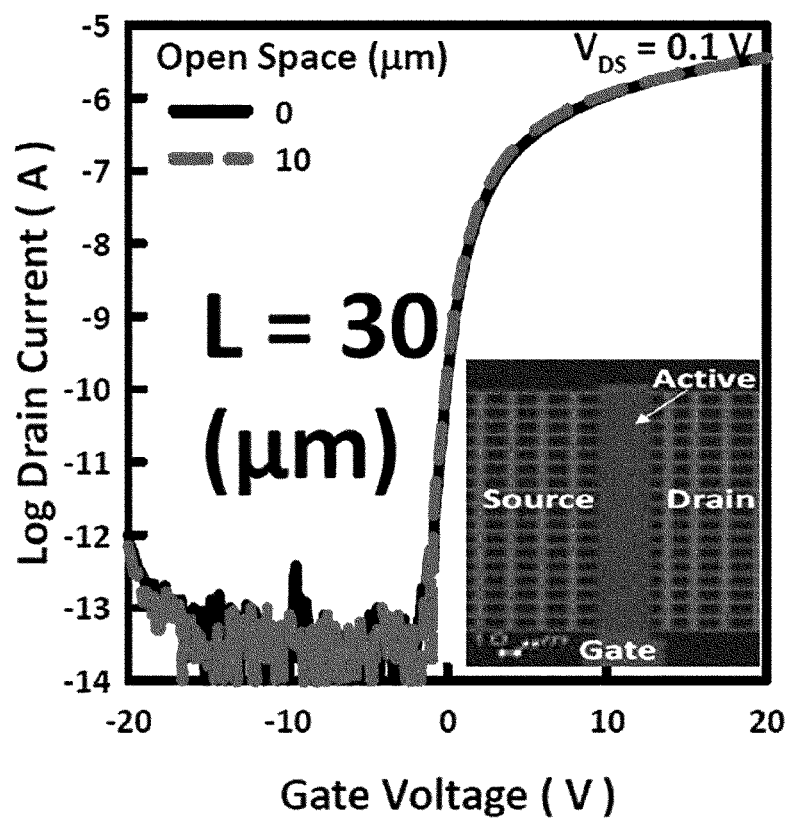
Figure 13F:
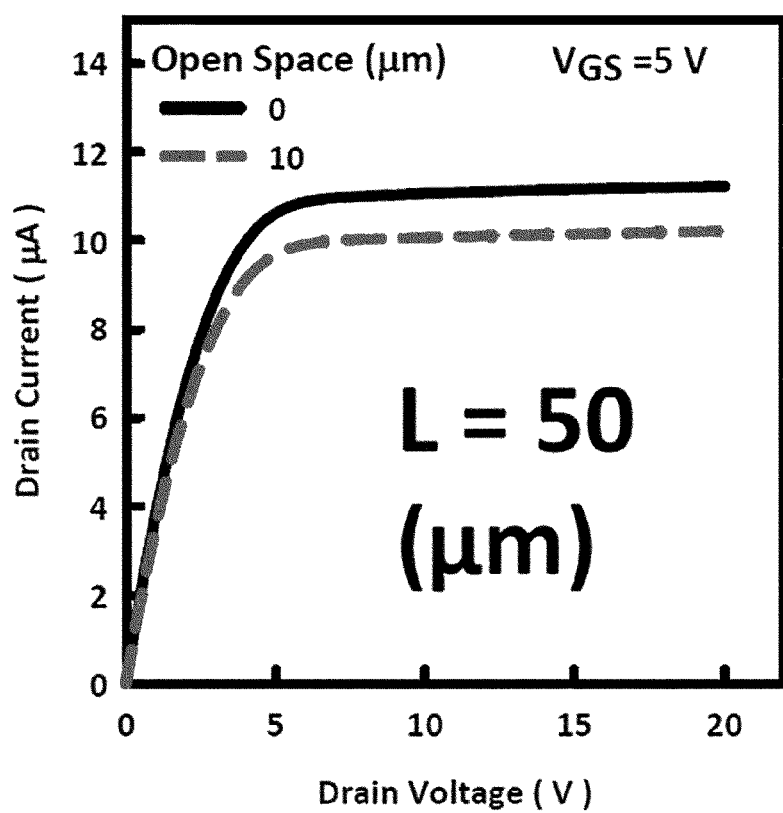
Figure 13G:
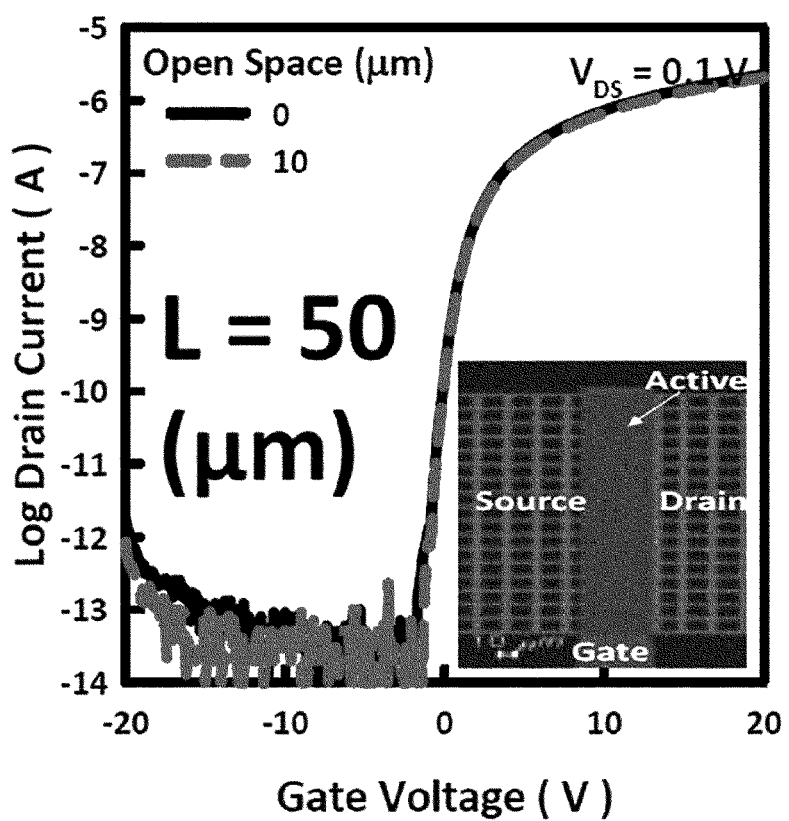
Figure 13H:
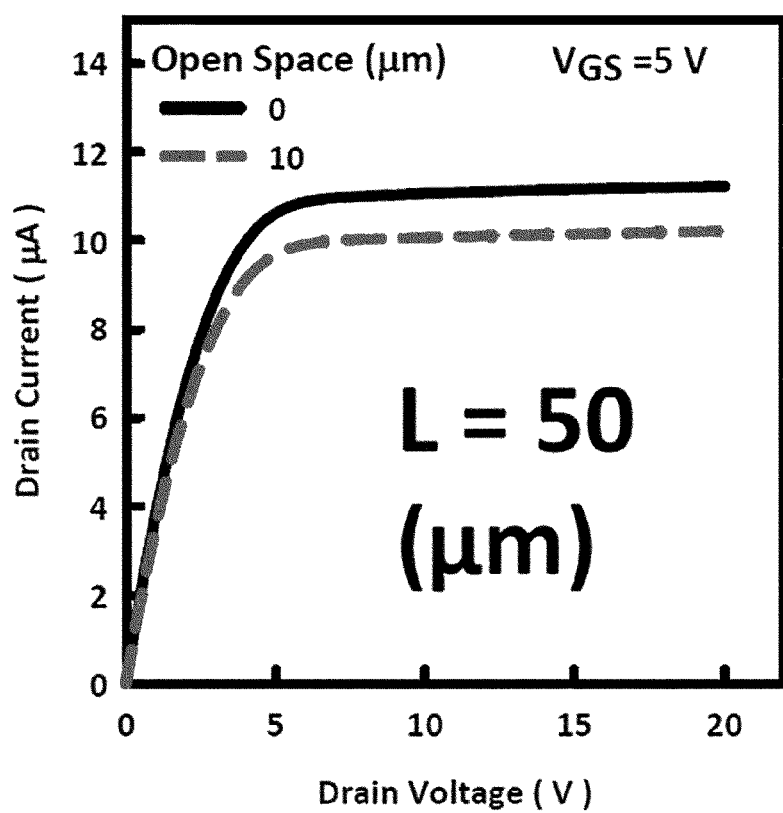

FIGS. 13E and 13F illustrate transfer and output characteristics of an oxide semiconductor thin-film transistor according to an embodiment of the present invention having a channel length of 30 µm, and FIGS. 13G and 13H illustrate transfer and output characteristics of an oxide semiconductor thin-film transistor according to an embodiment of the present invention having a channel length of 50 µm.

In FIGS. 13A to 13H, the widths of a plurality of line patterns are 5 µm, and a spacing between the plurality of line patterns is 10 µm.

FIGS. 13A to 13H illustrate characteristics dependent upon a channel length. It can be confirmed that the oxide semiconductor thin-film transistors having channel lengths of up to 50 µm exhibit stable characteristics.

Accordingly, referring to FIGS. 13A to 13H, it can be confirmed that the oxide semiconductor thin-film transistors according to an embodiment of the present invention reduce parasitic capacitance without reducing drain current.

Figure 14A:
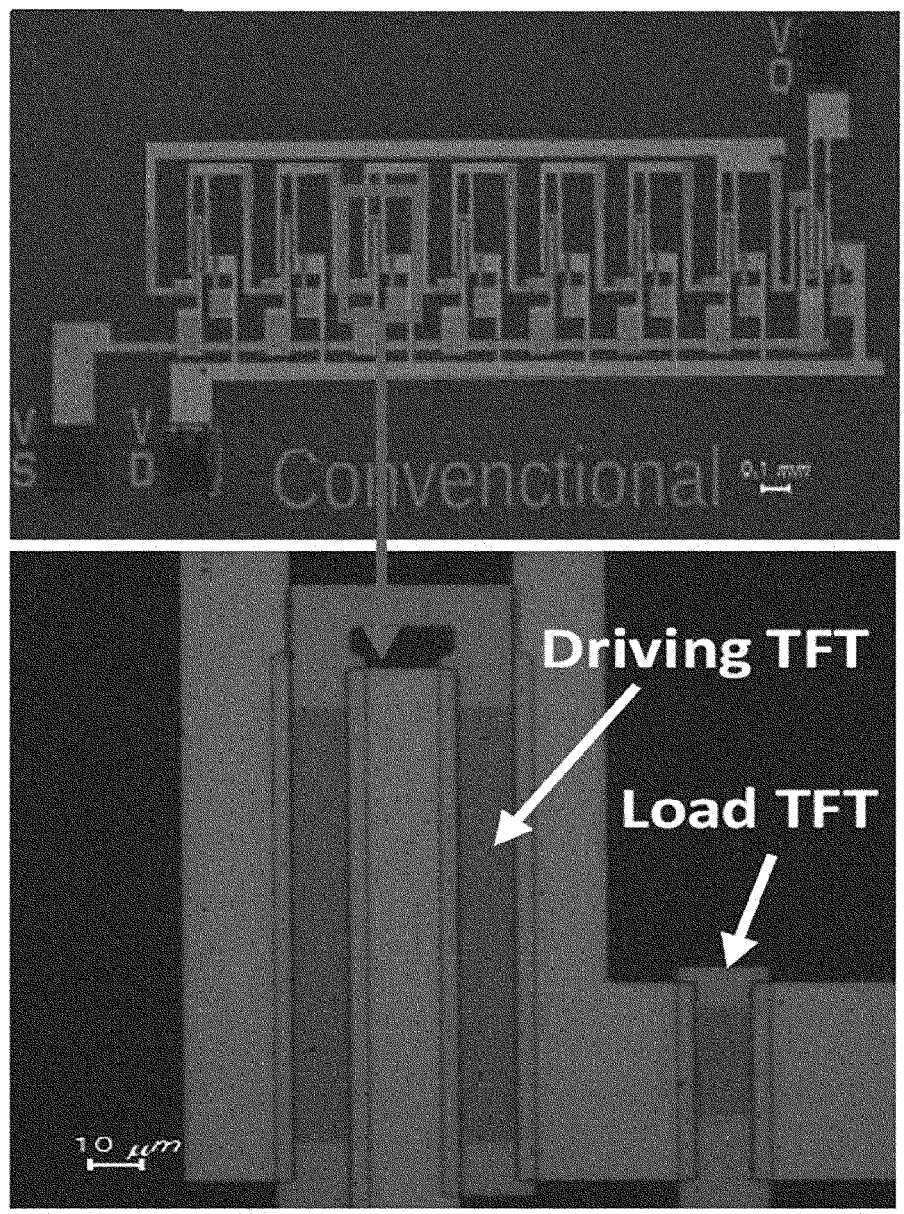
FIG. 14A illustrates an optical microscope image of an oxide semiconductor thin-film transistor with a general structure, other than a plurality of island patterns, used in a ring oscillator.
Figure 14B:
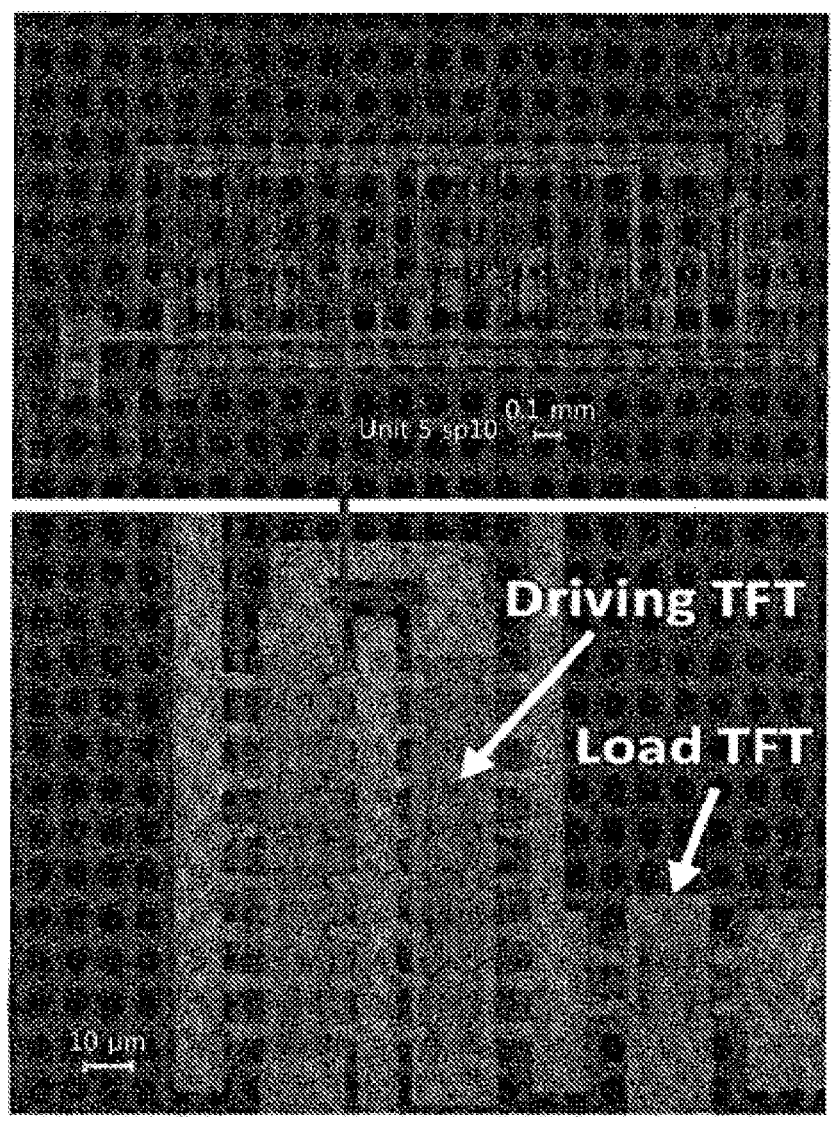
FIG. 14B illustrates an optical microscope image of an oxide semiconductor transistor according to an embodiment of the present invention used in a ring oscillator.

FIG. 14A illustrates an optical microscope image of an oxide semiconductor thin-film transistor with a general structure, other than a plurality of island patterns, used in a ring oscillator, and FIG. 14B illustrates an optical microscope image of an oxide semiconductor transistor according to an embodiment of the present invention used in a ring oscillator.

Referring to FIG. 14B, it can be confirmed that source/drain electrodes of the oxide semiconductor transistor according to an embodiment of the present invention are formed in the shape of a plurality of island patterns, first areas of which are separated from each other.

Figure 15A:
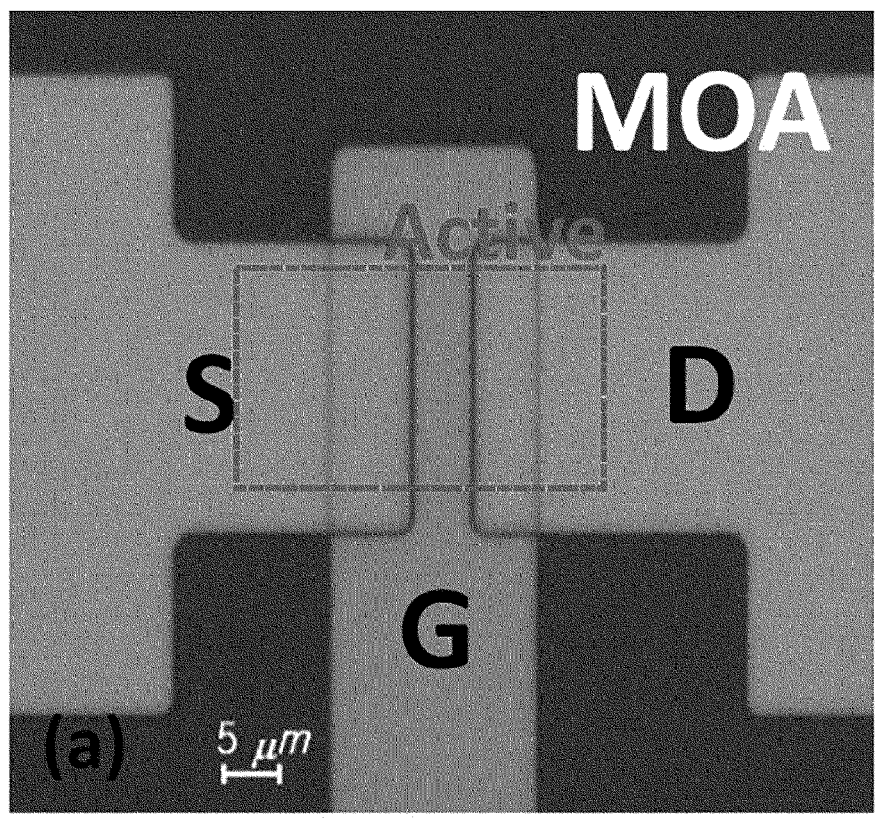
FIGS. 15A and 15B are optical microscope images illustrating a thermal analysis result of a metal-over-active (MOA) structure of an oxide semiconductor transistor according to an embodiment of the present invention.
Figure 15B:
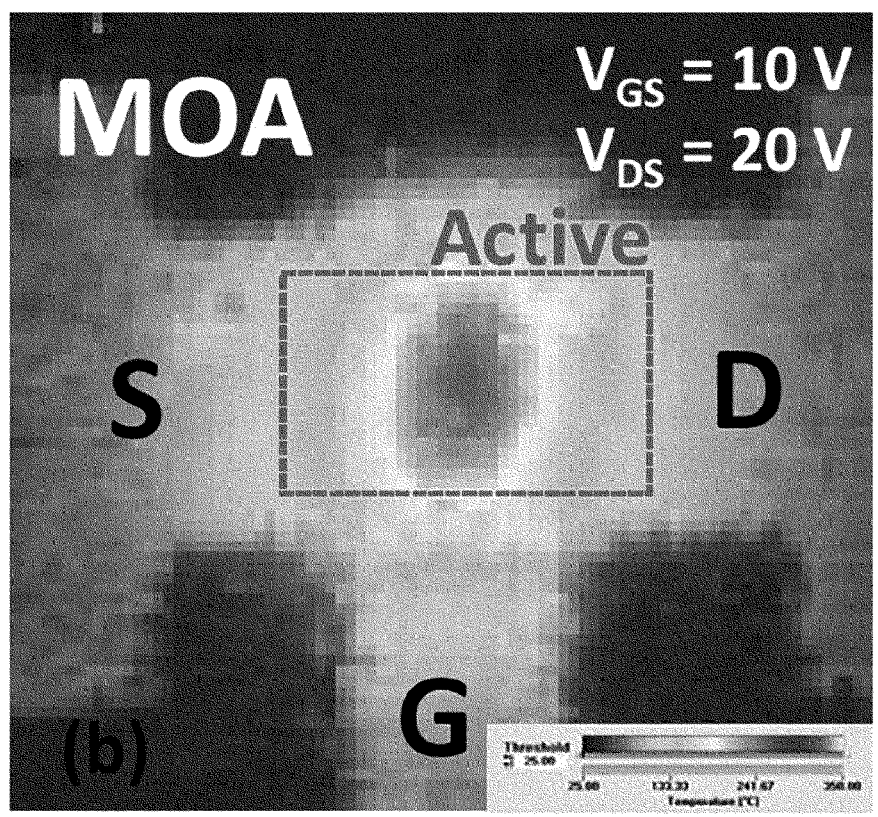
Figure 15C:
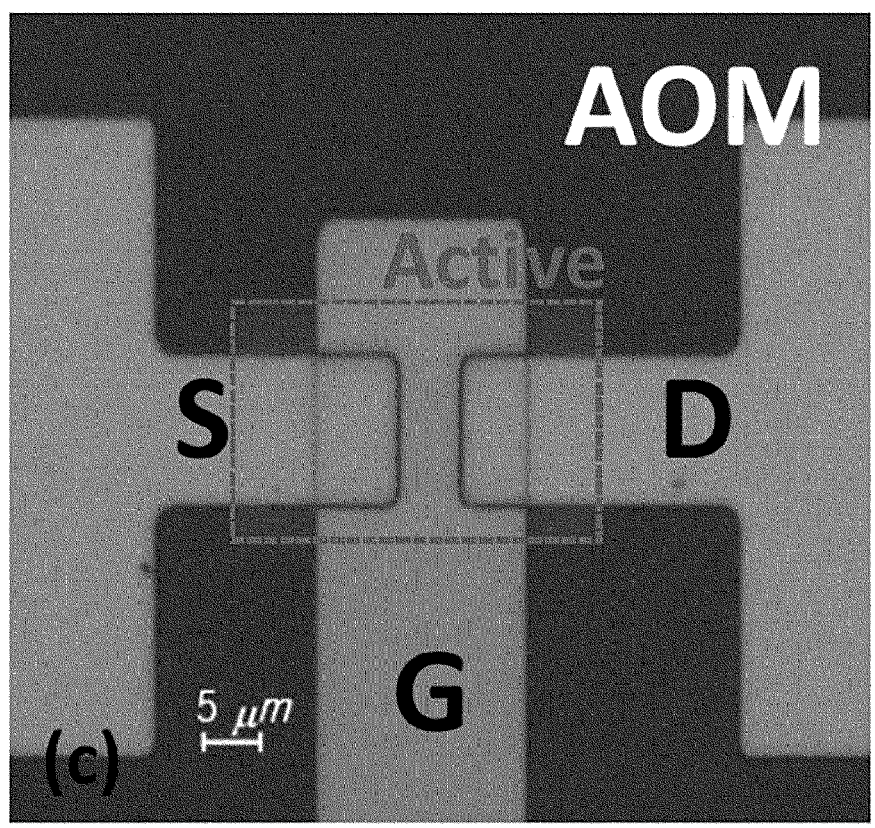
FIGS. 15C and 15D are optical microscope images illustrating a thermal analysis result of an active-over-metal (AOM) structure of an oxide semiconductor transistor according to an embodiment of the present invention.
Figure 15D:
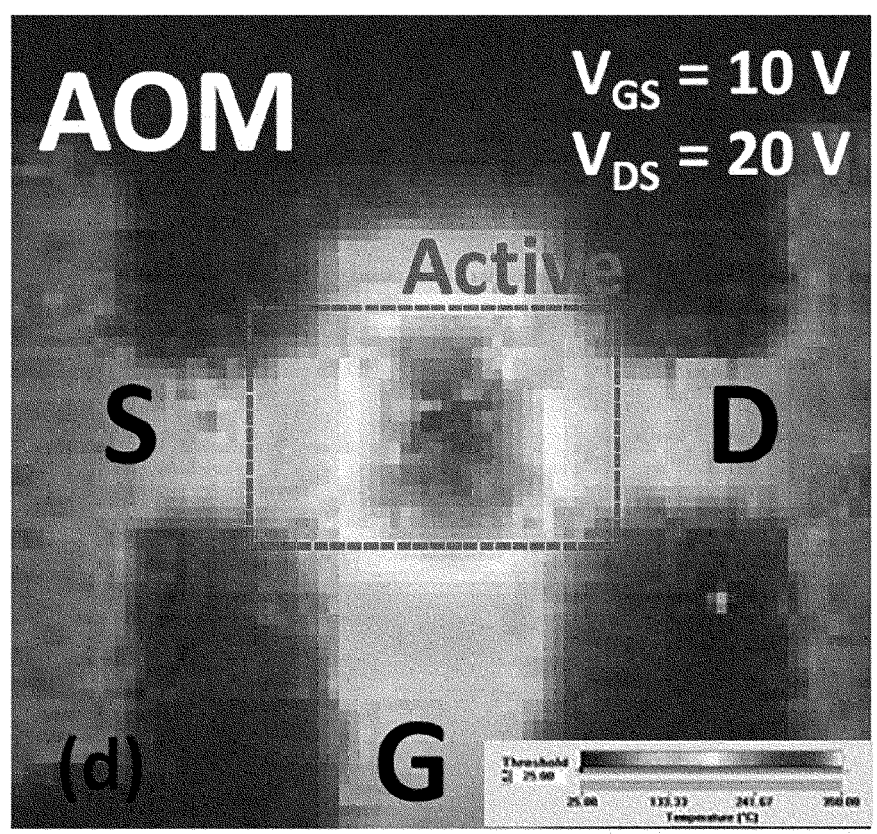

FIGS. 15A and 15B are optical microscope images illustrating a thermal analysis result of a metal-over-active (MOA) structure of an oxide semiconductor transistor according to an embodiment of the present invention, and FIGS. 15C and 15D are optical microscope images illustrating a thermal analysis result of an active-over-metal (AOM) structure of an oxide semiconductor transistor according to an embodiment of the present invention.

FIG. 15A illustrates an optical image of a structure wherein the area of source/drain electrodes is larger than the area of an oxide semiconductor layer, FIG. 15B illustrates a thermal image when VGS of 10 V and VDS of 20 V were applied, FIG. 15C illustrates an optical image of a structure wherein the area of source/drain electrodes is smaller than the area of an oxide semiconductor layer, and FIG. 15B illustrates a thermal image when VGS of 10 V and VDS of 20 V were applied.

In FIGS. 15A to 15D, channel lengths are 5 µm and total widths of oxide semiconductor layers are 20 µm.

Referring to FIGS. 15A to 15D, it can be confirmed that, when the oxide semiconductor transistor turns on, heat dissipates and current spreads in a width direction of channels of an oxide semiconductor layer between a source electrode and a drain electrode.

FIGS. 16A to 16F illustrate voltage-time characteristics, which are dependent upon a spacing between a plurality of island patterns, of a ring oscillator including an oxide semiconductor transistor according to an embodiment of the present invention.

Figure 16A:
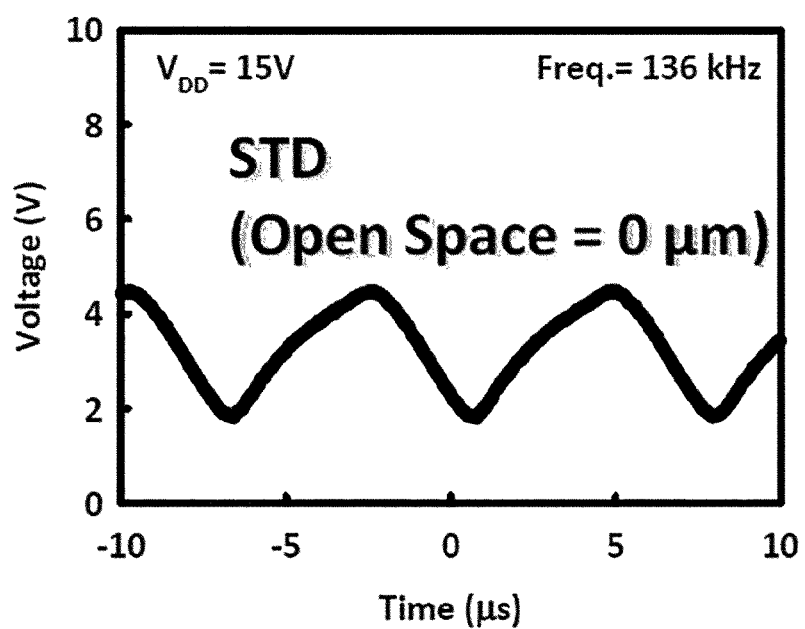
FIGS. 16A to 16F illustrate voltage-time characteristics, which are dependent upon a spacing between a plurality of island patterns, of a ring oscillator including an oxide semiconductor transistor according to an embodiment of the present invention.
Figure 16B:
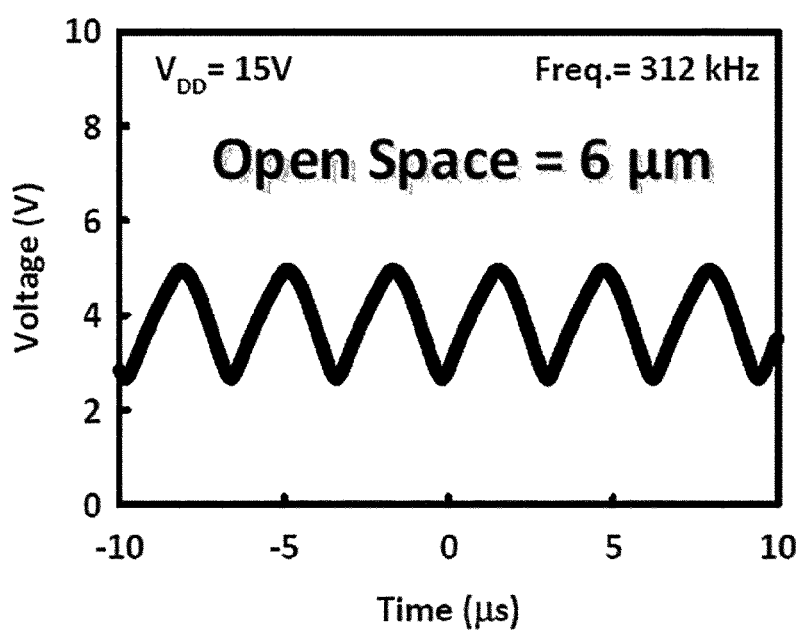
Figure 16C:
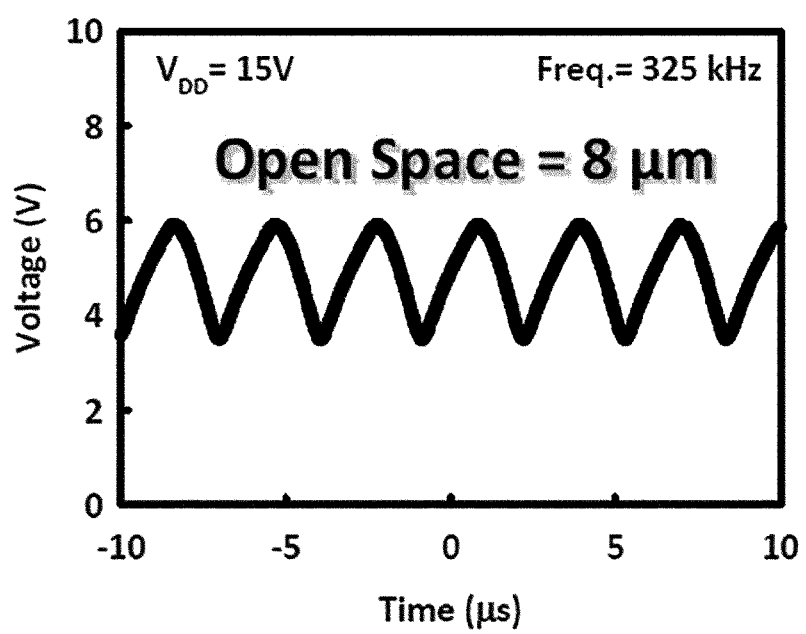
Figure 16D:
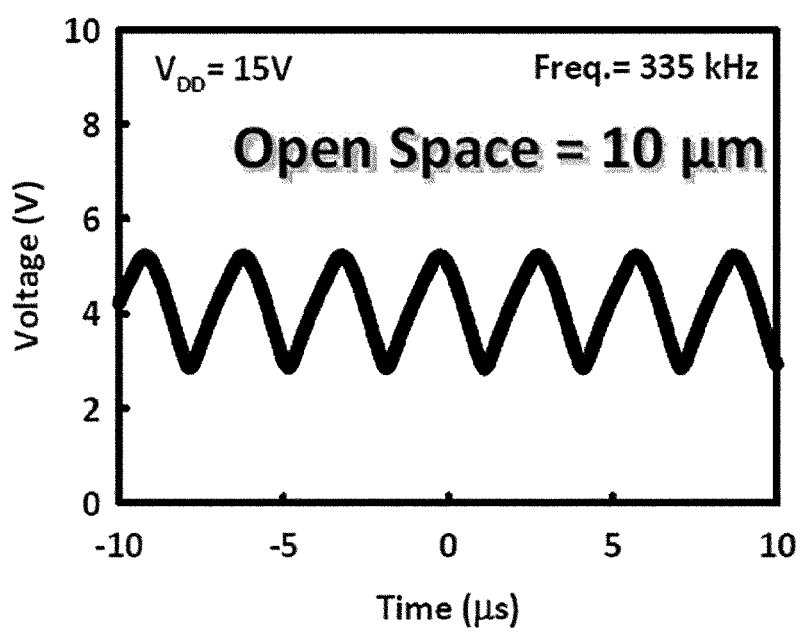
Figure 16E:
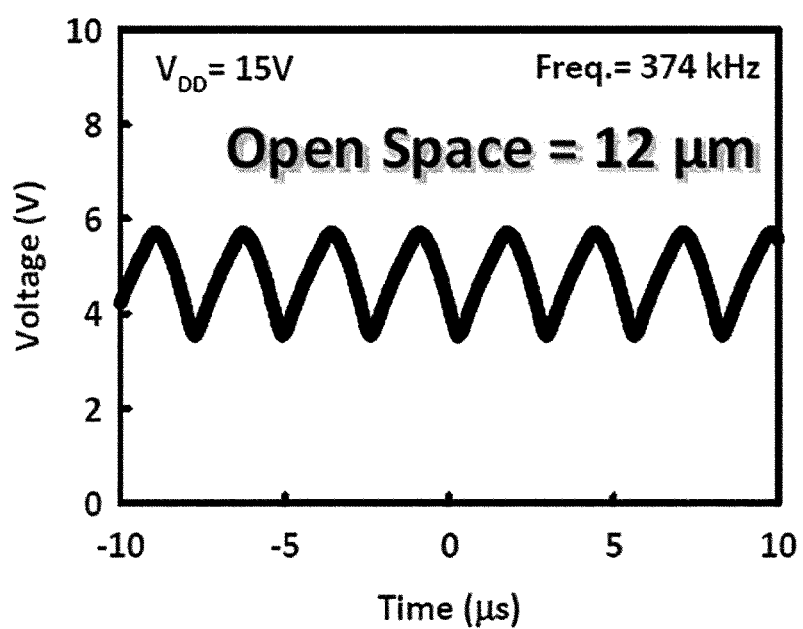
Figure 16F:
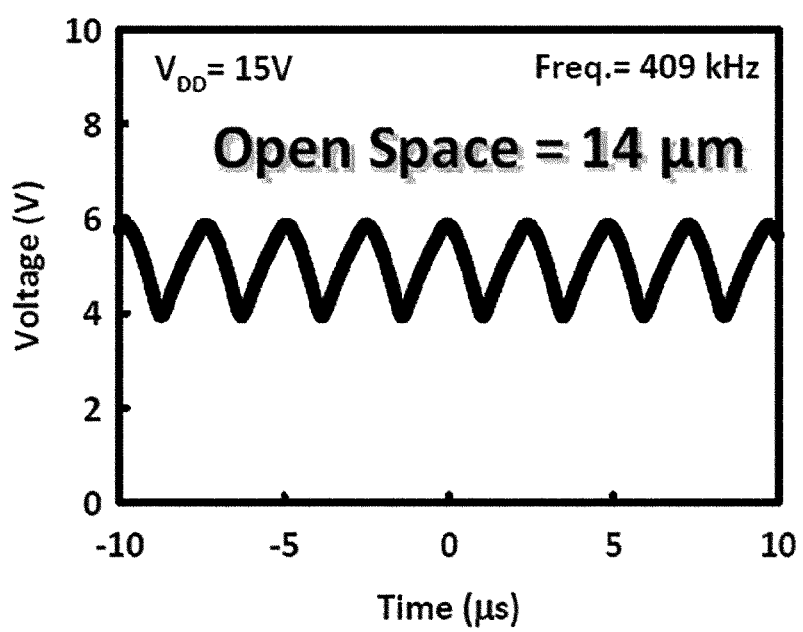
Figure 22A:
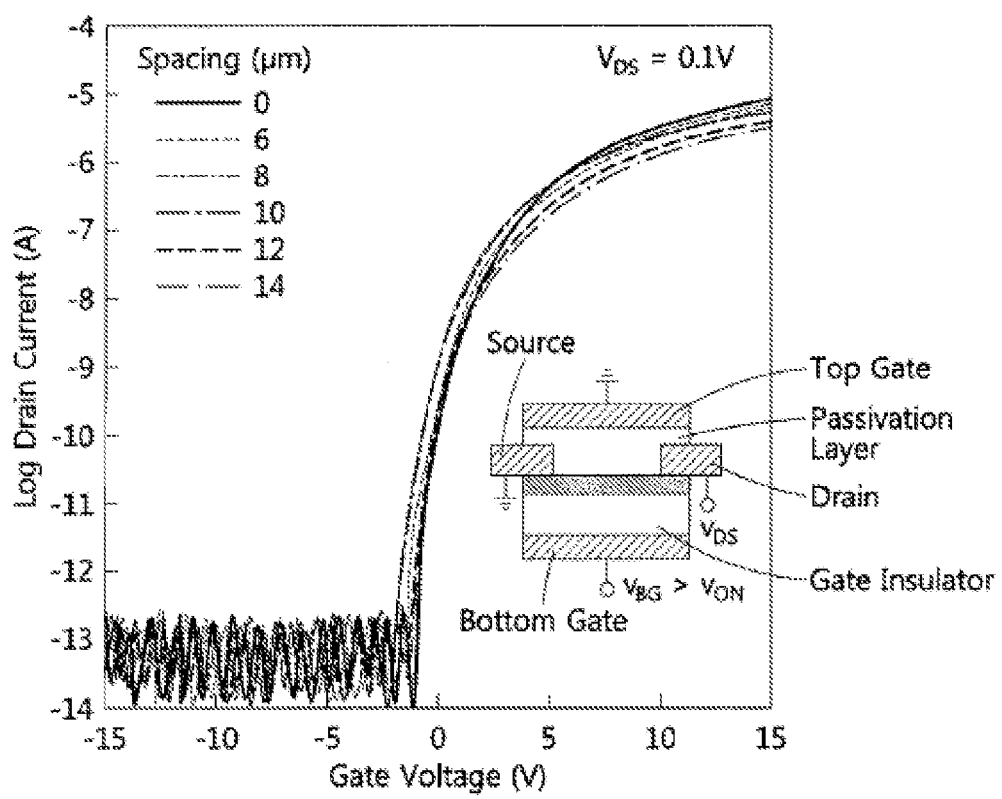
FIGS. 22A to 22C illustrate transfer characteristics according to different gate driving in oxide semiconductor thin-film transistors according to another embodiment of the present invention in which the sizes of a first gate electrode and a second gate electrode are the same.
Figure 22B:
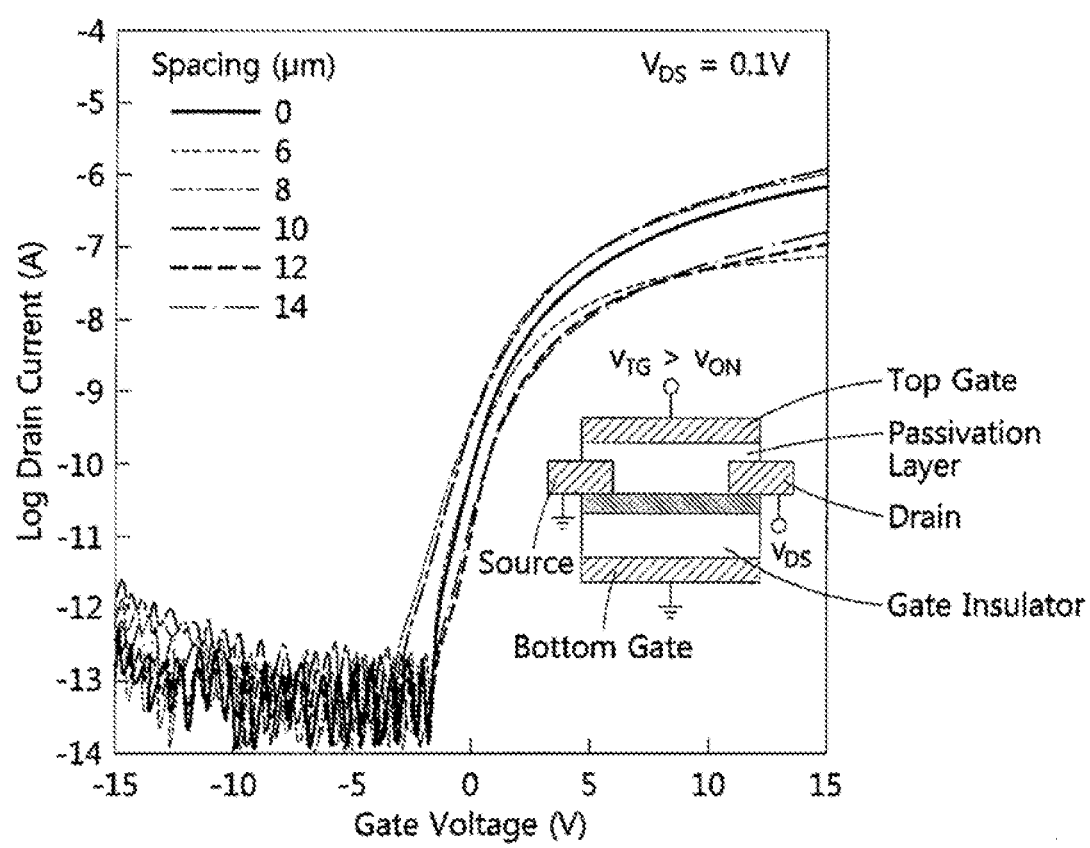
Figure 22C:
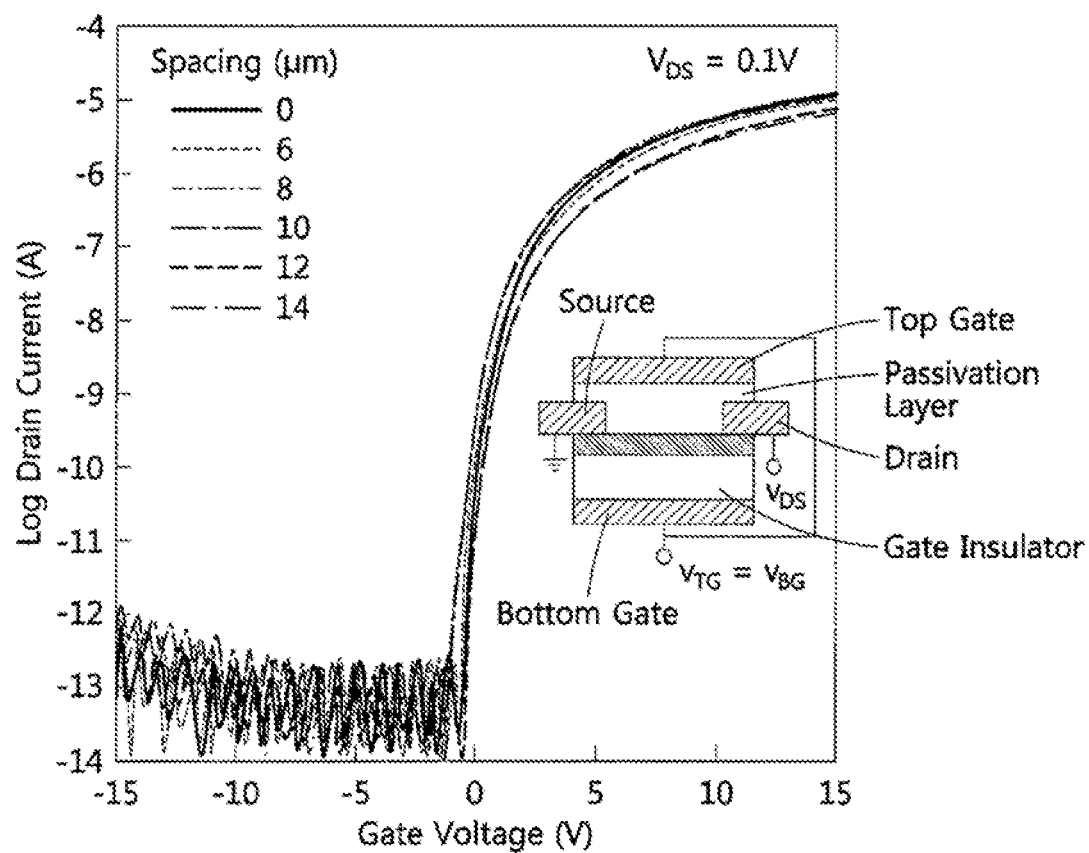
Figure 22D:
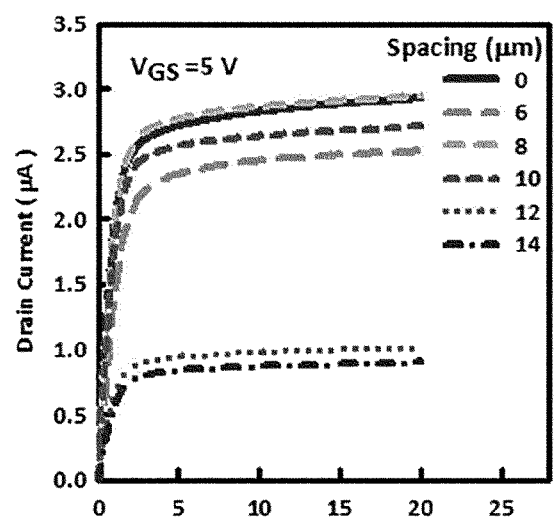
FIGS. 22D to 22F illustrate output characteristics according to different gate driving in oxide semiconductor thin-film transistors according to another embodiment of the present invention in which the sizes of a first gate electrode and a second gate electrode are the same.
Figure 22E:
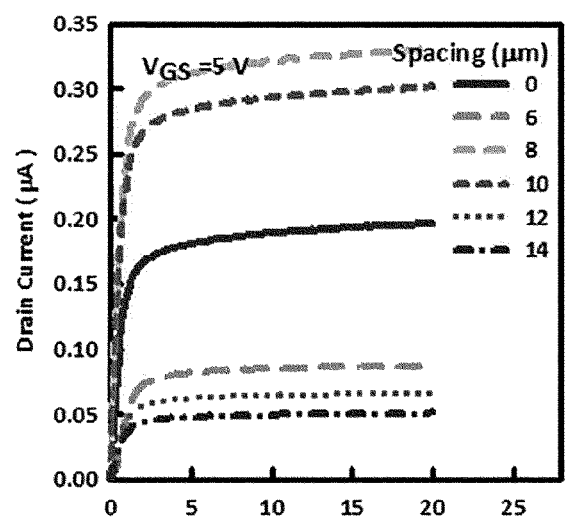

A spacing between a plurality of island patterns of FIG. 16A is 0 µm, a spacing between a plurality of island patterns of FIG. 16B is 6 µm, a spacing between a plurality of island patterns of FIG. 16C is 8 µm, a spacing between a plurality of island patterns of FIG. 16D is 10 µm, a spacing between a plurality of island patterns of FIG. 22E is 12 µm, and a spacing between a plurality of island patterns of FIG. 16F is 14 µm.

In FIGS. 16A to 16F, a total width of an oxide semiconductor layer is 240 µm, and power supply voltage VDD is 15 V.

Referring to FIGS. 16A to 16F, it can be confirmed that parasitic capacitance is reduced with increasing width of the plurality of island patterns and thus a frequency increases.

FIGS. 17A to 17H illustrate sectional views of an oxide semiconductor thin-film transistor exhibiting an overall flow of a method of fabricating an oxide semiconductor thin-film transistor (dual gate structure) according to another embodiment of the present invention.

Figure 17A:
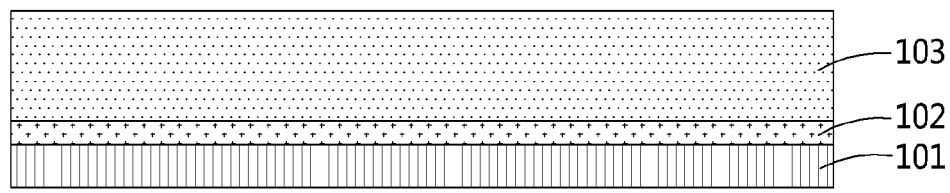
FIGS. 17A to 17H illustrate sectional views of an oxide semiconductor thin-film transistor exhibiting an overall flow of a method of fabricating an oxide semiconductor thin-film transistor (dual gate structure) according to another embodiment of the present invention.
Figure 17B:
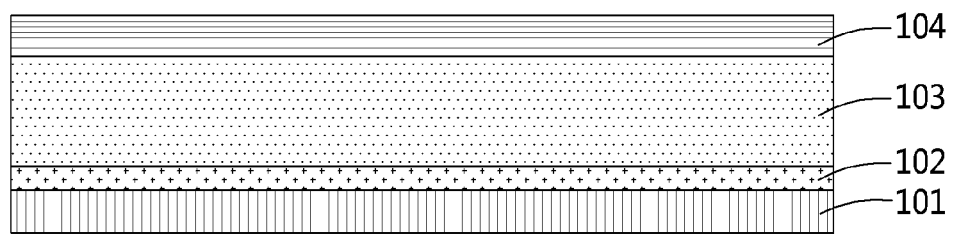
Figure 17C:
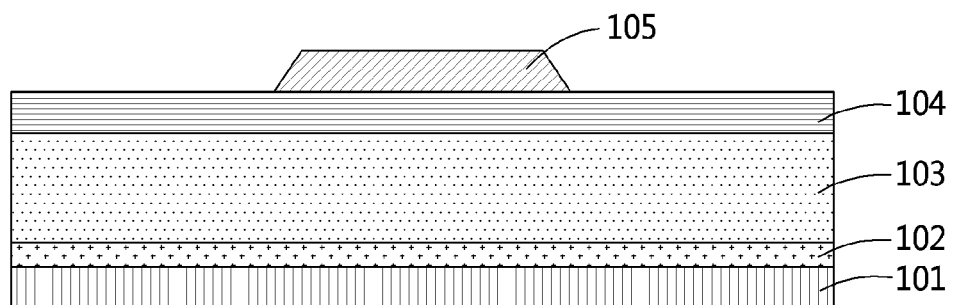
Figure 17D:
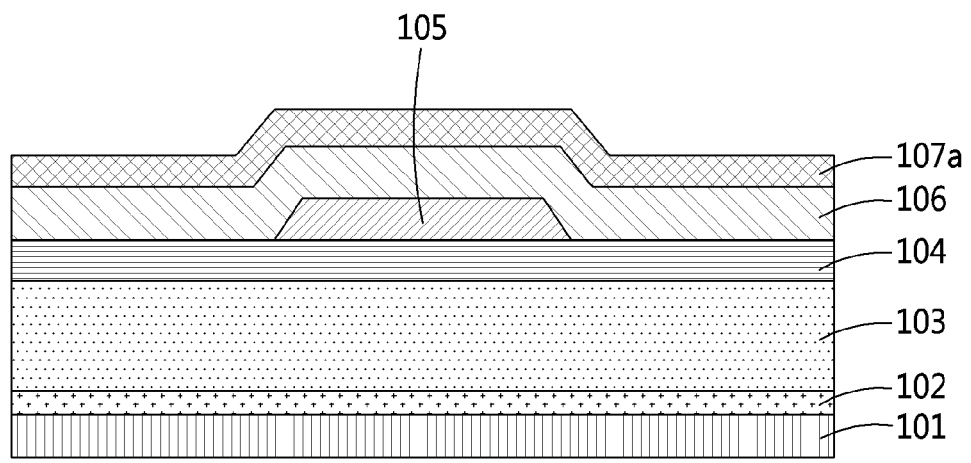
Figure 17E:
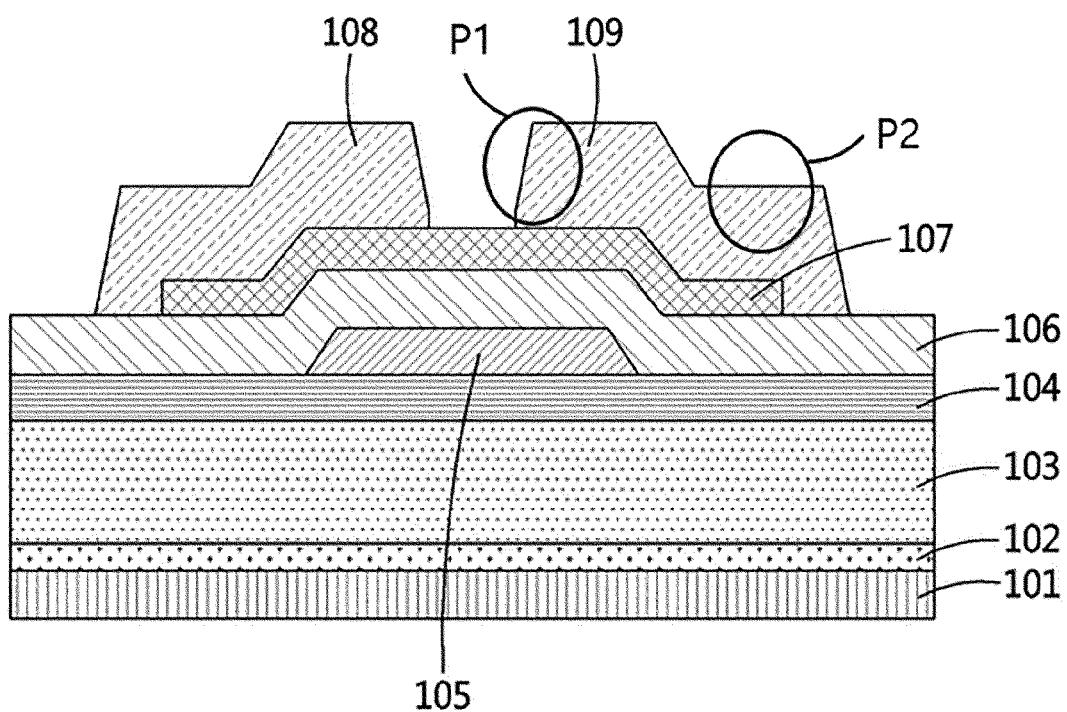
Figure 17F:
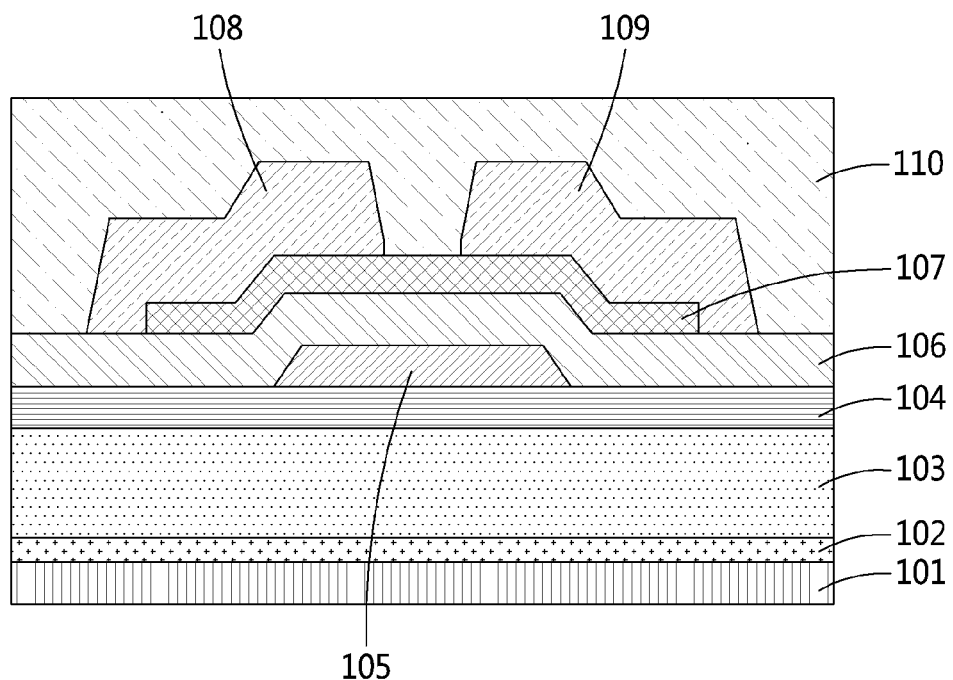
Figure 17G:
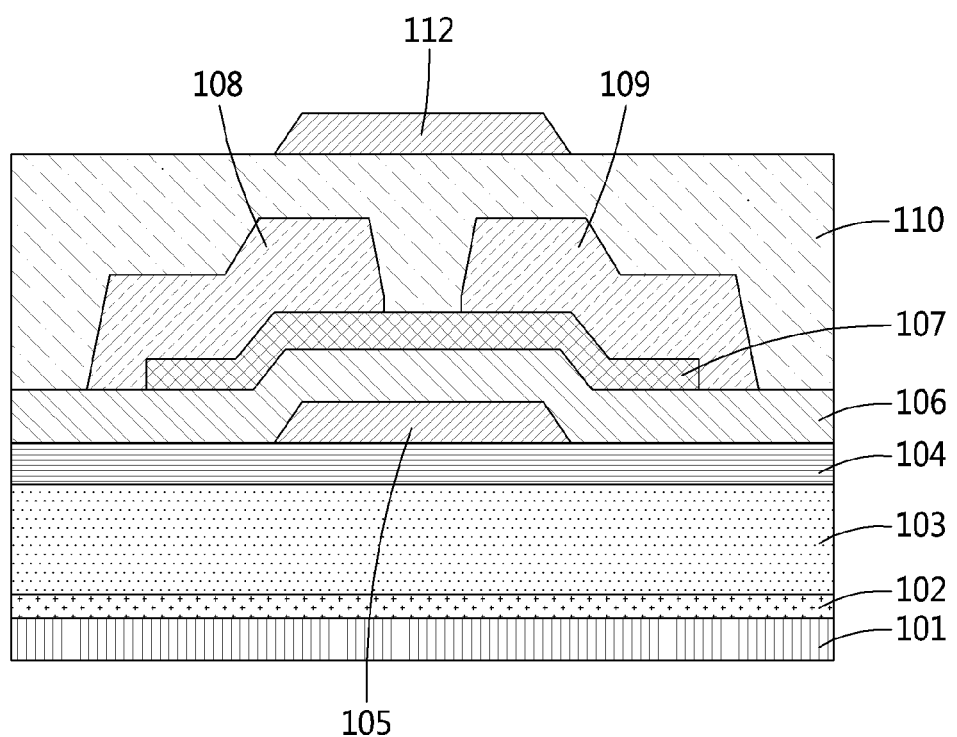
Figure 17H:
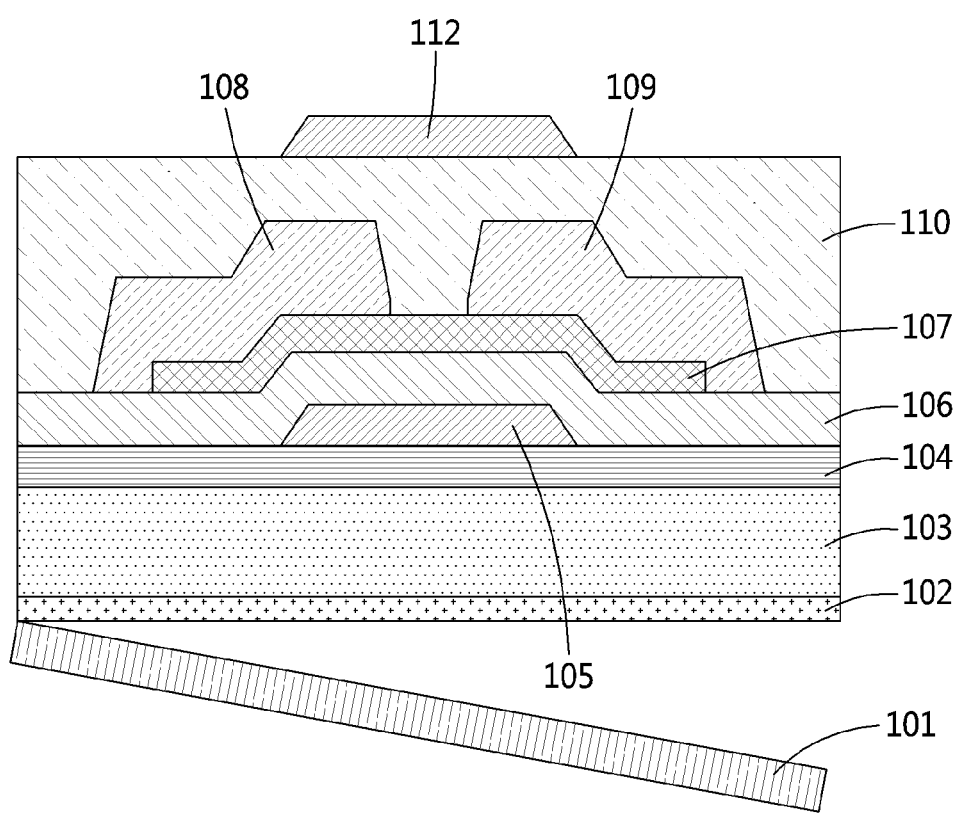

As shown in FIG. 17H, the oxide semiconductor thin-film transistor according to another embodiment of the present invention includes a substrate 103, a first gate electrode 105, a gate insulator 106, an oxide semiconductor layer 107, source/drain electrodes 108 and 109, a passivation layer 110 and a second gate electrode 112, and may further include a supporting layer 102, a buffer layer 104 and a connection electrode (not shown).

The oxide semiconductor thin-film transistor according to another embodiment of the present invention may include the components of the oxide semiconductor thin-film transistor according to an embodiment of the present invention. Accordingly, descriptions of the same components are omitted.

Referring to FIG. 17A, a method of fabricating? the method of fabricating an oxide semiconductor thin-film transistor according to another embodiment of the present invention includes forming the supporting layer 102 and the substrate 103 on the carrier substrate 101.

As shown in FIG. 17A, the supporting layer 102 is formed on the carrier substrate 101. However, the supporting layer 102 is not an essential component.

In addition, the substrate 103 is formed on the supporting layer 102. The substrate 103, which is a substrate for supporting various components of an oxide semiconductor thin-film transistor, may be a substrate having flexibility.

Referring to FIG. 17B, the method of fabricating an oxide semiconductor thin-film transistor according to another embodiment of the present invention includes forming the buffer layer 104 on the substrate 103.

As shown in FIG. 17B, the buffer layer 104 may be formed on the substrate 103.

The buffer layer 104 serves to prevent penetration of external impurities such as moisture or oxygen through the substrate 103 and may planarize a surface of the substrate 103. However, the buffer layer 104 is not an essential component and may be adopted or omitted depending upon the type of the substrate 103.

Referring to FIG. 17C, the method of fabricating an oxide semiconductor thin-film transistor according to another embodiment of the present invention includes forming the first gate electrode 105 on the substrate 103 on which the buffer layer 104 has been formed.

As shown in FIG. 17C, the first gate electrode 105 is formed on the buffer layer 104. The first gate electrode 105 may be a bottom gate electrode.

Referring to FIG. 17D, the method of fabricating an oxide semiconductor thin-film transistor according to another embodiment of the present invention includes forming the gate insulator 106 and the oxide semiconductor film 107a on the first gate electrode 105.

As shown in FIG. 17D, the gate insulator 106 is formed on the first gate electrode 105.

In addition, the oxide semiconductor film 107a is formed on the gate insulator 106.

Specifically, the oxide semiconductor film 107a is a film used to form the oxide semiconductor layer 107 and is formed on the gate insulator 106 to cover an entire surface of the gate insulator 106. Next, a photoresist pattern is formed on the oxide semiconductor film 107a and the oxide semiconductor film 107a in the thin-film transistor region is patterned to correspond to the first gate electrode 105 using the photoresist pattern as a mask, thereby forming the oxide semiconductor layer 107 (see FIG. 14E).

Referring to FIG. 17E, the method of fabricating an oxide semiconductor thin-film transistor according to another embodiment of the present invention includes forming the oxide semiconductor layer 107 and the source/drain electrodes 108 and 109 on the first gate electrode 105.

As shown in FIG. 17E, the oxide semiconductor layer 107 is formed on the gate insulator 106 to correspond to the first gate electrode 105.

In addition, the source/drain electrodes 108 and 109 are formed on the oxide semiconductor layer 107 to be spaced from each other.

The source/drain electrodes 108 and 109 may be formed to have a plurality of island patterns and a separated first area P1. When the source/drain electrodes 108 and 109 are formed to have a plurality of island patterns and a separated first area P1, resistance to external stress such as bending or twist is provided, and thus, damage due to external stress such as crack may be prevented.

Referring to FIG. 17F, the method of fabricating an oxide semiconductor thin-film transistor according to another embodiment of the present invention includes forming the passivation layer 110 on the source/drain electrodes 108 and 109.

As shown in FIG. 17F, the oxide semiconductor thin-film transistor 100 according to an embodiment of the present invention may further include the passivation layer 110.

Referring to FIG. 17G, the method of fabricating an oxide semiconductor thin-film transistor according to another embodiment of the present invention includes forming the second gate electrode 112 on the passivation layer 110.

As shown in FIG. 17G, the oxide semiconductor thin-film transistor according to another embodiment of the present invention further includes the second gate electrode 112.

As shown in FIG. 17G, the second gate electrode 112 is formed on the passivation layer 110.

The second gate electrode 112 may be a top gate electrode and may form a dual gate structure together with the first gate electrode 105.

The second gate electrode 112 may be formed by depositing a gate conductive film (not shown) on the buffer layer 104 and forming a photoresist pattern on the gate conductive film, followed by selectively etching, i.e., patterning, the gate conductive film using the photoresist pattern as a mask.

The second gate electrode 112 may be formed of a metal material, for example, any one of molybdenum (Mo), aluminum (Al), chromium (Cr), gold (Au), titanium (Ti), nickel (Ni), neodymium (Nd), and copper (Cu) or a combination thereof, but may be formed of various materials without being limited to the materials. In addition, the second gate electrode 112 may be formed in a single layer structure or multilayer structure including the material.

According to one embodiment, the second gate electrode 112 may be formed to be horizontally spaced (offset and overlap) by −1 μm to 3 μm from the source/drain electrodes 108 and 109 formed on the oxide semiconductor layer 107.

Offset and overlap refer to at least one of a width between one end of the second gate electrode 112 and the source electrode 108 and a width between the other end of the second gate electrode 112 and the drain electrode 109.

For example, overlap refers to a portion where the second gate electrode 112 and the source electrode 108 overlap when looking at the second gate electrode 112 and the source electrode 108 in a vertical direction from a substrate. Accordingly, overlap refers to a width of 0 μm to 3 μm.

Offset refers to a distance between the second gate electrode 112 and the source electrode 108 spaced from each other in a horizontal direction when looking at the second gate electrode 112 and the source electrode 108 in a vertical direction from a substrate. Accordingly, offset refers to a width of −1 μm to 0 μm.

In the case of the oxide semiconductor thin-film transistor according to another embodiment of the present invention, the upper interface of the oxide semiconductor layer 107 includes relatively many defects compared to the lower interface thereof because many processes are additionally performed on an upper interface of the oxide semiconductor layer 107 after forming the oxide semiconductor layer 107.

However, offset of the second gate electrode 112 of the oxide semiconductor thin-film transistor according to another embodiment of the present invention may reduce a defect area formed on the upper interface of the oxide semiconductor layer 107 and thus may reduce a threshold voltage change in positive bias stress (PBS), thereby improving electrical characteristics of an oxide semiconductor transistor.

According to one embodiment, the oxide semiconductor thin-film transistor 100 may further include a connection electrode (not shown) for electrically connecting the first gate electrode 105 and the second gate electrode 112 to each other.

Specifically, the connection electrode is an electrode for connecting the first gate electrode 105 and the second gate electrode 112 to each other. The same voltage may be applied to the first gate electrode 105 and the second gate electrode 112 through the connection electrode.

Accordingly, in the case of the oxide semiconductor thin-film transistor according to another embodiment of the present invention, the width of channels formed at the oxide semiconductor layer 107 may be increased when the same voltage is applied to the first gate electrode 105 and the second gate electrode 112, whereby the amount of current passing through the source electrode 108 and the drain electrode 109 may be increased and stabilization may be exhibited in reliability tests for positive voltage, negative voltage and temperature.

According to one embodiment, in the case of the oxide semiconductor thin-film transistor 100, the passivation layer may be additionally formed on the second gate electrode 112.

A passivation layer may include at least one material selected from inorganic insulating materials such as silicon nitride (SiNx) or silicon oxide (SiOx), organic insulating materials and insulating materials with low dielectric constants.

The passivation layer may protect the oxide semiconductor transistor according to another embodiment of the present invention from the outside.

Referring to FIG. 17H, the method of fabricating an oxide semiconductor thin-film transistor according to another embodiment of the present invention includes removing the carrier substrate 101.

As shown in FIG. 17H, the carrier substrate 101 may be removed from the supporting layer 102.

The oxide semiconductor thin-film transistor according to another embodiment of the present invention is formed in the shape of a plurality of island patterns wherein the source/drain electrodes 108 and 109 are formed such that the first areas are separated from each other, thereby having resistance to external stress.

The oxide semiconductor thin-film transistor according to another embodiment of the present invention may be used to drive a display apparatus, particularly a pixel element of a flexible display apparatus, for example, an organic light emitting device.

Figure 18A:
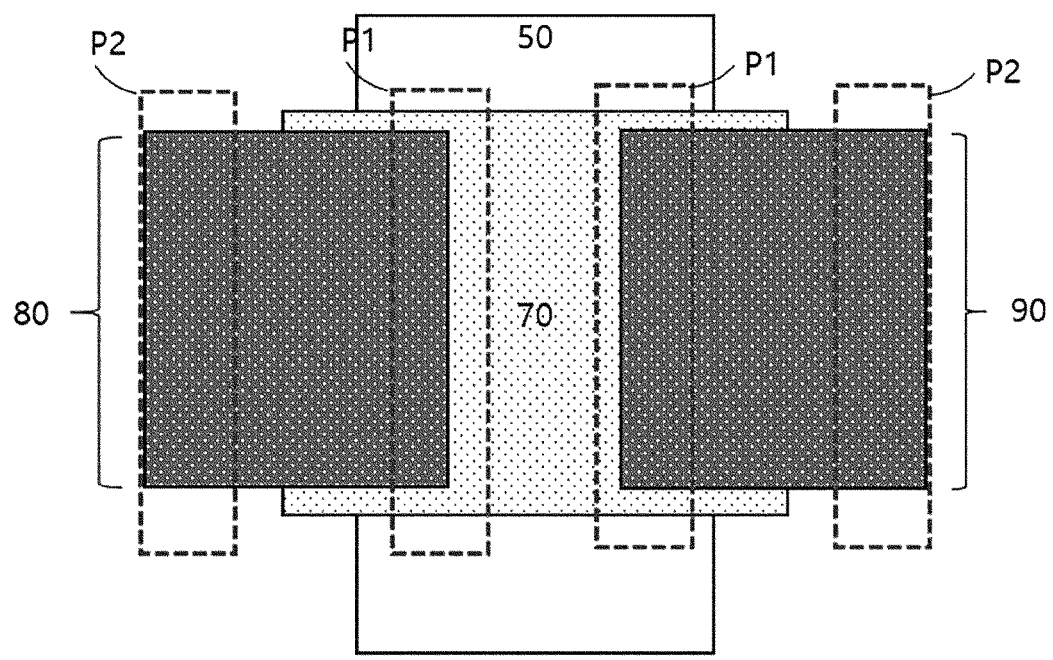
FIG. 18A illustrates a top view of a conventional oxide semiconductor thin-film transistor.
Figure 18B:
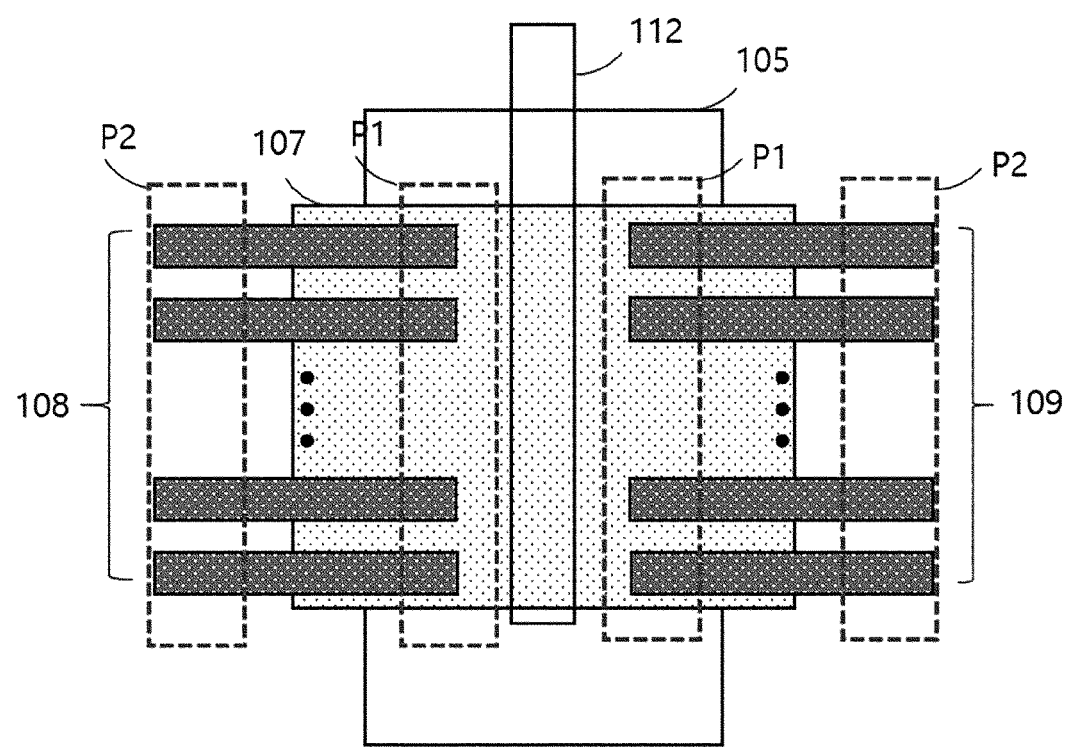
FIG. 18B illustrates a top view of an oxide semiconductor thin-film transistor according to another embodiment of the present invention.

FIG. 18A illustrates a top view of a conventional oxide semiconductor thin-film transistor, and FIG. 18B illustrates a top view of an oxide semiconductor thin-film transistor according to another embodiment of the present invention.

Referring to FIG. 18A, in the case of a conventional oxide semiconductor thin-film transistor, source/drain electrodes 80 and 90 are formed to be spaced from each other on a gate electrode 50 and an oxide semiconductor layer 70. However, the source/drain electrodes 80 and 90 of the conventional oxide semiconductor thin-film transistor are not formed in the shape of a plurality of island patterns.

However, referring to FIG. 18B, the oxide semiconductor thin-film transistor according to another embodiment of the present invention includes source/drain electrodes 108 and 109, which are spaced from each other, and a second gate electrode 112 formed on a first gate electrode 105 and an oxide semiconductor layer 107, and the source/drain electrodes 108 and 109 are formed in the shape of a plurality of island patterns. Further, the plurality of island patterns of the source/drain electrodes 108 and 109 are formed such that the first areas P1 are separated from each other.

Accordingly, in the case of the oxide semiconductor thin-film transistor according to another embodiment of the present invention, the areas of the source/drain electrodes 108 and 109 are reduced compared to a conventional oxide semiconductor thin-film transistor, whereby parasitic capacitance generated between the first gate electrode 105 or the second gate electrode 112 and the source/drain electrodes 108 and 109 may be reduced and resistance to external stress may be improved.

Figure 19A:
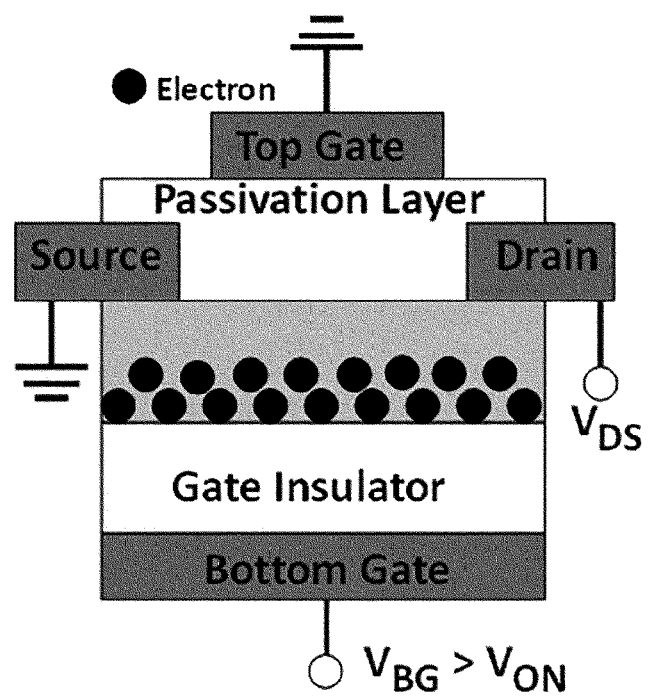
FIGS. 19A to 19C are sectional views illustrating different gate driving in an oxide semiconductor thin-film transistor (dual gate structure) according to another embodiment of the present invention.
Figure 19B:
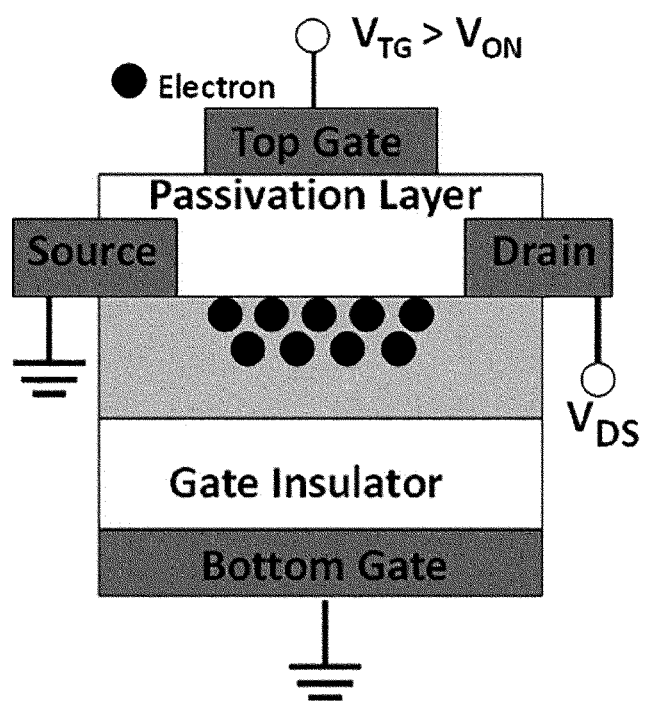
Figure 19C:
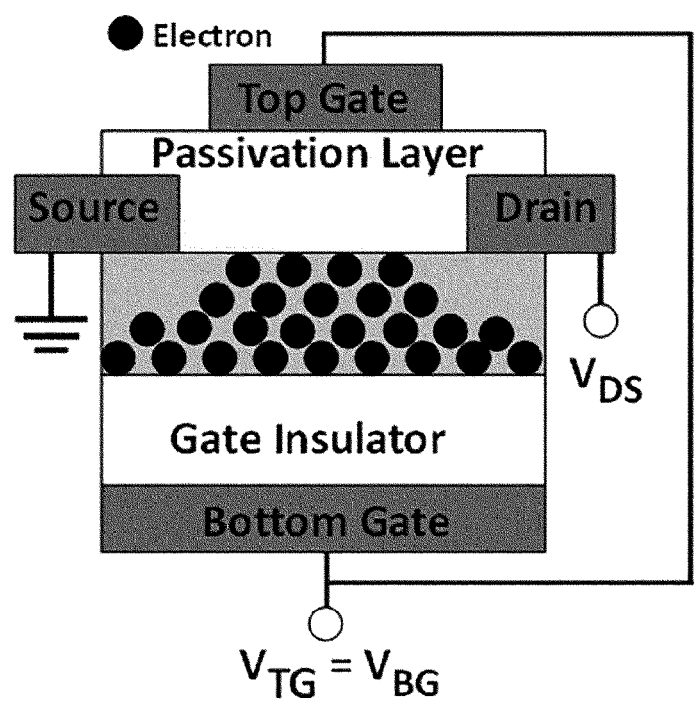

FIGS. 19A to 19C are sectional views illustrating different gate driving in an oxide semiconductor thin-film transistor (dual gate structure) according to another embodiment of the present invention.

FIG. 19A illustrates electron distribution and current flow when a first gate electrode is swept to −15 to 15 V (bottom sweep) and a second gate electrode is grounded, FIG. 19b illustrates electron distribution and current flow when a second gate electrode is swept to −15 to 15 V (top sweep) and a first gate electrode is grounded, and FIG. 19C illustrates the case wherein a first gate electrode and a second gate electrode are electrically or physically connected to each other and thus are simultaneously swept to −15 to 15 V (dual sweep).

FIGS. 20A to 20F illustrate the characteristics of oxide semiconductor thin-film transistors according to another embodiment of the present invention dependent upon the widths of a plurality of line patterns.

FIGS. 20A to 20F illustrates optical microscope images of source/drain electrodes of oxide semiconductor thin-film transistors according to another embodiment of the present invention, a plurality of island patterns of which have different widths and first areas are separated from each other.

Figure 20A:
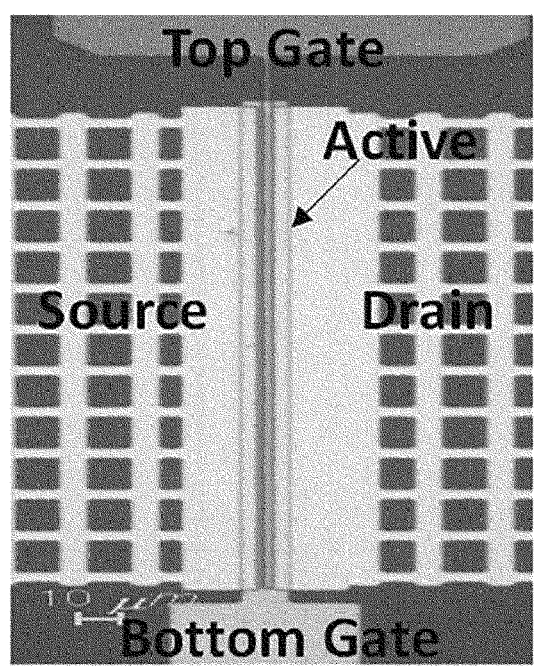
FIGS. 20A to 20F illustrate the characteristics of oxide semiconductor thin-film transistors according to another embodiment of the present invention dependent upon the widths of a plurality of line patterns.
Figure 20B:
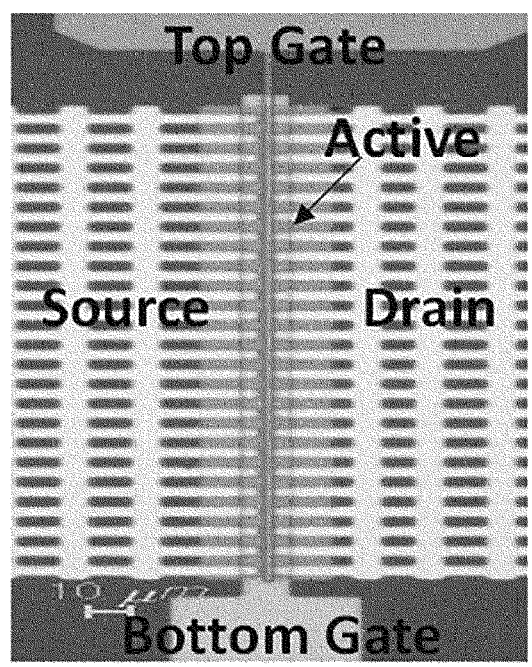
Figure 20C:
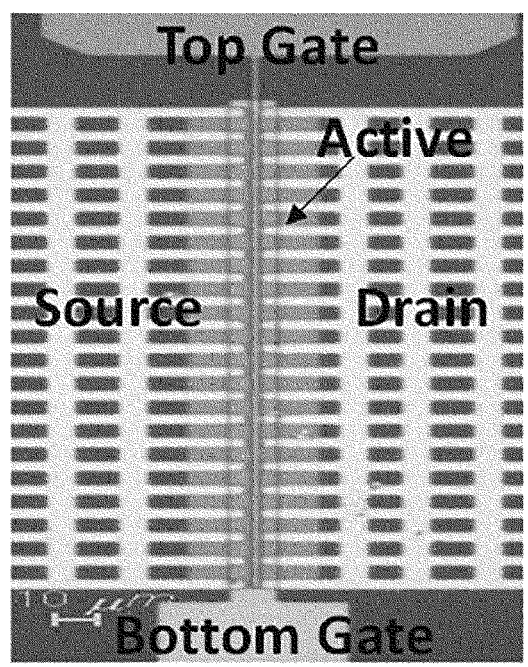
Figure 20D:
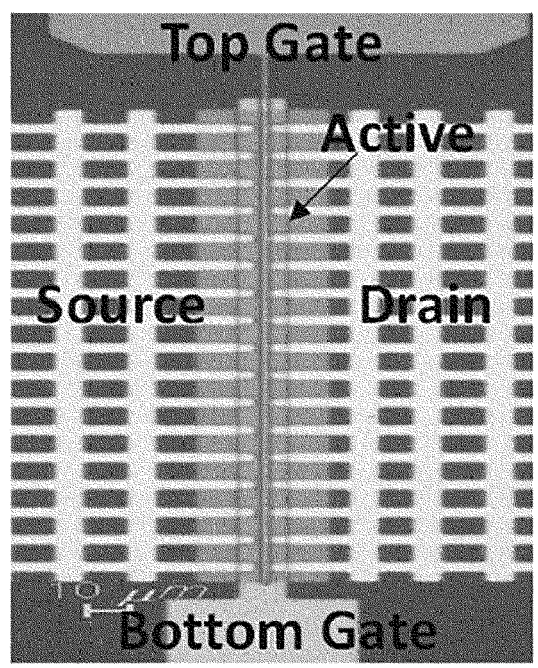
Figure 20E:
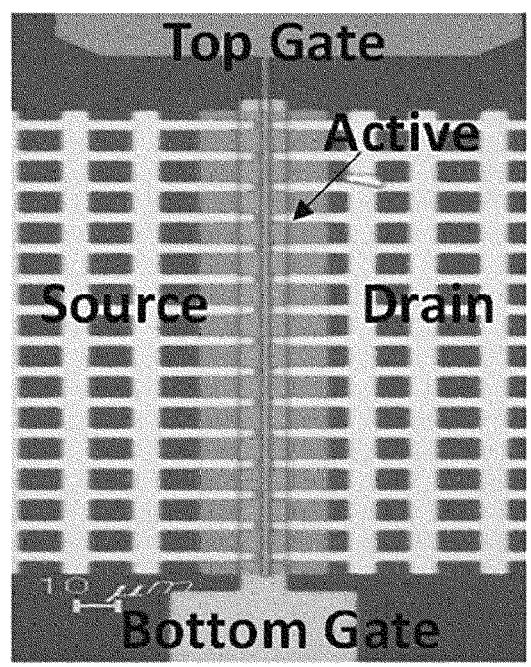
Figure 20F:
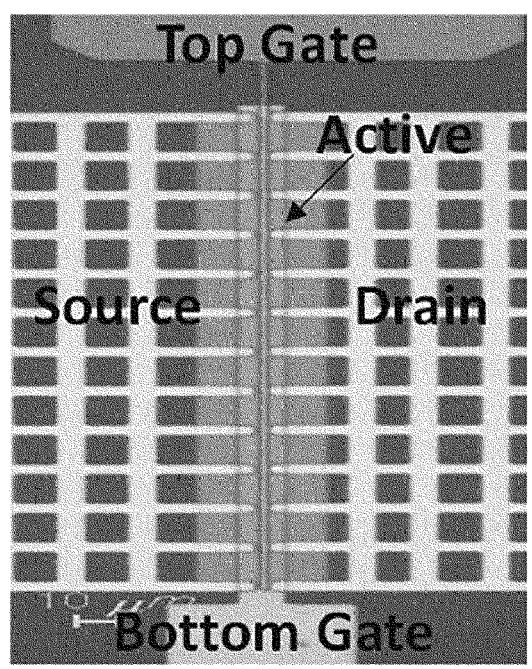

FIG. 20A illustrates an optical microscope image of a general oxide semiconductor thin-film transistor, a first area of a source electrode S and a drain electrode D of which is not separated.

Referring to FIG. 20A, it can be confirmed that the first area of the source electrode S and the drain electrode D of the general oxide semiconductor thin-film transistor is not separated.

FIGS. 20B to 20F illustrate optical microscope images of oxide semiconductor thin-film transistors according to another embodiment of the present invention, the source electrode S and the drain electrode D of which are formed in the shape of a plurality of island patterns having a lattice shape and are formed such that first areas are formed to be separated from each other.

Referring to FIGS. 20B to 20F, it can be confirmed that the source electrodes S and the drain electrodes D of the oxide semiconductor thin-film transistors according to another embodiment of the present invention are formed in the shape of a plurality of island patterns having a lattice shape and are formed such that first areas are separated from each other.

In addition, referring to FIGS. 20B to 20F, the lattice-shaped island patterns of the source electrodes S and the drain electrodes D of the oxide semiconductor thin-film transistors according to another embodiment of the present invention are satisfactorily formed to have various widths.

FIGS. 21A to 21F illustrate the characteristics of oxide semiconductor thin-film transistors according to another embodiment of the present invention dependent upon a spacing between a plurality of line patterns.

FIGS. 21A to 21F illustrate optical microscope images of oxide semiconductor thin-film transistors according to another embodiment of the present invention wherein source/drain electrodes are formed in the shape of a plurality of island patterns, spacings between line patterns of which are different, and are formed such that first areas are separated from each other.

Figure 21A:
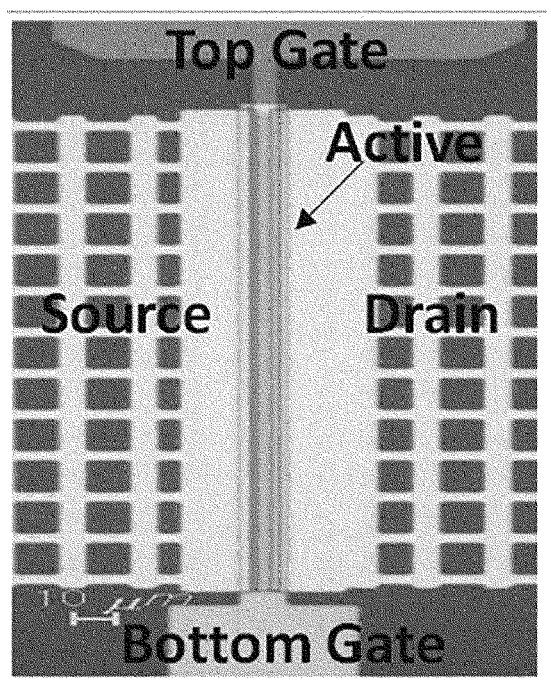
FIGS. 21A to 21F illustrate the characteristics of oxide semiconductor thin-film transistors according to another embodiment of the present invention dependent upon a spacing between a plurality of line patterns.
Figure 21B:
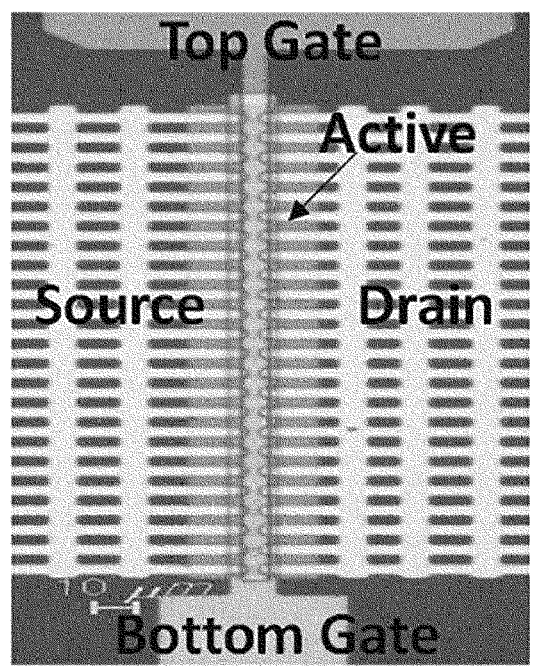
Figure 21C:
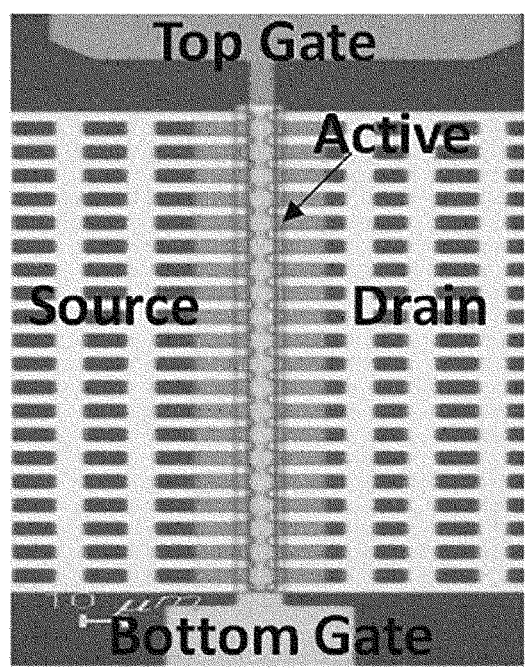
Figure 21D:
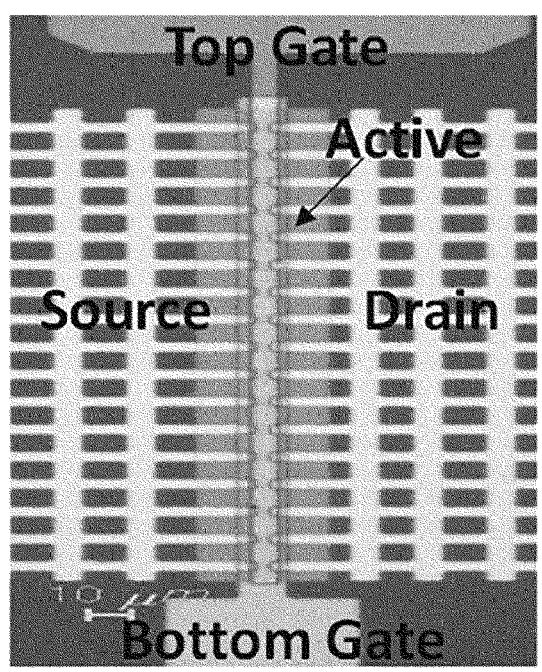
Figure 21E:
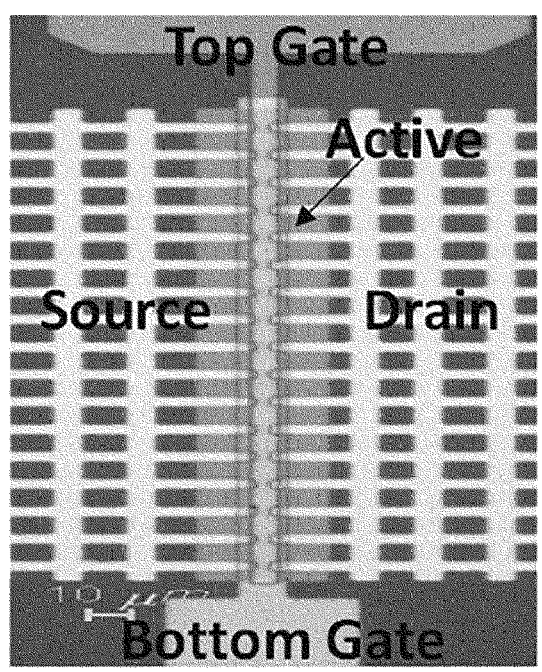
Figure 21F:
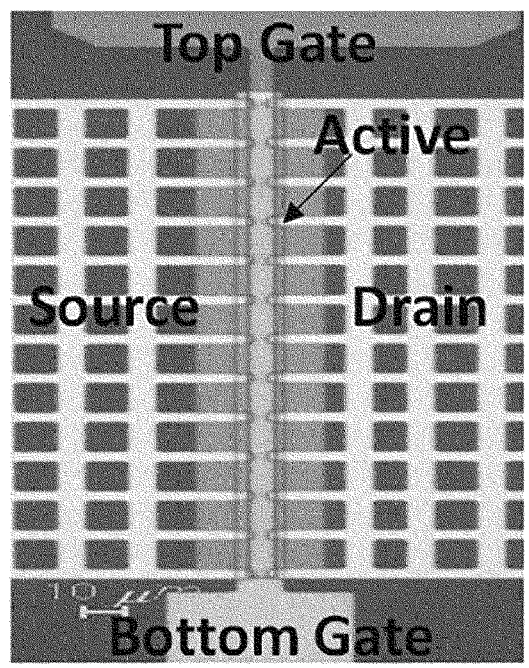

FIG. 21A illustrates an optical microscope image of an oxide semiconductor thin-film transistor wherein first areas of the source electrode S and the drain electrode D are not separated.

Referring to FIG. 21A, it can be confirmed that first areas of the source electrode S and the drain electrode D of the general oxide semiconductor thin-film transistor are not separated.

FIGS. 21B to 21F illustrate optical microscope images of oxide semiconductor thin-film transistors according to another embodiment of the present invention wherein the source electrode S and the drain electrode D are formed in the shape of a plurality of island patterns having a lattice shape and are formed such that the first areas are separated from each other.

Referring to FIGS. 21B to 21F, it can be confirmed that the source electrodes S and the drain electrodes D of the oxide semiconductor thin-film transistors according to another embodiment of the present invention are formed in the shape of a plurality of island patterns having a lattice shape wherein the first areas are separated from each other.

In addition, referring to FIGS. 21B to 21F, it can be confirmed that spacings between the lattice-shaped line patterns of the source electrodes S and the drain electrodes D of the oxide semiconductor thin-film transistors according to another embodiment of the present invention are satisfactorily diversified.

FIGS. 22A to 22C illustrate transfer characteristics according to different gate driving in oxide semiconductor thin-film transistors according to another embodiment of the present invention in which the sizes of a first gate electrode and a second gate electrode are the same.

FIG. 22A illustrates transfer characteristics according to spacings between a plurality of island patterns of oxide semiconductor thin-film transistors according to another embodiment of the present invention during bottom sweep, FIG. 22B illustrates transfer characteristics according to spacings between a plurality of island patterns of oxide semiconductor thin-film transistors according to another embodiment of the present invention during top sweep, and FIG. 22C illustrates transfer characteristics according to spacings between a plurality of island patterns of oxide semiconductor thin-film transistors according to another embodiment of the present invention during dual sweep.

Referring to FIGS. 22A to 22C, it can be confirmed that the oxide semiconductor thin-film transistors according to another embodiment of the present invention including the source electrodes and drain electrodes that have the plurality of island patterns including separated first areas exhibit similar characteristics to those of a standard oxide semiconductor thin-film transistor (0 μm).

Figure 22F:
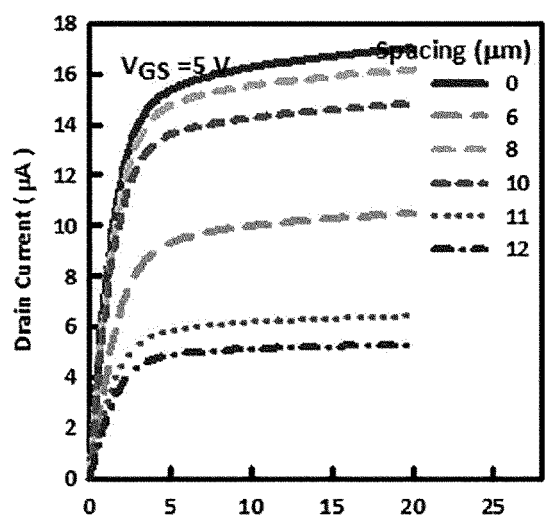

FIGS. 22D to 22F illustrate output characteristics according to different gate driving in oxide semiconductor thin-film transistors according to another embodiment of the present invention in which the sizes of a first gate electrode and a second gate electrode are the same.

FIG. 22D illustrates output characteristics according to spacings between a plurality of island patterns of oxide semiconductor thin-film transistors according to another embodiment of the present invention during bottom sweep, FIG. 22E illustrates output characteristics according to spacings between a plurality of island patterns of oxide semiconductor thin-film transistors according to another embodiment of the present invention during top sweep, and FIG. 22F illustrates output characteristics according to spacings between a plurality of island patterns of oxide semiconductor thin-film transistors according to another embodiment of the present invention during dual sweep.

Referring to FIGS. 22D to 22F, it can be confirmed that the oxide semiconductor thin-film transistors with a dual gate structure which include the source electrodes and drain electrodes that have the plurality of island patterns including separated first areas exhibit improved output characteristics.

Figure 22G:
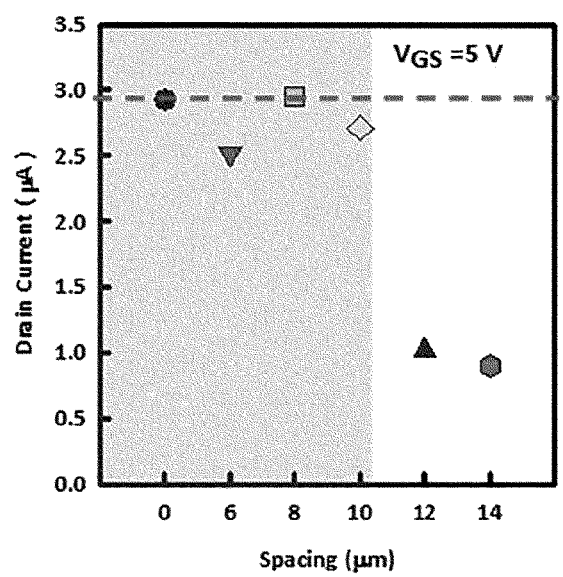
FIG. 22G illustrates output characteristics dependent upon a change in a spacing between a plurality of island patterns during bottom sweep of an oxide semiconductor thin-film transistor according to another embodiment of the present invention of FIG. 22I.
Figure 22H:
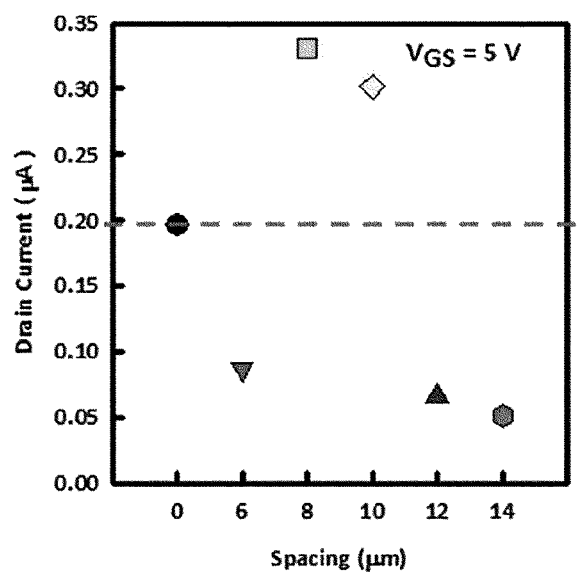
FIG. 22H illustrates output characteristics dependent upon a change in a spacing between a plurality of island patterns during top sweep of an oxide semiconductor thin-film transistor according to another embodiment of the present invention of FIG. 22E.
Figure 22I:
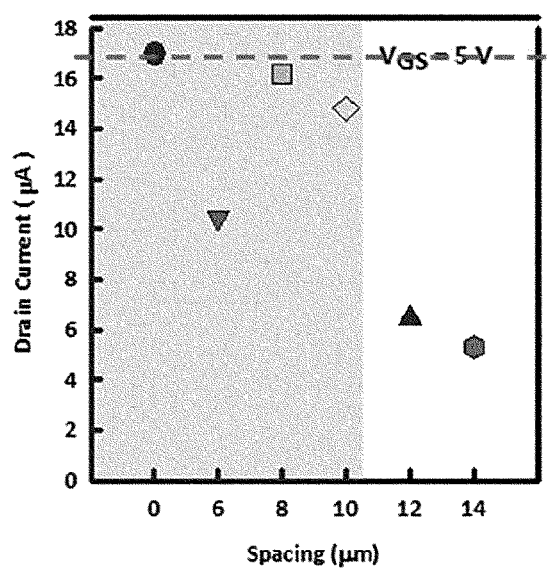
FIG. 22I illustrates output characteristics dependent upon a change in a spacing between a plurality of island patterns during dual sweep of an oxide semiconductor thin-film transistor according to another embodiment of the present invention of FIG. 22F.

FIG. 22G illustrates output characteristics dependent upon a change in a spacing between a plurality of island patterns during bottom sweep of an oxide semiconductor thin-film transistor according to another embodiment of the present invention of FIG. 22I, FIG. 22H illustrates output characteristics dependent upon a change in a spacing between a plurality of island patterns during top sweep of an oxide semiconductor thin-film transistor according to another embodiment of the present invention of FIG. 22E, and FIG. 22I illustrates output characteristics dependent upon a change in a spacing between a plurality of island patterns during dual sweep of an oxide semiconductor thin-film transistor according to another embodiment of the present invention of FIG. 22F.

FIGS. 22G to 22I illustrate current values when VGS=5 V and VDS=20 V. Here, the widths of a plurality of island patterns are 10 μm.

Referring to FIGS. 22G to 22I, it can be confirmed that the oxide semiconductor thin-film transistors according to another embodiment of the present invention exhibit similar characteristics to those of a standard oxide semiconductor thin-film transistor (0 μm).

FIGS. 22A to 22C illustrate transfer characteristics according to different gate driving in oxide semiconductor thin-film transistors according to another embodiment of the present invention in which the sizes of a first gate electrode and a second gate electrode are the same.

Figure 23A:
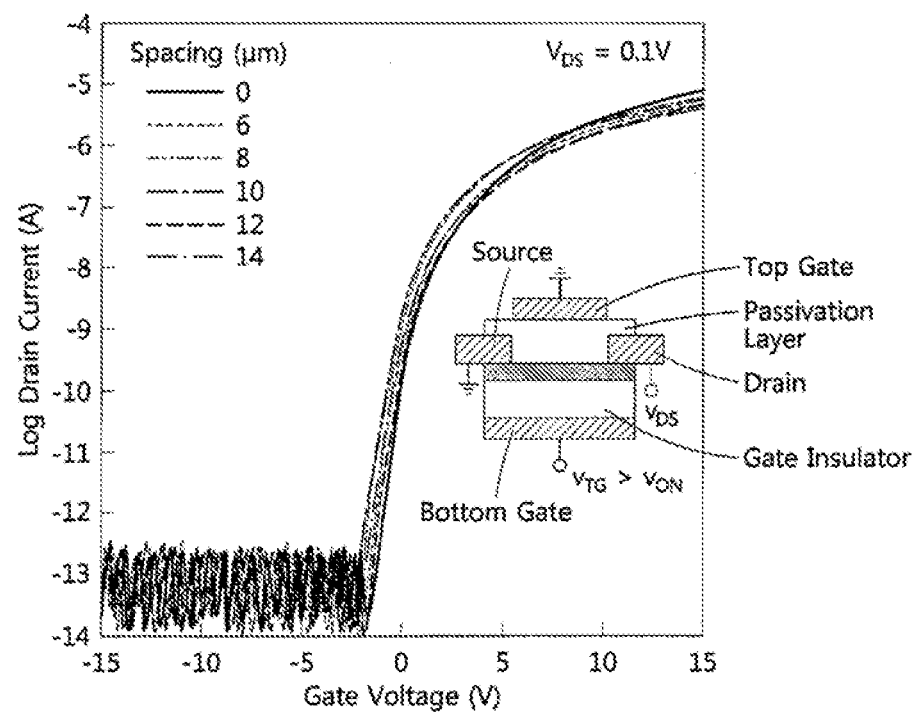
FIGS. 23A to 23C illustrate transfer characteristics according to different gate driving in oxide semiconductor thin-film transistors according to another embodiment of the present invention which has an offset structure wherein a spacing between source/drain electrodes and a second gate is −1 μm.
Figure 23B:
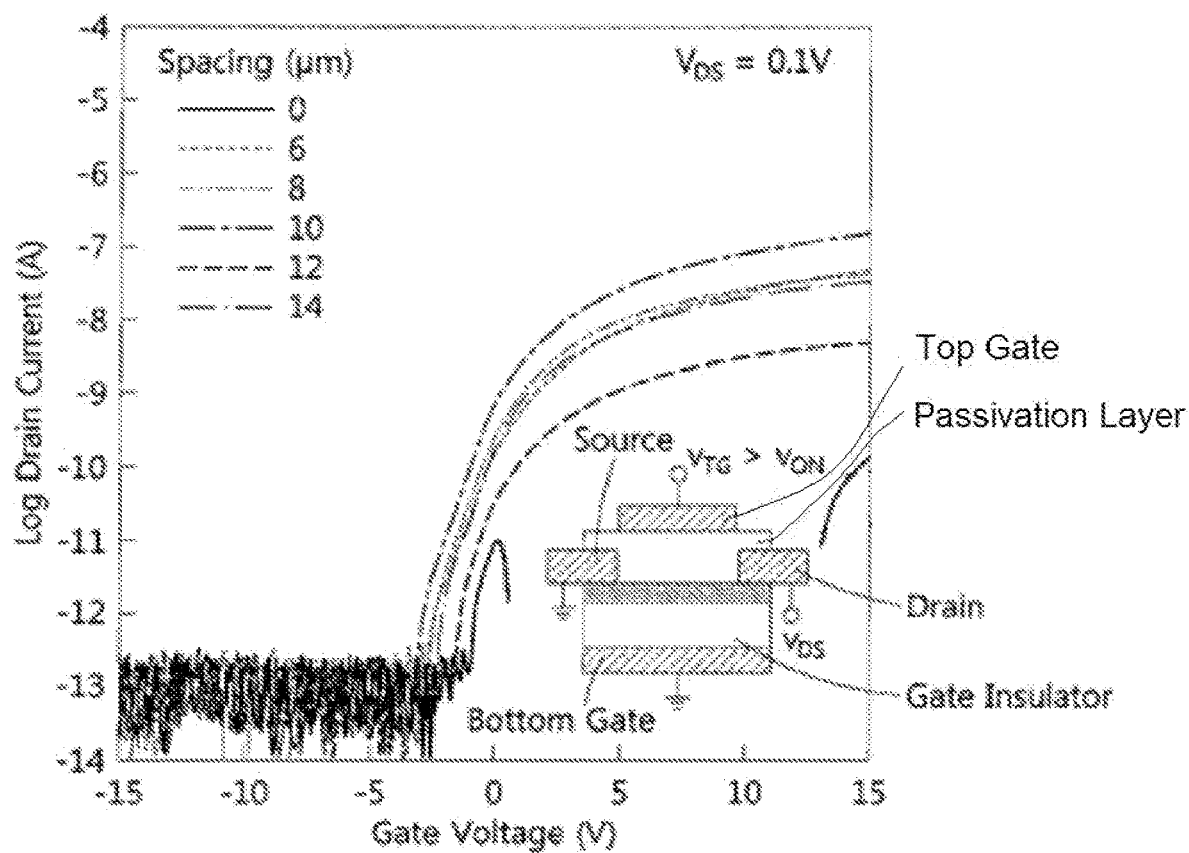
Figure 23C:
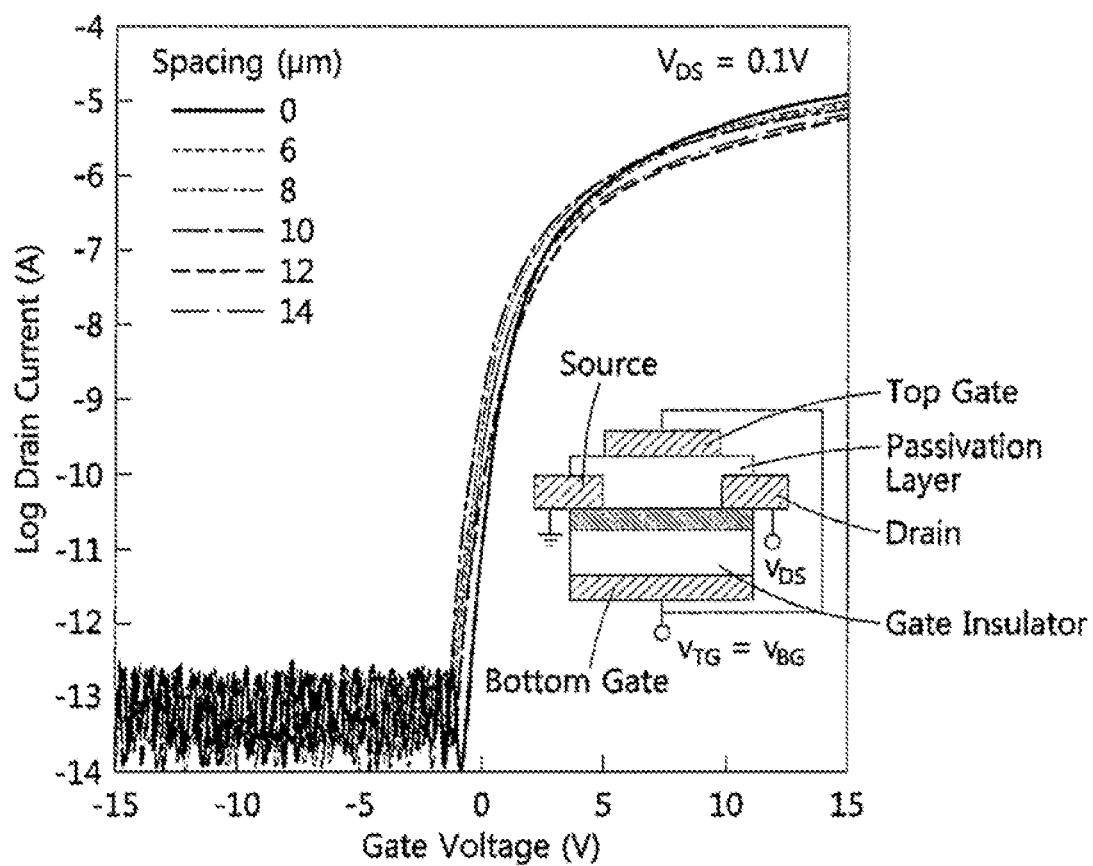

FIGS. 23A to 23C illustrate transfer characteristics according to different gate driving in oxide semiconductor thin-film transistors according to another embodiment of the present invention which has an offset structure (second gate electrode) wherein a spacing between source/drain electrodes and a second gate is −1 μm.

FIG. 23A illustrates transfer characteristics according to spacings between a plurality of island patterns of oxide semiconductor thin-film transistors according to another embodiment of the present invention during bottom sweep, FIG. 23B illustrates transfer characteristics according to spacings between a plurality of island patterns of oxide semiconductor thin-film transistors according to another embodiment of the present invention during top sweep, and FIG. 23C illustrates transfer characteristics according to spacings between a plurality of island patterns of oxide semiconductor thin-film transistors according to another embodiment of the present invention during dual sweep.

Referring to FIGS. 23A to 23C, it can be confirmed that the oxide semiconductor thin-film transistors according to another embodiment of the present invention exhibit similar characteristics to those of a standard oxide semiconductor thin-film transistor (0 μm).

Figure 23D:
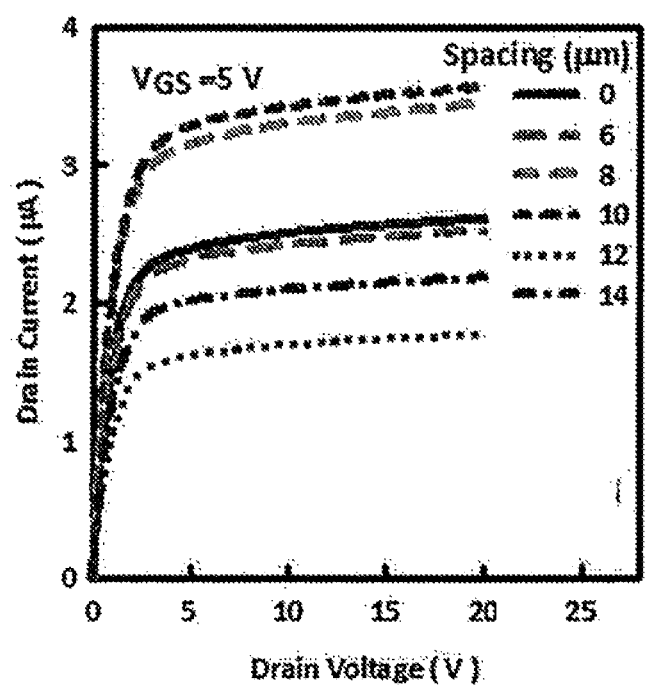
FIGS. 23D to 23F illustrate output characteristics according to different gate driving in oxide semiconductor thin-film transistors according to another embodiment of the present invention which has an offset structure wherein a spacing between source/drain electrodes and a second gate is −1 μm.
Figure 23E:
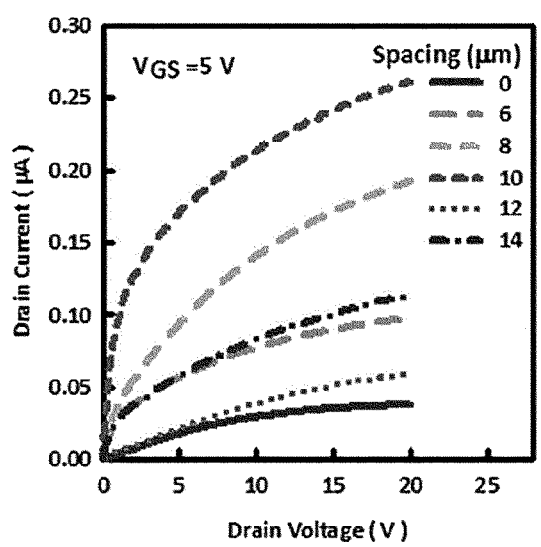
Figure 23F:
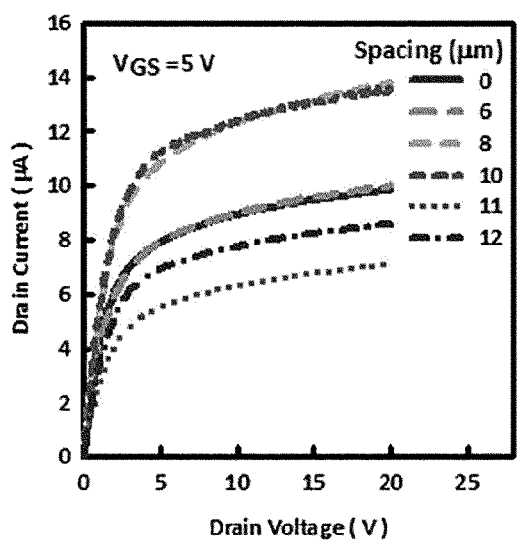

FIGS. 23D to 23F illustrate output characteristics according to different gate driving in oxide semiconductor thin-film transistors according to another embodiment of the present invention which has an offset structure (second gate electrode) wherein a spacing between source/drain electrodes and a second gate is −1 μm.

FIG. 23D illustrates output characteristics according to spacings between a plurality of island patterns of oxide semiconductor thin-film transistors according to another embodiment of the present invention during bottom sweep, FIG. 23E illustrates output characteristics according to spacings between a plurality of island patterns of oxide semiconductor thin-film transistors according to another embodiment of the present invention during top sweep, and FIG. 23F illustrates output characteristics according to spacings between a plurality of island patterns of oxide semiconductor thin-film transistors according to another embodiment of the present invention during dual sweep.

Referring to FIGS. 23D to 23F, it can be confirmed that the oxide semiconductor thin-film transistors with a dual gate structure which include the source electrodes and drain electrodes that have the plurality of island patterns including separated first areas exhibit improved output characteristics.

Figure 23G:
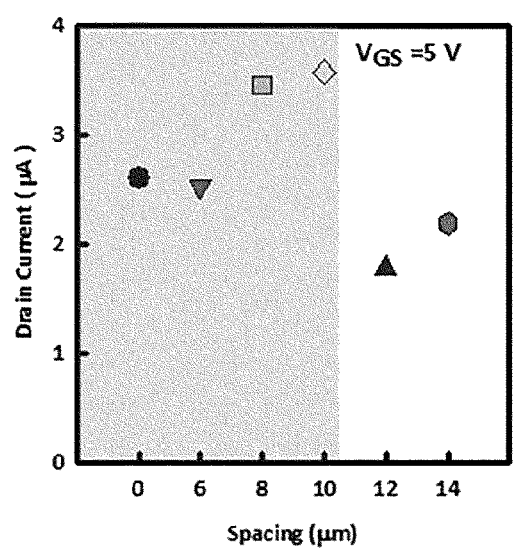
FIG. 23G illustrates output characteristics dependent upon a change in a spacing between a plurality of island patterns, during bottom sweep in an oxide semiconductor thin-film transistor according to another embodiment of the present invention of FIG. 23D.
Figure 23H:
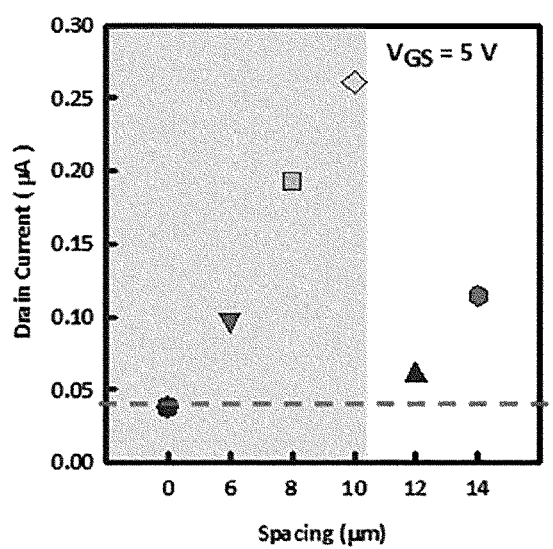
FIG. 23H illustrates output characteristics dependent upon a change in a spacing between a plurality of island patterns, during top sweep in an oxide semiconductor thin-film transistor according to another embodiment of the present invention of FIG. 23E.
Figure 23I:
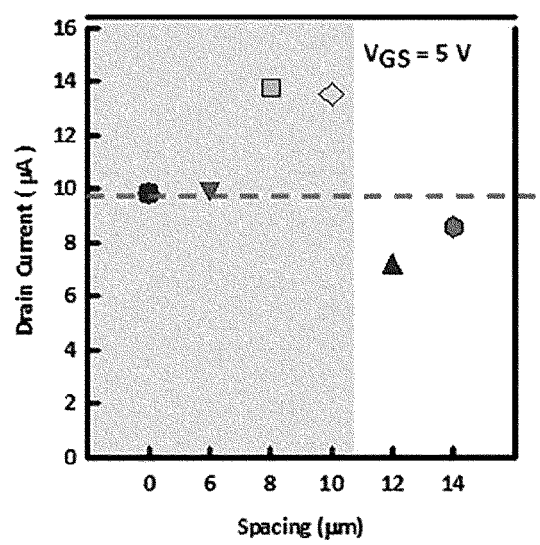
FIG. 23I illustrates output characteristics dependent upon a change in a spacing between a plurality of island patterns, during dual sweep in an oxide semiconductor thin-film transistor according to another embodiment of the present invention of FIG. 23F.

FIG. 23G illustrates output characteristics dependent upon a change in a spacing between a plurality of island patterns, during bottom sweep in an oxide semiconductor thin-film transistor according to another embodiment of the present invention of FIG. 23D, FIG. 23H illustrates output characteristics dependent upon a change in a spacing between a plurality of island patterns, during top sweep in an oxide semiconductor thin-film transistor according to another embodiment of the present invention of FIG. 23E, and FIG. 23I illustrates output characteristics dependent upon a change in a spacing between a plurality of island patterns, during dual sweep in an oxide semiconductor thin-film transistor according to another embodiment of the present invention of FIG. 23F.

FIGS. 23G to 23I illustrate current values when VGS=5 V and VDS=20 V. Here, the widths of a plurality of island patterns are 10 μm.

Referring to FIGS. 23G to 23I, it can be confirmed that the oxide semiconductor thin-film transistors according to another embodiment of the present invention exhibit similar characteristics to those of a standard oxide semiconductor thin-film transistor (0 μm).

Figure 24A:
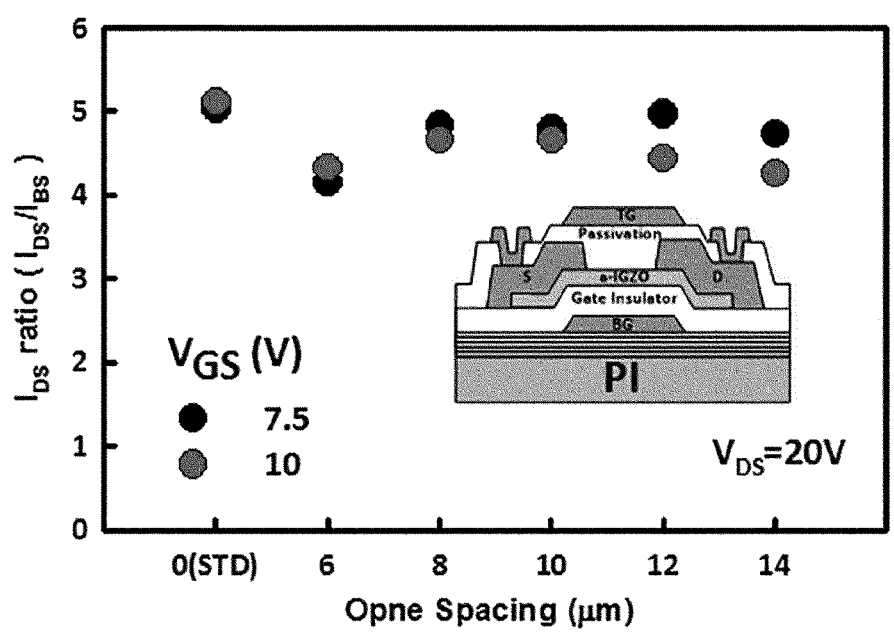
FIGS. 24A and 24B are graphs comparing values obtained by dividing a drain current value during dual sweep in an oxide semiconductor thin-film transistor according to another embodiment of the present invention by a drain current value during bottom sweep therein.
Figure 24B:
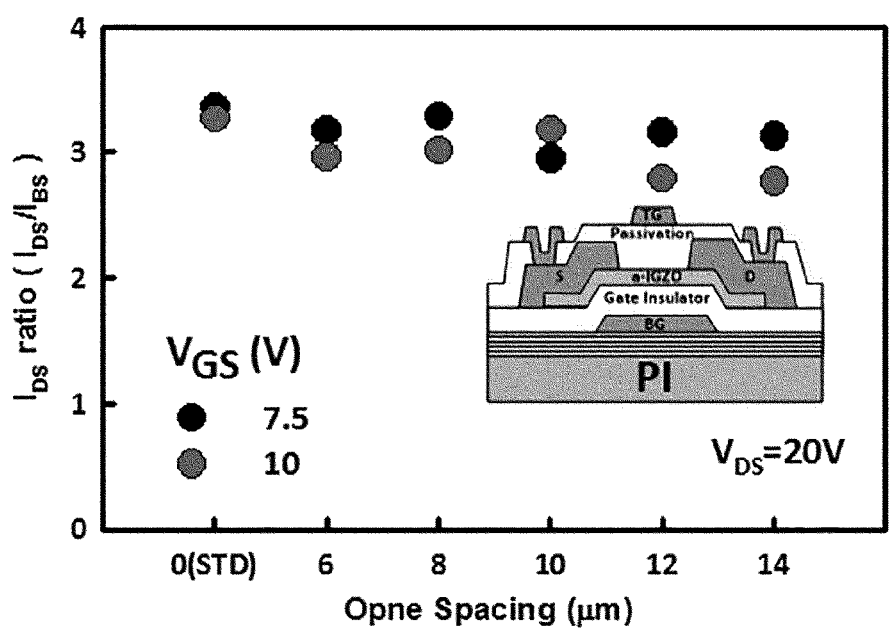

FIGS. 24A and 24B are graphs comparing values obtained by dividing a drain current value during dual sweep in an oxide semiconductor thin-film transistor according to another embodiment of the present invention by a drain current value during bottom sweep therein.

In FIGS. 24A and 24B, VDS=20 V and VGS=7.5, 10 V.

FIG. 24A illustrates a value of a structure wherein the sizes of a first gate electrode and a second gate electrode are the same, FIG. 24B illustrates a value of an offset structure (second gate electrode) when a spacing between source/drain electrodes and a second gate electrode is 1 μm.

Referring to FIGS. 24A and 24B, overall ratios are the same regardless of spacings between a plurality of island patterns, which indicates that bulk accumulation is satisfactorily performed during dual gate driving.

Figure 25A:
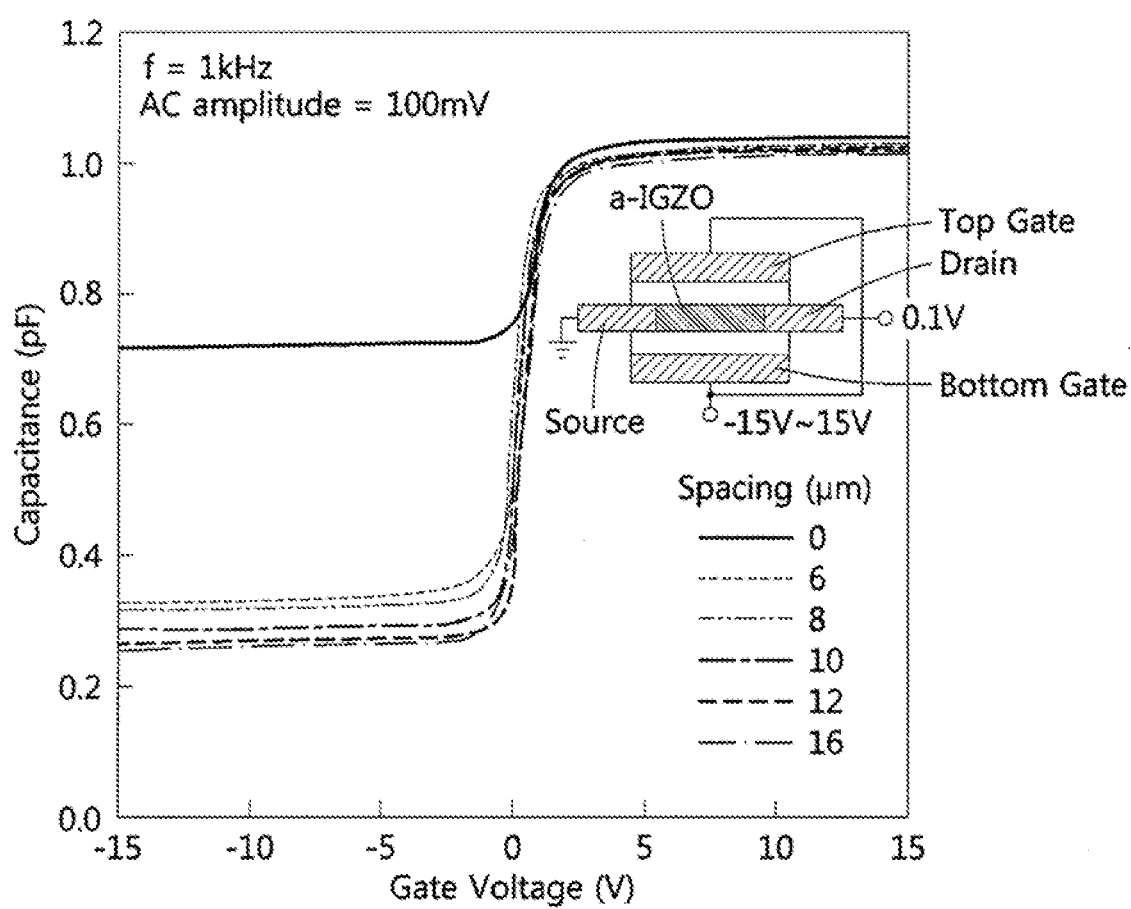
FIG. 25A illustrates capacitance-gate voltage characteristics according to a spacing change in a plurality of island patterns during dual sweep of an oxide semiconductor thin-film transistor according to another embodiment of the present invention wherein the sizes of a first gate electrode and a second gate electrode are the same.
Figure 25B:
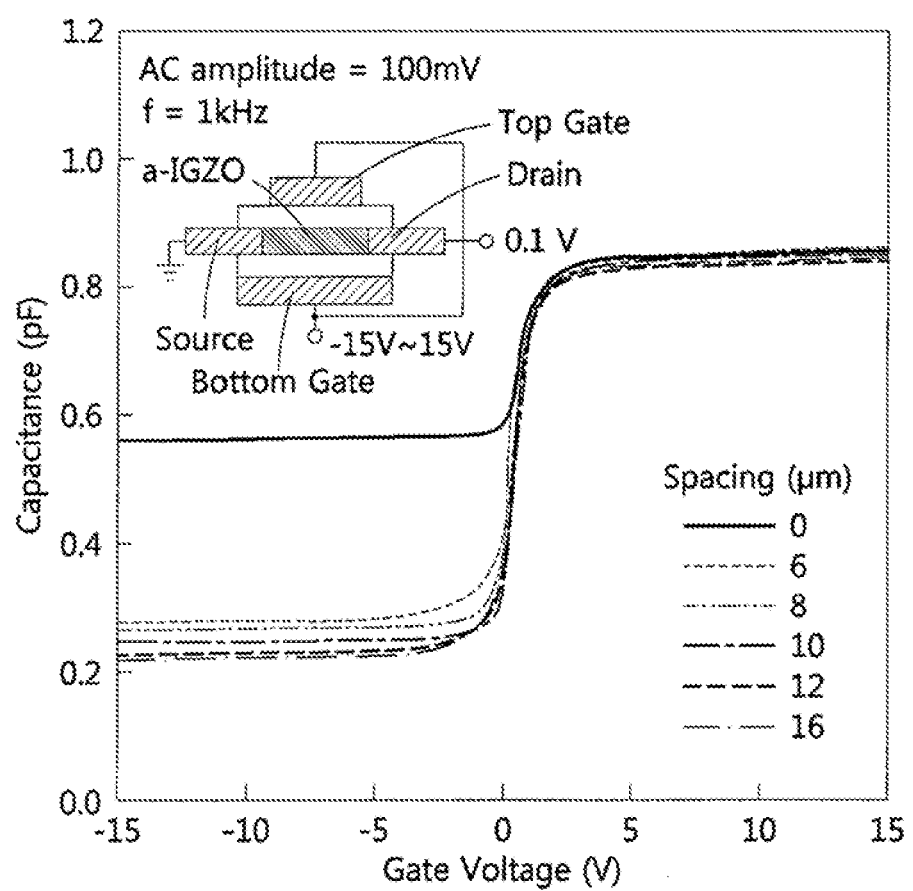
FIG. 25B illustrates capacitance-gate voltage characteristics according to a spacing change in a plurality of island patterns during dual sweep of an oxide semiconductor thin-film transistor according to another embodiment of the present invention having an offset structure wherein a spacing between source/drain electrodes and a second gate electrode is −1 μm.

FIG. 25A illustrates capacitance-gate voltage characteristics according to a spacing change in a plurality of island patterns during dual sweep of an oxide semiconductor thin-film transistor according to another embodiment of the present invention wherein the sizes of a first gate electrode and a second gate electrode are the same, and FIG. 25B illustrates capacitance-gate voltage characteristics according to a spacing change in a plurality of island patterns during dual sweep of an oxide semiconductor thin-film transistor according to another embodiment of the present invention having an offset structure wherein a spacing between source/drain electrodes and a second gate electrode is −1 µm.

Referring to FIGS. 25A and 25B, it can be confirmed that parasitic capacitance is reduced when source/drain electrodes that have a plurality of island patterns including separated first areas are included.

Figure 26A:
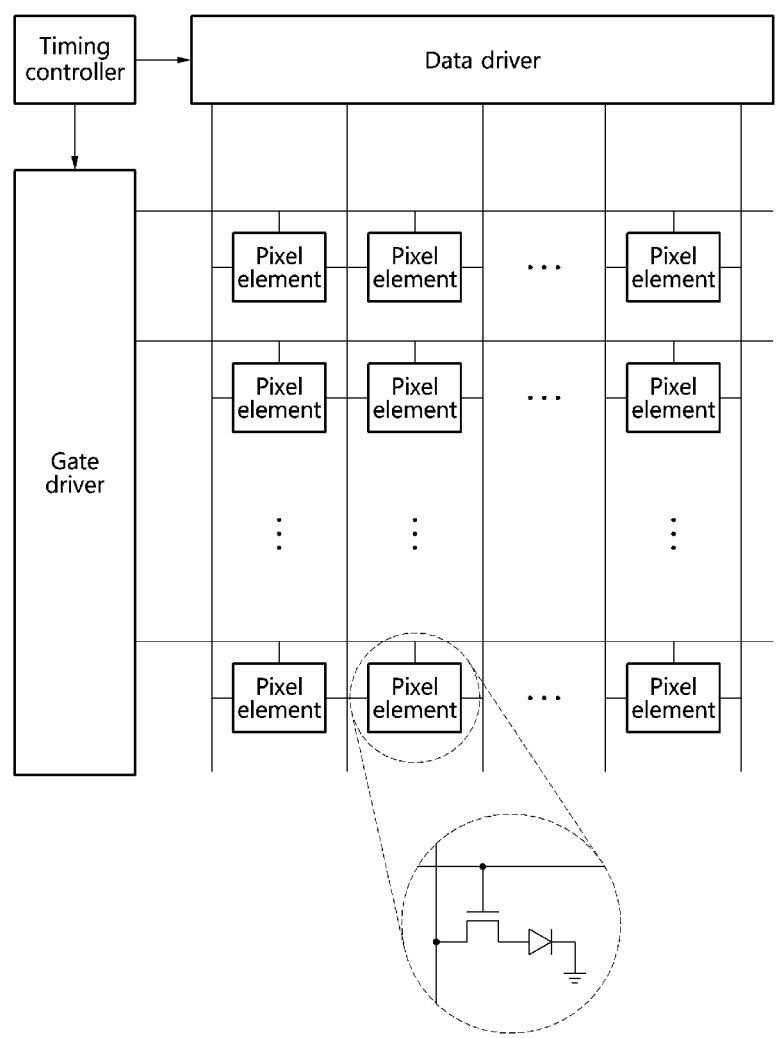
FIG. 26A illustrates a circuit diagram of a display apparatus that includes a pixel element including one oxide semiconductor thin-film transistor according to another embodiment of the present invention.
Figure 26B:
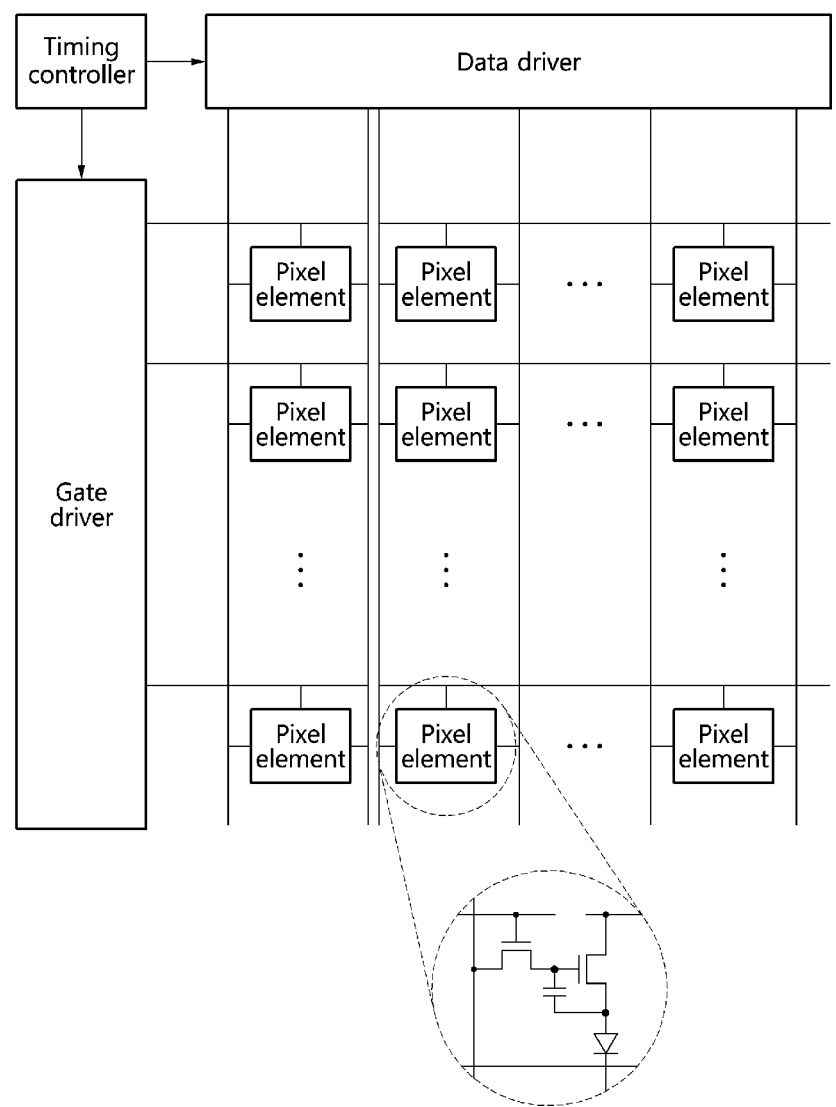
FIG. 26B illustrates a circuit diagram of a display apparatus that includes a pixel element including two oxide semiconductor thin-film transistors according to another embodiment of the present invention.

FIG. 26A illustrates a circuit diagram of a display apparatus that includes a pixel element including one oxide semiconductor thin-film transistor according to another embodiment of the present invention, and FIG. 26B illustrates a circuit diagram of a display apparatus that includes a pixel element including two oxide semiconductor thin-film transistors according to another embodiment of the present invention.

Referring to FIGS. 26A and 26B, it can be confirmed that the oxide semiconductor thin-film transistor according to another embodiment of the present invention may be used as a pixel element for display apparatuses.

Hereinafter, an oxide semiconductor thin-film transistor according to still another embodiment of the present invention is described with reference to FIGS. 27A to 27G.

FIGS. 27A to 27G illustrate sectional views of an oxide semiconductor thin-film transistor exhibiting an overall flow of a method of fabricating an oxide semiconductor thin-film transistor (coplanar structure) according to still another embodiment of the present invention.

Figure 27A:
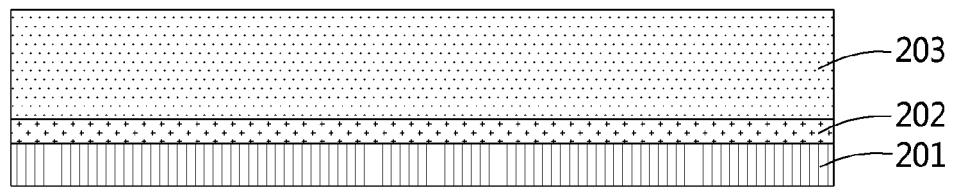
FIGS. 27A to 27G illustrate sectional views of an oxide semiconductor thin-film transistor exhibiting an overall flow of a method of fabricating an oxide semiconductor thin-film transistor (coplanar structure) according to still another embodiment of the present invention.
Figure 27B:
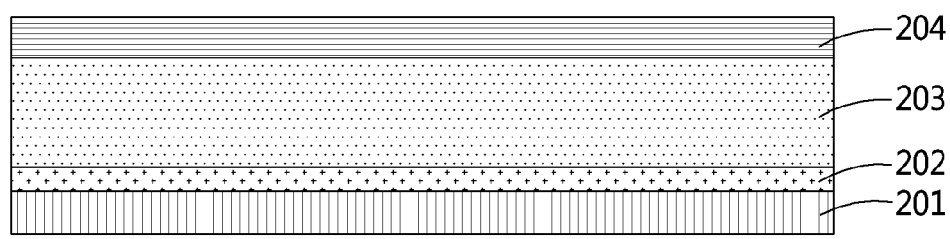
Figure 27C:
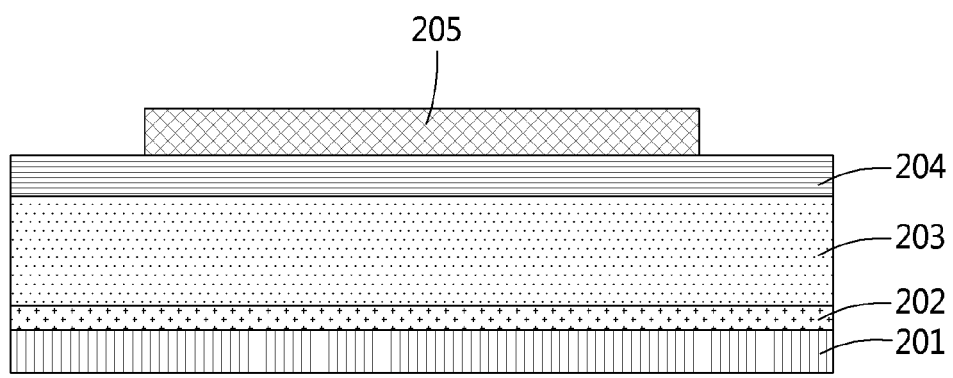
Figure 27D:
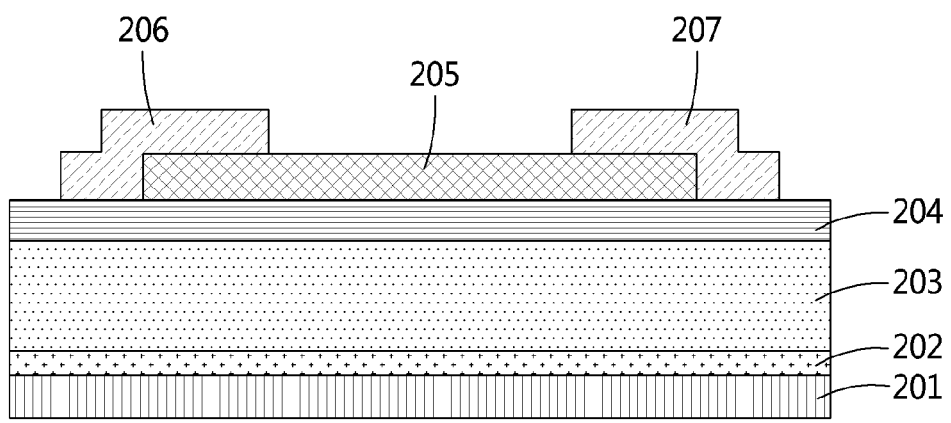
Figure 27E:
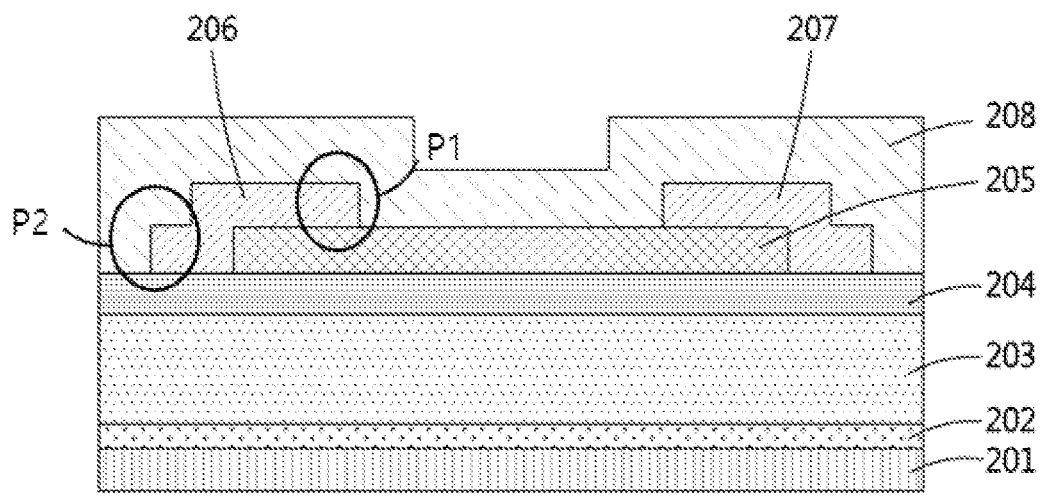
Figure 27F:
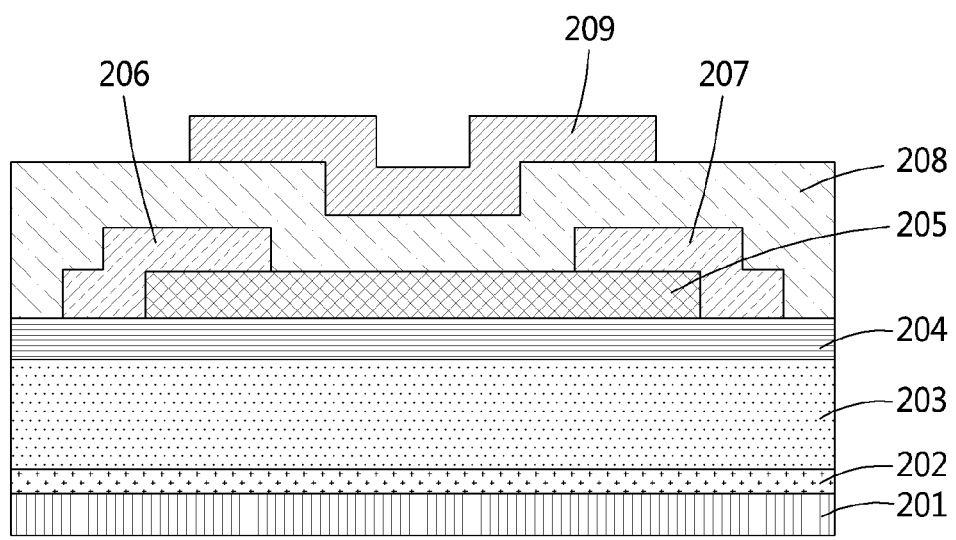
Figure 27G:
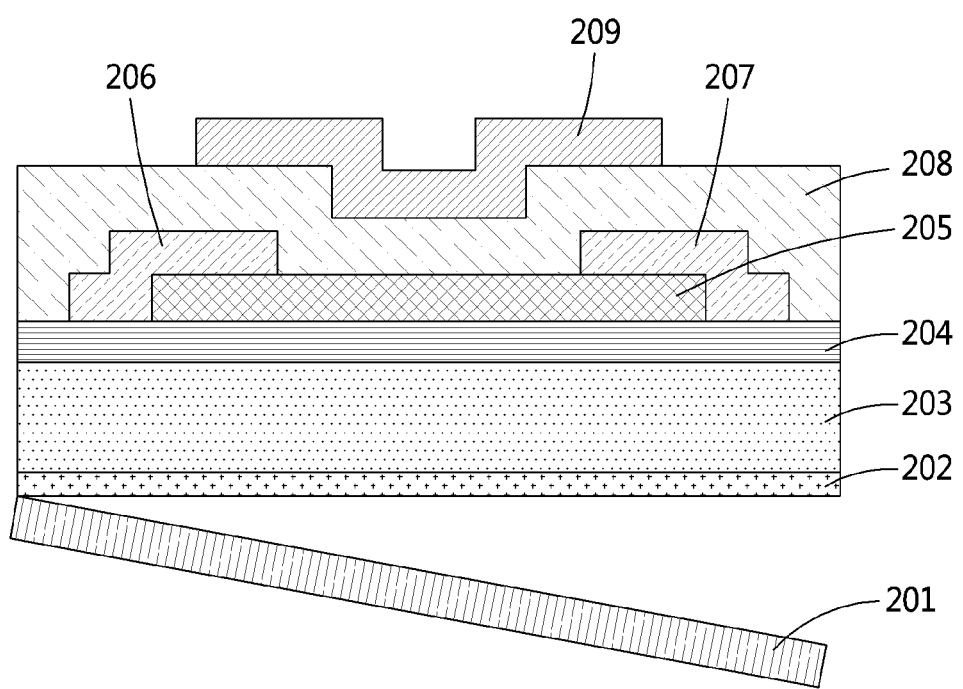

As shown in FIG. 27G, the oxide semiconductor thin-film transistor according to still another embodiment of the present invention includes a substrate 203, an oxide semiconductor layer 205, source/drain electrodes 206 and 207, a gate insulator 208 and a first gate electrode 209 and may further include a supporting layer 202 and a buffer layer 204.

Components of the oxide semiconductor thin-film transistor according to still another embodiment of the present invention may the same of those of the oxide semiconductor thin-film transistor according to an embodiment of the present invention described above, and thus, description of the same components is omitted.

Referring to FIG. 27A, a method of fabricating the method of fabricating the oxide semiconductor thin-film transistor according to still another embodiment of the present invention includes forming the supporting layer 202 and the substrate 203 on a carrier substrate 201.

As shown in FIG. 27A, the supporting layer 202 is formed on the carrier substrate 201. However, the supporting layer 202 is not an essential component.

In addition, the substrate 203 is formed on the supporting layer 202. The substrate 203, which is a substrate for supporting various components of an oxide semiconductor thin-film transistor, may be a substrate having flexibility.

Referring to FIG. 27B, the method of fabricating the oxide semiconductor thin-film transistor according to still another embodiment of the present invention includes forming the buffer layer 204 on the substrate 203.

As shown in FIG. 27B, the buffer layer 204 may be formed on the substrate 203.

The buffer layer 204 may prevent penetration of external impurities, such as moisture or oxygen, through the substrate 203 and may planarize a surface of the substrate 203.

However, the buffer layer 204 is not an essential component and may be adopted or omitted depending upon the type of the substrate 203.

Referring to FIG. 27C, the method of fabricating the oxide semiconductor thin-film transistor according to still another embodiment of the present invention includes forming the oxide semiconductor layer 205 on the substrate 203 on which the buffer layer 204 has been formed.

As shown in FIG. 27C, the oxide semiconductor layer 205 is formed on the buffer layer 204.

Referring to FIG. 27D, the method of fabricating the oxide semiconductor thin-film transistor according to still another embodiment of the present invention includes forming the source/drain electrodes 206 and 207 on the buffer layer 204 and the oxide semiconductor layer 205.

As shown in FIG. 27D, the source/drain electrodes 206 and 207 are formed to be separated from each other on the buffer layer 204 and the oxide semiconductor layer 205 to be respectively, electrically connected to the oxide semiconductor layer 205.

Referring to FIG. 27E, the method of fabricating the oxide semiconductor thin-film transistor according to still another embodiment of the present invention includes forming the gate insulator 208 on the source/drain electrodes 206 and 207.

As shown in FIG. 27E, the gate insulator 208 is formed on the source/drain electrodes 206 and 207.

Referring to FIG. 27F, the method of fabricating the oxide semiconductor thin-film transistor according to still another embodiment of the present invention includes forming the first gate electrode 209 on the gate insulator 208.

As shown in FIG. 27F, the first gate electrode 209 is formed on the gate insulator 208 to correspond to the oxide semiconductor layer 205. The first gate electrode 209 may be a top gate electrode.

Referring to FIG. 27G, the method of fabricating the oxide semiconductor thin-film transistor according to still another embodiment of the present invention includes removing the carrier substrate 201.

As shown in FIG. 27G, the carrier substrate 201 may be removed from the supporting layer 102.

The source/drain electrodes 206 and 207 of the oxide semiconductor thin-film transistor according to still another embodiment of the present invention have a plurality of island patterns formed such that first areas are separated from each other, thereby having resistance to external stress.

The oxide semiconductor thin-film transistor according to still another embodiment of the present invention may be used to drive a display apparatus, particularly a pixel element of a flexible display apparatus, for example an organic light-emitting device.

Although an oxide semiconductor thin film transistor and a method of fabricating the same have been described above, a display apparatus including the oxide semiconductor thin film transistor and a method of manufacturing the display apparatus may also be within the scope of the present disclosure.

In particular, the oxide semiconductor thin film transistors according to the embodiments of the present disclosure may be used as a pixel element of a flexible display such as a liquid crystal display (LCD) or an organic light emitting display (AMOLED). More specifically, a display apparatus may be manufactured through a step of forming the pixel electrode 111 electrically connected to any one of the source/drain electrodes 108 and 109, after fabricating the oxide semiconductor thin-film transistor using the aforementioned method.

For example, as shown in FIGS. 1a 1h, a passivation layer configured to cover the source/drain electrodes 206 and 207 is formed, a pixel electrode configured to contact with the drain electrode 207 through a through hole of the passivation layer is formed, an intermediate layer (not shown) including a light emitting layer (not shown) is formed on the pixel electrode, and a counter electrode (not shown) is formed on the intermediate layer, thereby manufacturing an organic light emitting display apparatus.

Figure 28:
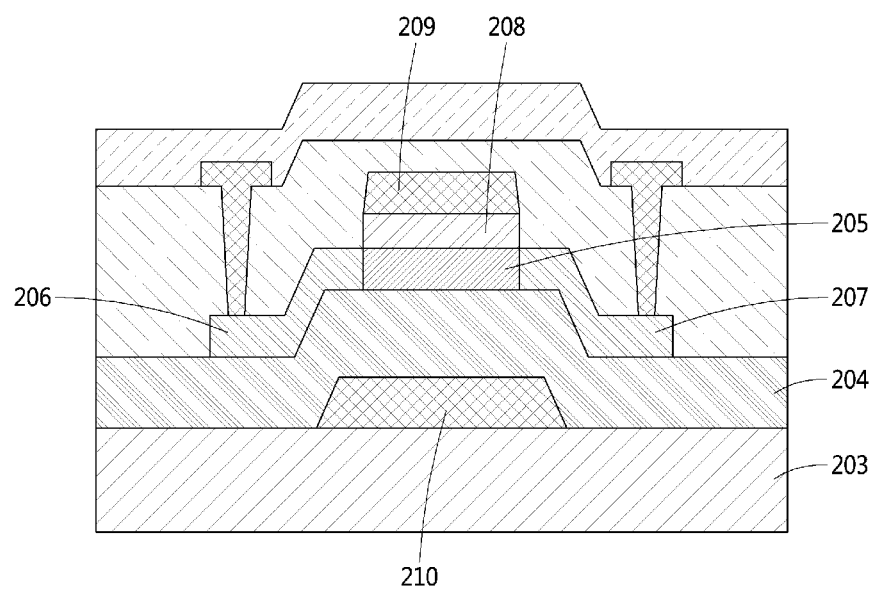
FIG. 28 illustrates a sectional view of a dual gate structure of an oxide semiconductor thin-film transistor (coplanar structure) according to still another embodiment of the present invention.

FIG. 28 illustrates a sectional view of a dual gate structure of an oxide semiconductor thin-film transistor (coplanar structure) according to still another embodiment of the present invention.

The dual gate structure of the oxide semiconductor thin-film transistor (coplanar structure) according to still another embodiment of the present invention may include a substrate 203, a second gate electrode 210 formed on the substrate 203, a buffer layer 204 formed on the second gate electrode 210, an oxide semiconductor layer 205 formed on the buffer layer 204, source/drain electrodes 206 and 207, a gate insulator 208 and a first gate electrode 209.

The dual gate structure of the oxide semiconductor thin-film transistor (coplanar structure) according to still another embodiment of the present invention may include the same components to those of the oxide semiconductor thin-film transistor according to an embodiment of the present invention and the oxide semiconductor thin-film transistor according to another embodiment of the present invention described above, and thus, description of the same components is omitted.

The substrate 203, which is a substrate for supporting various components of an oxide semiconductor thin-film transistor, may be a substrate having flexibility.

The second gate electrode 210 is formed on the substrate 203. The second gate electrode 210 may be a bottom gate electrode.

The buffer layer 204 may be formed on the second gate electrode 210. The buffer layer 204 may serve to as a gate insulating film. According to an embodiment, the buffer layer 204 may be formed under the second gate electrode 210 and a gate insulating film may be formed on the second gate electrode 210.

The buffer layer 204 may prevent penetration of external impurities, such as moisture or oxygen, through the substrate 203 and may planarize a surface of the substrate 203. However, the buffer layer 204 is not an essential component and may be adopted or omitted depending upon the type of the substrate 203.

The oxide semiconductor layer 205 is formed on the substrate 203 on which the buffer layer 204 has been formed.

In addition, the source/drain electrodes 206 and 207 are formed on the buffer layer 204 and the oxide semiconductor layer 205.

The source/drain electrodes 206 and 207 of the dual gate structure of the oxide semiconductor thin-film transistor (coplanar structure) according to still another embodiment of the present invention have a plurality of island patterns formed such that first areas are separated from each other, thereby having resistance to external stress.

The source/drain electrodes 206 and 207 are formed to be separated from each other on the buffer layer 204 and the oxide semiconductor layer 205 and respectively, electrically to the oxide semiconductor layer 205.

The gate insulator 208 is formed on the source/drain electrodes 206 and 207, and the first gate electrode 209 is formed on the gate insulator 208.

The first gate electrode 209 is formed on the gate insulator 208 to correspond to the oxide semiconductor layer 205. The first gate electrode 209 may be a top gate electrode.

The dual gate structure of the oxide semiconductor thin-film transistor (coplanar structure) according to still another embodiment of the present invention may be used to drive a display apparatus, particularly a pixel element of a flexible display apparatus, for example an organic light-emitting device.

Although oxide semiconductor thin-film transistors and methods of fabricating the same have been described above, display apparatuses including the oxide semiconductor thin-film transistors and a method of fabricating the same also pertain to the scope of the present invention.

Specifically, the oxide semiconductor thin-film transistors according to the embodiments of the present invention may be used as a pixel element of a flexible display apparatus such as a liquid crystal display (LCD) or an organic light emitting display (AMOLED). More particularly, a display apparatus may be manufactured by fabricating an oxide semiconductor thin film transistor according to the method described above, and then forming a pixel electrode electrically connected to any one of source/drain electrodes.

For example, a passivation layer may be formed to cover source/drain electrodes, and a pixel electrode contacting the drain electrode through a through hole of the passivation layer may be formed, as shown in FIGS. 1A to 1H. In addition, an intermediate layer (not shown) including a light emitting layer may be formed on the pixel electrode and a counter electrode may be formed on the intermediate layer, thereby manufacturing an organic light emitting display apparatus.

Although the present invention has been described through limited examples and figures, the present invention is not intended to be limited to the examples. Those skilled in the art will appreciate that various modifications, additions, and substitutions are possible, without departing from the scope and spirit of the invention. Therefore, the scope of the present invention should not be limited by the embodiments, but should be determined by the following claims and equivalents to the following claims.

What is claimed is:

1. An oxide semiconductor thin-film transistor, comprising:
   a substrate;
   a first gate electrode formed on the substrate;
   a gate insulator formed on the first gate electrode;
   an oxide semiconductor layer formed on the gate insulator to correspond to the first gate electrode;
   source/drain electrodes formed to be spaced from each other on the oxide semiconductor layer and formed in a shape of a plurality of island patterns;
   a passivation layer formed on the source/drain electrodes,
   wherein the source/drain electrodes comprise a first area formed in a direction of the first gate electrode with respect to a horizontal plane of the substrate, and a second area formed in an opposite direction to the first area, and
   the plurality of island patterns are formed such that the first areas are separated from each other,
   wherein an end of the first gate electrode and an end of the first area with respect to the source electrode are offset by a width of −1 μm to 0 μm or overlapped by a width of 0 μm to 3 μm in a horizontal direction, and
   wherein the other end of the first gate electrode and an end of the second area with respect to the drain electrode are offset by a width of −1 µm to 0 µm or overlapped by a width of 0 µm to 3 µm in the horizontal direction.

2. The oxide semiconductor thin-film transistor according to claim 1, wherein the plurality of island patterns have a shape wherein a plurality of line patterns are repeatedly formed.

3. The oxide semiconductor thin-film transistor according to claim 2, wherein a width of each of the plurality of line patterns is 1 µm to 10 µm.

4. The oxide semiconductor thin-film transistor according to claim 2, wherein a spacing between the plurality of line patterns is 1 µm to 16 µm.

5. The oxide semiconductor thin-film transistor according to claim 1, wherein the plurality of island patterns have a lattice shape wherein a plurality of line patterns vertically intersect.

6. The oxide semiconductor thin-film transistor according to claim 1, wherein a second gate electrode is further formed on the passivation layer formed on the source/drain electrodes of the oxide semiconductor thin-film transistor.

7. The oxide semiconductor thin-film transistor according to claim 6, further comprising a connection electrode for electrically connecting the first gate electrode and the second gate electrode.

8. The oxide semiconductor thin-film transistor according to claim 7, wherein the first gate electrode and the second gate electrode are electrically connected and thus the same voltage is applied thereto.

9. A display apparatus, comprising:
a substrate;
an oxide semiconductor thin-film transistor according to claim 1 formed on the substrate; and
a display device electrically connected to the oxide semiconductor thin-film transistor.

10. The display apparatus according to claim 9, wherein the display device is an organic light-emitting device.

11. A coplanar oxide semiconductor thin-film transistor, comprising:
an oxide semiconductor layer formed on a substrate; a first gate electrode formed on the oxide semiconductor layer; and source/drain electrodes respectively formed in a shape of a plurality of island patterns,
wherein the source/drain electrodes comprise a first area formed in a direction of the first gate electrode with respect to a horizontal plane of the substrate; and a second area formed in an opposite direction to the first area, and
the plurality of island patterns are formed such that the first areas are separated from each other,
wherein an end of the first gate electrode and an end of the first area with respect to the source electrode are offset by a width of −1 µm to 0 µm or overlapped by a width of 0 µm to 3 µm in a horizontal direction, and
wherein the other end of the first gate electrode and an end of the second area with respect to the drain electrode are offset by a width of −1 µm to 0 µm or overlapped by a width of 0 µm to 3 µm in the horizontal direction.

12. The oxide semiconductor thin-film transistor according to claim 11, wherein a second gate electrode is further formed under the oxide semiconductor layer.

13. A display apparatus, comprising:
a substrate;
an oxide semiconductor thin-film transistor according to claim 11 formed on the substrate; and
a display device electrically connected to the oxide semiconductor thin-film transistor.

14. The display apparatus according to claim 13, wherein the display device is an organic light-emitting device.

15. A method of fabricating an oxide semiconductor thin-film transistor, the method comprising:
forming a first gate electrode on a substrate;
forming a gate insulator on the first gate electrode;
forming an oxide semiconductor layer on the gate insulator to correspond to the first gate electrode;
forming source/drain electrodes to be spaced from each other on the oxide semiconductor layer and to have a plurality of island patterns; and
forming a passivation layer on the source/drain electrodes,
wherein the source/drain electrodes comprise a first area formed in a direction of the first gate electrode with respect to a horizontal plane of the substrate, and a second area formed in an opposite direction to the first area,
wherein an end of the first gate electrode and an end of the first area with respect to the source electrode are offset by a width of −1 µm to 0 µm or overlapped by a width of 0 µm to 3 µm in a horizontal direction, and
wherein the other end of the first gate electrode and an end of the second area with respect to the drain electrode are offset by a width of −1 µm to 0 µm or overlapped by a width of 0 µm to 3 µm in the horizontal direction.

16. The method according to claim 15, further comprising forming a second gate electrode on the passivation layer.

\* \* \* \* \*